(12) United States Patent
Kodama

(10) Patent No.: US 8,039,200 B2
(45) Date of Patent: *Oct. 18, 2011

(54) PHOTOSENSITIVE COMPOSITION AND PATTERN-FORMING METHOD USING THE PHOTOSENSITIVE COMPOSITION

(75) Inventor: Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/853,947

(22) Filed: Aug. 10, 2010

(65) Prior Publication Data

US 2010/0304300 A1 Dec. 2, 2010

Related U.S. Application Data

(63) Continuation of application No. 11/041,748, filed on Jan. 25, 2005.

(30) Foreign Application Priority Data

Feb. 5, 2004 (JP) ................................. 2004-029068

(51) Int. Cl.
   G03F 7/038 (2006.01)
   G03F 7/039 (2006.01)
   G03F 7/20 (2006.01)
   G03F 7/30 (2006.01)

(52) U.S. Cl. ................. 430/270.1; 430/280.1; 430/325; 430/326; 430/905; 430/920; 430/921; 430/922; 430/925

(58) Field of Classification Search ........................ None
See application file for complete search history.

(56) References Cited

U.S. PATENT DOCUMENTS

| | | | |
|---|---|---|---|
| 5,554,664 A | 9/1996 | Lamanna et al. | |
| 6,455,223 B1 | 9/2002 | Hatakeyama et al. | |
| 6,555,289 B2 | 4/2003 | Sasaki et al. | |
| 6,989,224 B2 | 1/2006 | Adams et al. | |
| 2002/0042017 A1 | 4/2002 | Hatakeyama | |
| 2002/0168581 A1 | 11/2002 | Takeda et al. | |
| 2003/0008241 A1 | 1/2003 | Sato et al. | |
| 2003/0031953 A1 | 2/2003 | Hatakeyama et al. | |
| 2003/0108809 A1 | 6/2003 | Sato | |
| 2003/0113658 A1 | 6/2003 | Ebata et al. | |
| 2003/0148211 A1 | 8/2003 | Kamabuchi et al. | |
| 2003/0203305 A1* | 10/2003 | Yasunami et al. | 430/170 |
| 2003/0235775 A1 | 12/2003 | Padmanaban et al. | |
| 2007/0065748 A1 | 3/2007 | Hada et al. | |
| 2007/0148581 A1 | 6/2007 | Tsuji et al. | |
| 2007/0275307 A1 | 11/2007 | Hada et al. | |

FOREIGN PATENT DOCUMENTS

| | | |
|---|---|---|
| EP | 0 726 500 A1 | 8/1996 |
| JP | 2002-268223 A | 9/2002 |
| JP | 2002-341539 A | 11/2002 |
| JP | 2003-261529 A | 9/2003 |
| JP | 2003-307850 A | 10/2003 |
| JP | 2005-173468 A | 6/2004 |
| JP | 2005-172949 A | 6/2005 |
| JP | 2005-196095 A | 7/2005 |
| JP | 2005-206775 A | 8/2005 |
| JP | 2005-534952 A | 11/2005 |
| WO | 03-107093 A2 | 12/2003 |
| WO | 2004-108780 A1 | 12/2004 |

OTHER PUBLICATIONS

Derwent English abstract for JP 2003-307850 (Kanna et al.).
Japanese Office Action dated Dec. 24, 2008.
European Search Report dated Jul. 8, 2005.
Wallraff et al., "Characterization and Acid Diffusion Measurements of New Strong Acid Photoacid Generators," Advances in Resist Technology and Processing XIX, Proceedings of SPIE vol. 4690, pp. 160-168 (2002).
Communication from the European Patent Office dated Feb. 15, 2011 in EP Application No. 05002140.1.
Office Action dated Apr. 27, 2011 on Korean Patent Application No. 10-2005-0010479.

* cited by examiner

*Primary Examiner* — Sin J. Lee
(74) *Attorney, Agent, or Firm* — Sughrue Mion, PLLC

(57) ABSTRACT

A photosensitive composition comprises (A) a sulfonium or iodonium salt having an anion represented by one of formulae (I) and (II):

$$\begin{array}{c}(I)\\ \begin{array}{c} O=S=O \\ | \\ ^{\ominus}N \quad Y \\ | \\ O=S=O \end{array}\end{array}$$

$$\begin{array}{c}(II)\\ \begin{array}{c} O=S=O \\ | \\ R-SO_2-C^{\ominus} \quad Y \\ | \\ O=S=O \end{array}\end{array}$$

wherein Y represents an alkylene group substituted with at least one fluorine atom, and R represents an alkyl group or a cycloalkyl group.

8 Claims, No Drawings

PHOTOSENSITIVE COMPOSITION AND PATTERN-FORMING METHOD USING THE PHOTOSENSITIVE COMPOSITION

CROSS REFERENCE TO RELATED APPLICATIONS

This application is a Continuation of U.S. patent application Ser. No. 11/041,748, filed on Jan. 25, 2005 and currently pending, which claims priority from Japanese Application No. 2004-029068, filed Feb. 5, 2004 in the Japan Patent Office. The above-noted applications are incorporated herein by reference.

BACKGROUND OF THE INVENTION

1. Field of the Invention

The present invention relates to a photosensitive composition the property of which changes by the reaction upon irradiation with an actinic ray or a radiation, and a pattern-forming method using the photosensitive composition. More specifically, the invention relates to a photosensitive composition for use in a manufacturing process of semiconductor devices, e.g., IC, the manufacture of circuit substrates for liquid crystals, thermal heads and the like, and other photofabrication processes, lithographic printing plates, and acid-hardening compositions, and also the invention relates to a pattern-forming process using the photosensitive composition.

2. Description of the Related Art

Chemically amplified resist compositions are pattern-forming materials capable of generating an acid at the exposed area by irradiation with radiation, such as a far ultraviolet ray, changing the solubility in a developer of the irradiated area with the actinic radiation and that of the non-irradiated area by the reaction with the acid as a catalyst, and forming a pattern on a substrate.

When a KrF excimer laser is used as the exposure light source, resins having poly(hydroxystyrene) as a fundamental skeleton small in absorption in the region of 248 nm are mainly used, so that a high sensitivity, high resolution and good pattern is formed as compared with conventionally used naphthoquinonediazide/novolak resins.

On the other hand, when a light source of further shorter wavelength, e.g., an ArF excimer laser (193 nm), is used as the light source, even these chemically amplified resists are not sufficient, since compounds containing an aromatic group substantially show large absorption in the region of 193 nm. Accordingly, resists containing a resin having an alicyclic hydrocarbon structure have been developed for an ArF excimer laser.

Various compounds have been found as to acid-generating agents that are main constitutional components of chemically amplified resists, e.g., an imido acid-generating agent generating an acid upon irradiation with an actinic ray or a radiation (e.g., refer to U.S. Pat. No. 5,554,664), and chain state imido compounds (e.g., refer to JP-A-2003-261529 and Unexamined published U.S. Patent Application No. 2003/0,148,211) are disclosed. Further, a photosensitive composition comprising combination of a resin having an alicyclic main chain and an imido acid-generating agent (e.g., refer to JP-A-2002-341539), and a photosensitive composition comprising combination of a resin having an alicyclic side chain and an imido acid-generating agent (e.g., refer to JP-A-2002-268223) are proposed.

However, these compounds are still insufficient in various points and the improvement in pattern collapse and the like is required.

SUMMARY OF THE INVENTION

Accordingly, the objects of the present invention are to provide a photosensitive composition hardly accompanied by the occurrence of pattern collapse, and to provide a pattern-forming method using the photosensitive composition.

The above objects have been solved by the following photosensitive composition and pattern-forming method.

(1) A photosensitive composition containing (A) a sulfonium salt or an iodonium salt having an anion represented by the following formula (I) or (II) as the compound capable of generating an acid upon irradiation with an actinic ray or a radiation:

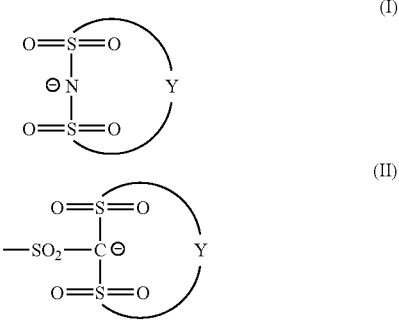

wherein Y represents an alkylene group substituted with at least one fluorine atom, and R represents an alkyl group or a cycloalkyl group.

(2) The photosensitive composition as described in the above item (1) which further contains (B) a resin that decomposes by an action of an acid to increase a solubility of the resin in an alkali developer (a positive type).

(3) The photosensitive composition as described in the above item (1) which further contains (D) a resin soluble in an alkali developer, and (E) an acid crosslinking agent that crosslinks with the resin (D) (a negative type).

(4) The positive photosensitive composition as described in the above item (2), wherein the resin (B) comprises a hydroxystyrene structural unit.

(5) The positive photosensitive composition as described in the above item (2), wherein the resin (B) comprises a repeating unit having a monocyclic or polycyclic hydrocarbon structure.

(6) The positive photosensitive composition as described in the above item (2), wherein the resin (B) comprises a repeating unit having an alcoholic hydroxyl group.

(7) The positive photosensitive composition as described in the above item (6), wherein the repeating unit having an alcoholic hydroxyl group is a repeating unit containing at least a structure selected from a monohydroxy adamantane structure, a dihydroxy adamantane structure and a trihydroxy adamantane structure.

(8) The positive photosensitive composition as described in the above item (2), wherein the resin (B) comprises a repeating unit having a lactone structure.

(9) The positive photosensitive composition as described in the above item (2), wherein the resin (B) comprises at least a methacrylic ester repeating unit and at least an acrylic ester repeating unit.

(10) The positive photosensitive composition as described in the above item (2), wherein the resin (B) has a fluorine atom. In other words, the resin (B) has a fluorine atom on the main chain or on the side chain.

(11) The positive photosensitive composition as described in the above item (10), wherein the resin having a fluorine atom at least on either the main chain or the side chain comprises a hexafluoro-2-propanol structure.

(12) The positive photosensitive composition as described in any of the above items (2), (4) to (11), further comprising (C) a dissolution-inhibiting compound having a molecular weight of 3,000 or less, the dissolution-inhibiting compound decomposing by an action of an acid to increase the solubility of the dissolution-inhibiting compound in an alkali developer.

(13) The positive photosensitive composition as described in any of the above items (2), (4) to (12), further comprising at least one of: (F) a basic compound; and (G) at least one selected from a fluorine surfactant and a silicon surfactant.

(14) The positive photosensitive composition as described in any of the above items (2), (4) to (13), wherein the resin (B) comprises: at least one repeating unit selected from 2-alkyl-2-adamantyl (meth)acrylate and dialkyl (1-adamantyl)methyl (meth)acrylate; at least one repeating unit having a lactone structure; and at least one repeating unit having two or more hydroxyl groups.

(15) The positive photosensitive composition as described in any of the above items (2), (4) to (14), wherein the resin (B) comprises a repeating unit having a carboxyl group.

(16) The positive photosensitive composition as described in any of the above items (2), (4) to (15), wherein the resin (B) comprises: at least one repeating unit selected from 2-alkyl-2-adamantyl (meth)acrylate and dialkyl (1-adamantyl)methyl (meth)acrylate; and at least one repeating unit having a hydroxystyrene structure.

(17) A pattern-forming method comprising: forming a photosensitive film with the photosensitive composition as described in any of the above items (1) to (16); exposing the photosensitive film to form a exposed photosensitive film; and developing the exposed photosensitive film.

DETAILED DESCRIPTION OF THE INVENTION

The present invention is described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

The positive photosensitive composition of the invention, more preferably the positive resist composition, contains (A) a compound represented by formula (I) or (II) capable of generating an acid upon irradiation with an actinic ray or a radiation, and (B) a resin capable of decomposing by the action of an acid to thereby increase the solubility in an alkali developer, and, if necessary, (C) a dissolution-inhibiting compound having a molecular weight of 3,000 or less and capable of decomposing by the action of an acid to thereby increase the solubility in an alkali developer.

The negative photosensitive composition of the invention, more preferably the negative resist composition, contains (A) a compound represented by formula (I) or (II) capable of generating an acid upon irradiation with an actinic ray or a radiation, (D) a resin soluble in an alkali developer, and (E) an acid crosslinking agent that crosslinks with the resin soluble in an alkali developer by the action of an acid.

[1] (A) A Compound Represented by the Following Formula (I) or (II) Capable of Generating an Acid Upon Irradiation with an Actinic Ray or A Radiation:

The photosensitive composition in the invention contains a compound having an anion represented by the following formula (I) or (II) (the compound is also referred to as compound (A)) as the compound capable of generating an acid upon irradiation with an actinic ray or a radiation.

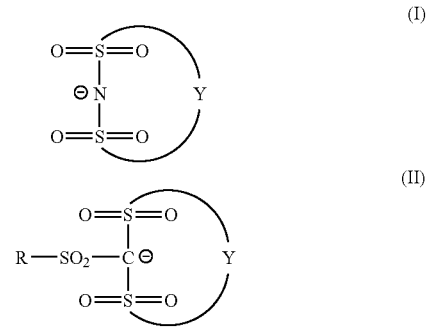

In formulae (I) and (II), Y represents an alkylene group substituted with at least one fluorine atom, preferably an alkylene group having from 2 to 4 carbon atoms. An oxygen atom may be contained in the alkylene chain. The alkylene group is more preferably a perfluoroalkylene group having from 2 to 4 carbon atoms, and most preferably a tetrafluoroethylene group, a hexafluoropropylene group or an octafluorobutylene group.

R in formula (II) represents an alkyl group or a cycloalkyl group. An oxygen atom may be contained in the alkylene chain in the alkyl group or the cycloalkyl group.

The alkyl group represented by R is preferably an alkyl group substituted with a fluorine atom, more preferably a perfluoroalkyl group having from 1 to 4 carbon atoms, e.g., a trifluoromethyl group, a pentafluoroethyl group, a heptafluoropropyl group, a nonafluorobutyl group or a perfluoroethoxyethyl group.

The cycloalkyl group represented by R is preferably a cycloalkyl group substituted with a fluorine atom (preferably a cycloalkyl group having from 3 to 6 carbon atoms, e.g., a cyclopentyl group or a cyclohexyl group).

As compound (A), a compound represented by the following formula (I-a) or (I-b) is preferred, and a compound represented by formula (I-a) is more preferred.

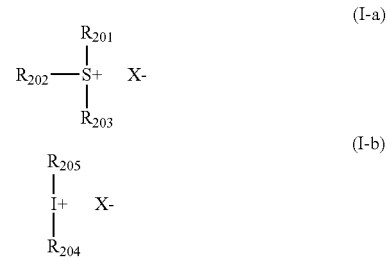

In formulae (I-a) and (I-b), $X^-$ represents an anion represented by formula (I) or (II).

In formula (I-a), $R_{201}$, $R_{202}$ and $R_{203}$ each represents an organic group.

The organic groups represented by $R_{201}$, $R_{202}$ and $R_{203}$ have generally from 1 to 30 carbon atoms, preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by the bonding of two of $R_{201}$, $R_{202}$ and $R_{203}$, an alkylene group (e.g., a butylene group and a pentylene group) can be exemplified.

As the organic groups represented by $R_{201}$, $R_{202}$ and $R_{203}$, the corresponding groups in the compounds represented by formula (I-a1), (I-a2) or (I-a3) described later can be exemplified.

Compound (A) may comprise a plurality of structures represented by formula (I-a). For instance, compound (A) may be a compound having a structure that at least one of $R_{201}$, $R_{202}$ and $R_{203}$ of a compound represented by formula (I-a) is bonded to at least one of $R_{201}$, $R_{202}$ and $R_{203}$ of another compound represented by formula (I-a).

The following compounds (I-a1), (I-a2) and (I-a3) can be exemplified as more preferred (I-a) components.

Compound (I-a1) is an arylsulfonium compound wherein at least one of $R_{201}$, $R_{202}$ and $R_{203}$ in formula (I-a) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group.

As the arylsulfonium compound, e.g., a triarylsulfonium compound, a diaryalkylsulfonium compound and an aryldialkyl-sulfonium compound are exemplified.

As the aryl group of the arylsulfonium compound, a phenyl group and a naphthyl group are preferred, and a phenyl group is more preferred. When the arylsulfonium compound has two or more aryl groups, these two or more aryl groups may be the same or different.

The alkyl group or the cycloalkyl group of the diarylalkyl-sulfonium compound and the aryldialkylsulfonium compound is preferably a straight chain or branched alkyl group having from 1 to 15 carbon atoms or a cycloalkyl group having from 3 to 15 carbon atoms, e.g., a methyl group, an ethyl group, a propyl group, an n-butyl group, a sec-butyl group, a t-butyl group, a cyclopropyl group, a cyclobutyl group and a cyclohexyl group can be exemplified. When two alkyl groups of the aryldialkylsulfonium compound are bonded to each other to form a ring, good storage stability can be ensured and preferred.

The aryl, alkyl and cycloalkyl groups represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a carboxyl group, a halogen atom, a hydroxyl group and a phenylthio group are exemplified as the substituents. The preferred substituents are a straight chain or branched alkyl group having from 1 to 12 carbon atoms, a cycloalkyl group having from 3 to 15 carbon atoms, and a straight chain or branched alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of three. When $R_{201}$, $R_{202}$ and $R_{203}$ each represents an aryl group, it is preferred that the substituent be substituted on the p-position of the aryl group.

Compound (I-a1) is preferably a triphenylsulfonium salt that all of $R_{201}$, $R_{202}$ and $R_{203}$ represent a phenyl group, and more preferably a triphenylsulfonium salt that one or more of the phenyl groups represented by $R_{201}$, $R_{202}$ and $R_{203}$ are substituted with either an alkyl group or a cycloalkyl group. As the alkyl group and the cycloalkyl group of the substituents of the phenyl groups, a straight chain or branched alkyl group having from 1 to 12 carbon atoms and a cycloalkyl group having from 3 to 12 carbon atoms are exemplified, preferably a straight chain or branched alkyl group having from 1 to 6 carbon atoms and a cycloalkyl group having from 3 to 6 carbon atoms are exemplified. The inclusion of such substituents can reduce the generation of particles in storing the solution. The specific examples of the alkyl group and the cycloalkyl group of the substituents of the phenyl groups include a methyl group, an ethyl group, a propyl group, a butyl group, a t-butyl group, a hexyl group and a cyclohexyl group can be exemplified, and a methyl group, a t-butyl group and a cyclohexyl group are most preferred.

In the next place, compound (I-a2) is described.

Compound (I-a2) is a compound in the case where $R_{201}$, $R_{202}$ and $R_{203}$ in formula (I-a) each represents an organic group not having an aromatic ring. Here, an aromatic ring having a hetero atom is also included in the aromatic ring.

The organic groups not having an aromatic ring represented by $R_{201}$, $R_{202}$ and $R_{203}$ generally have from 1 to 30, preferably from 1 to 20, carbon atoms.

$R_{201}$, $R_{202}$ and $R_{203}$ each preferably represents an alkyl group (as a substituted alkyl group, in particular, a straight chain, branched or cyclic oxoalkyl group which may have a double bond in the chain, and an alkoxycarbonylmethyl group can be exemplified), a cycloalkyl group, an allyl group or a vinyl group, more preferably represents a straight chain, branched or cyclic 2-oxoalkyl group, a straight chain, branched or cyclic α,β-unsaturated 2-oxoalkyl group, or a straight chain, branched or cyclic 2,3-unsaturated 4-oxoalkyl group, and most preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 20 carbon atoms (e.g., a methyl group, an ethyl group, a propyl group, a butyl group, or a pentyl group).

As the cycloalkyl group represented by $R_{201}$, $R_{202}$ and $R_{203}$, a cycloalkyl group having from 3 to 10 carbon atoms, e.g., a cyclopentyl group, a cyclohexyl group and a norbonyl group can be exemplified.

The oxoalkyl group represented by $R_{201}$, $R_{202}$ and $R_{203}$ may be any of straight chain, branched or cyclic, and preferably a group having >C=O at the 2- or 4-position of the alkyl group or the cycloalkyl group can be exemplified. The oxoalkyl group may have a double bond in the alkyl chain, and it is preferred for the double bond to form an α,β-unsaturated ketone structure conjugated with a carbonyl group.

As the alkoxyl group in the alkoxycarbonylmethyl group represented by $R_{201}$, $R_{202}$ and $R_{203}$, preferably an alkyl group having from 1 to 5 carbon atoms (e.g., a methyl group, an ethyl group, a propyl group, a butyl group, and a pentyl group) can be exemplified.

$R_{201}$, $R_{202}$ and $R_{203}$ may further be substituted with a halogen atom, an alkoxyl group (e.g., an alkoxyl group having from 1 to 5 carbon atoms), a hydroxyl group, a cyano group or a nitro group.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by the bonding of two of $R_{201}$, $R_{202}$ and $R_{203}$, an alkylene group (e.g., a butylene group and a pentylene group) can be exemplified.

Compound (I-a3) is a compound represented by the following formula (I-a3), which compound has an arylacylsulfonium salt structure.

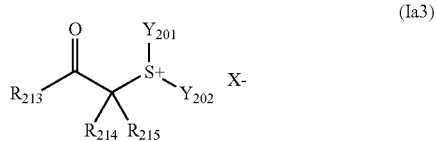
(Ia3)

In formula (I-a3), $R_{213}$ represents an aryl group, preferably a phenyl group or a naphthyl group, and more preferably a phenyl group.

As the preferred substituents on $R_{213}$, e.g., an alkyl group (preferably having from 1 to 15 carbon atoms), a cycloalkyl group (preferably having from 3 to 15 carbon atoms), an alkoxyl group (preferably having from 1 to 12 carbon atoms), an acyl group (preferably having from 2 to 13 carbon atoms), a nitro group, a hydroxyl group, an alkoxycarbonyl group (preferably having from 2 to 13 carbon atoms), and a carboxyl group are exemplified.

$R_{214}$ and $R_{215}$ each represents a hydrogen atom, an alkyl group or a cycloalkyl group.

$Y_{201}$ and $Y_{202}$ each represents an alkyl group (as a substituted alkyl group, in particular, a 2-oxoalkyl group, an alkoxycarbonylalkyl group, and a carboxyalkyl group can be exemplified), a cycloalkyl group, an aryl group or a vinyl group.

$R_{213}$ and $R_{214}$, $R_{214}$ and $R_{215}$, and $Y_{201}$ and $Y_{202}$ may be bonded to each other to form a cyclic structure. These cyclic structures may contain an oxygen atom, a sulfur atom, an ester bond or an amido bond.

The alkyl group represented by $Y_{201}$ and $Y_{202}$ is preferably a straight chain or branched alkyl group having from 1 to 20 carbon atoms, and the cycloalkyl group preferably has from 3 to 20 carbon atoms.

As the 2-oxoalkyl group, a group having >C=O at the 2-position of the alkyl group represented by $Y_{201}$ and $Y_{202}$ can be exemplified.

The alkoxycarbonyl group in the alkoxycarbonylalkyl group is preferably an alkoxycarbonyl group having from 2 to 20 carbon atoms, which may be substituted with a fluorine atom, an alkoxyl group or a hydroxyl group.

As the carboxylalkyl group, the above alkyl group substituted with a carboxyl group is exemplified.

The aryl group is preferably a phenyl group or a naphthyl group, more preferably a phenyl group.

As the group formed by the bonding of $Y_{201}$ and $Y_{202}$, a butylene group and a pentylene group can be exemplified.

$Y_{201}$ and $Y_{202}$ preferably represent an alkyl group having 4 or more carbon atoms, more preferably an alkyl group having from 4 to 16, and still more preferably from 4 to 12, carbon atoms.

At least one of $R_{214}$ and $R_{215}$ is preferably an alkyl group, more preferably both $R_{214}$ and $R_{215}$ are alkyl groups. When at least one of $R_{214}$ and $R_{215}$ is an alkyl group, a photolytic property is improved, so that sensitivity increases.

In formula (I-b), $R_{204}$ and $R_{205}$ each represents an aryl group, an alkyl group or a cycloalkyl group.

As the aryl group represented by $R_{204}$ and $R_{205}$, a phenyl group and a naphthyl group are preferred, and a phenyl group is more preferred.

The alkyl group represented by $R_{204}$ and $R_{205}$ may be either straight chain or branched, and a straight chain or branched alkyl group having from 1 to 10 carbon atoms (e.g., a methyl group, an ethyl group, a propyl group, a butyl group, or a pentyl group) is preferred.

As the cycloalkyl group represented by $R_{204}$ and $R_{205}$, a cycloalkyl group having from 3 to 10 carbon atoms (e.g., a cyclopentyl group, a cyclohexyl group and a norbonyl group) can be exemplified.

As the substituents which $R_{204}$ and $R_{205}$ may have, an alkyl group (e.g., having from 1 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

The specific examples of the compounds represented by formula (I) capable of generating an acid are shown below, but the invention is not limited to these compounds.

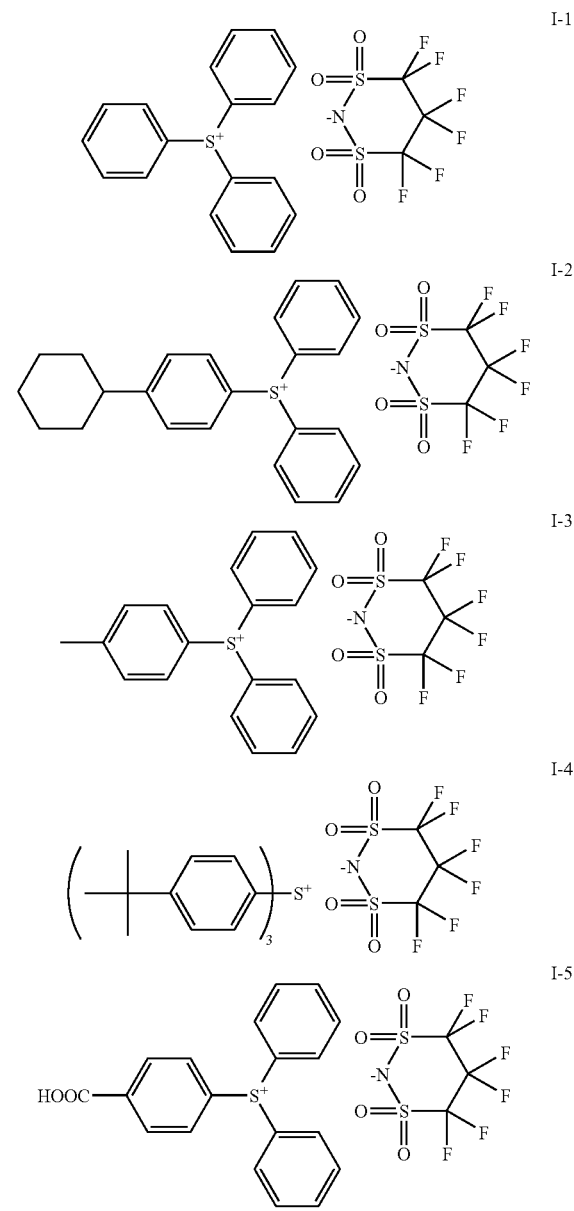

I-6
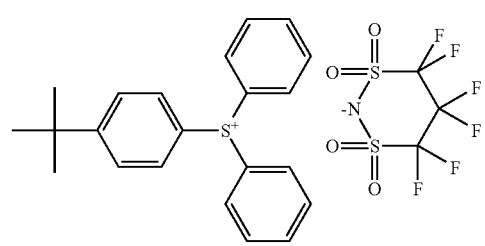
I-7
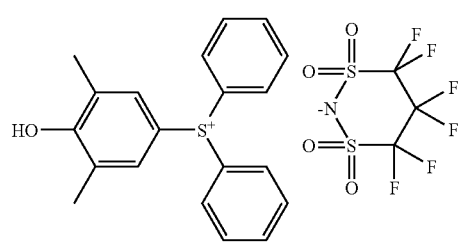
I-8
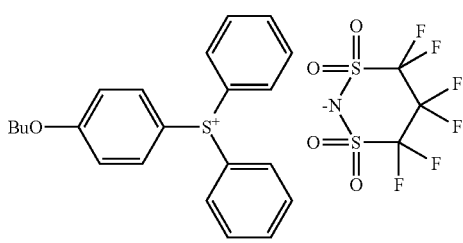
I-9
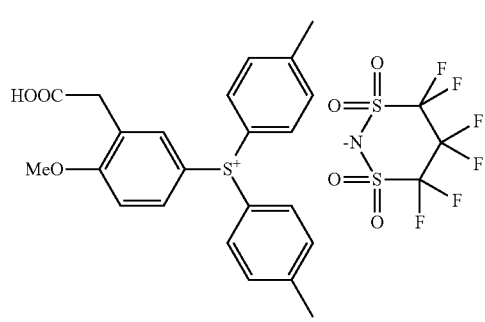
I-10
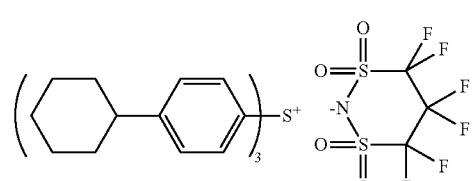
I-11
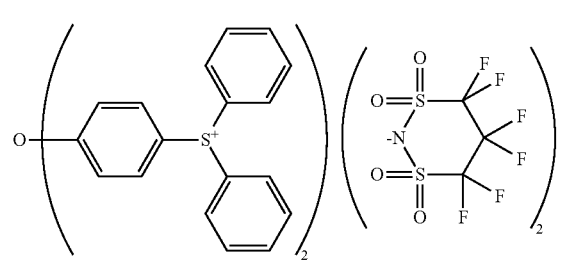
I-12
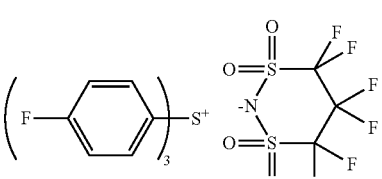
I-13
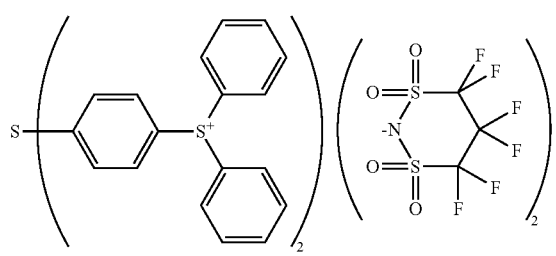
I-14
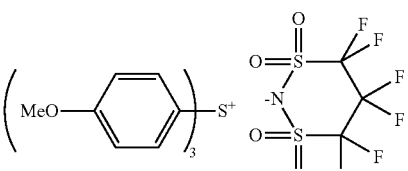
I-15
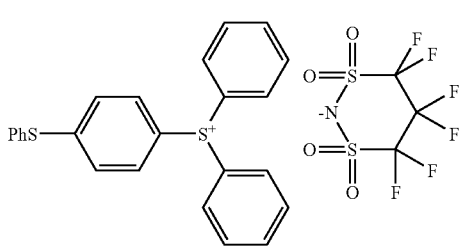
I-16
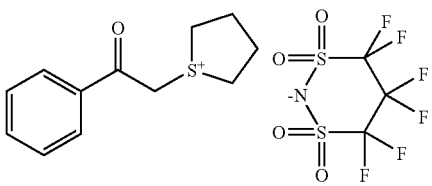
I-17
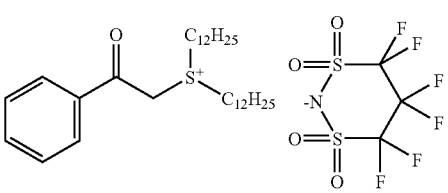
I-18
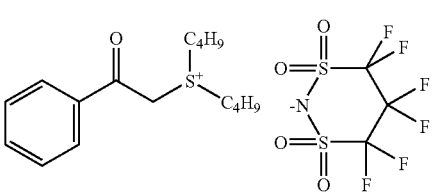

I-19
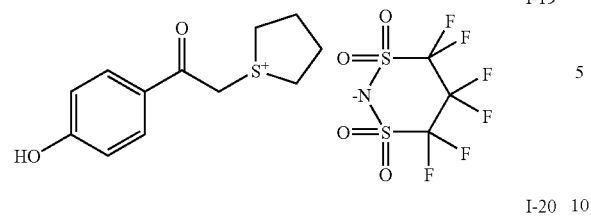
I-20
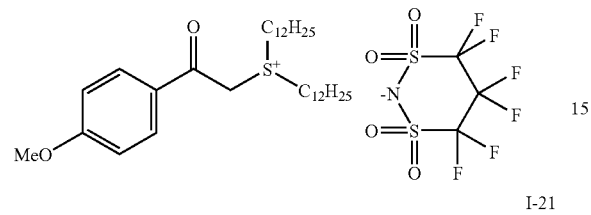
I-21
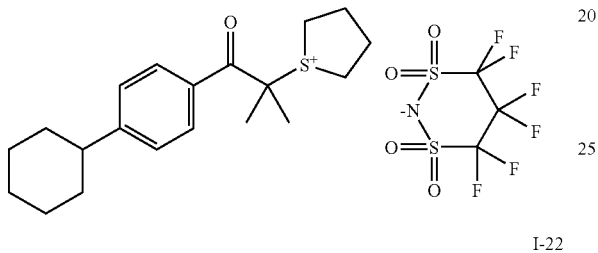
I-22
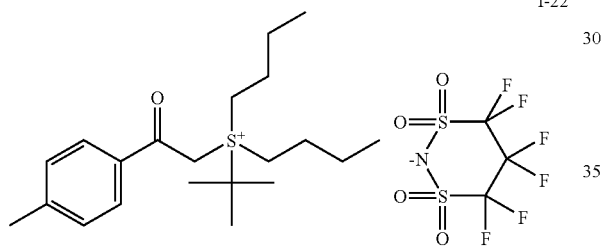
I-23
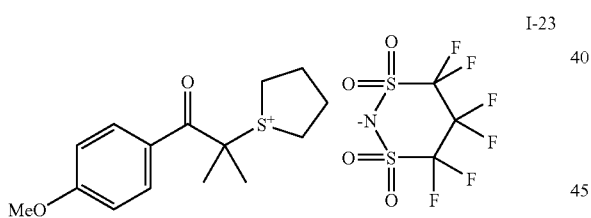
I-24
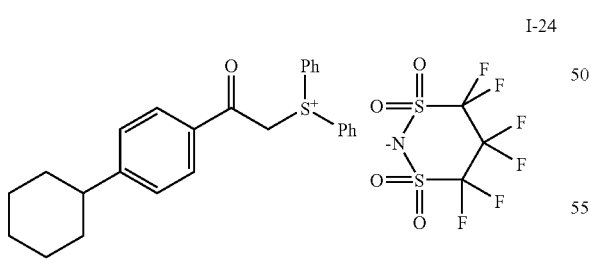
I-25
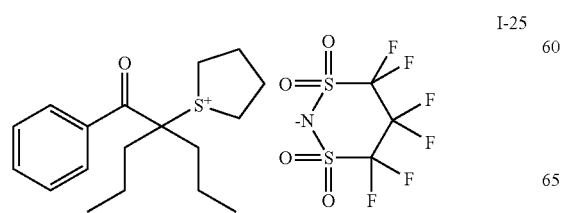
I-26
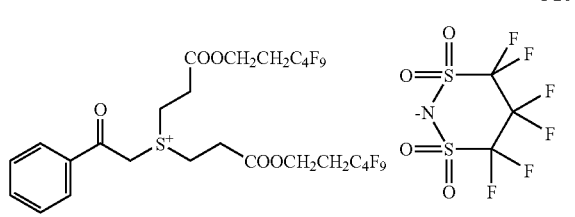
I-27
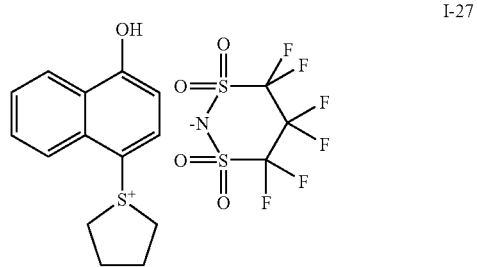
I-28
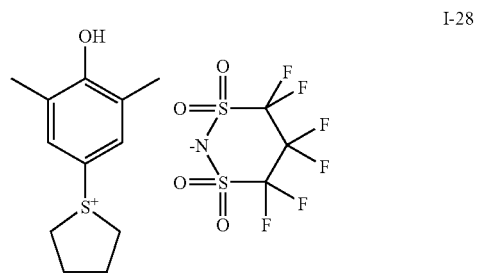
I-29
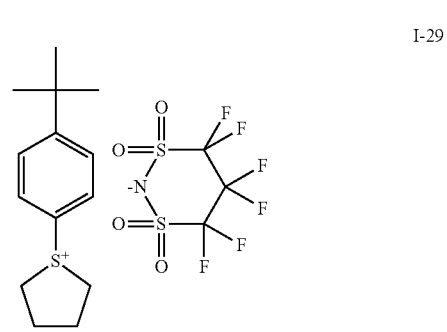
I-30
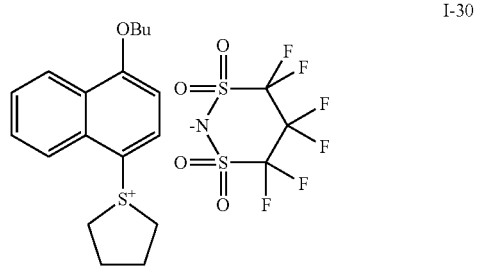
I-31
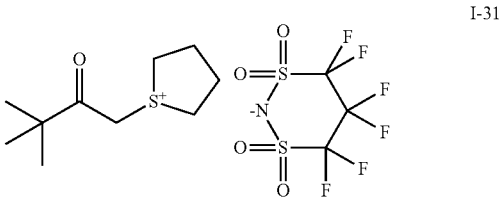

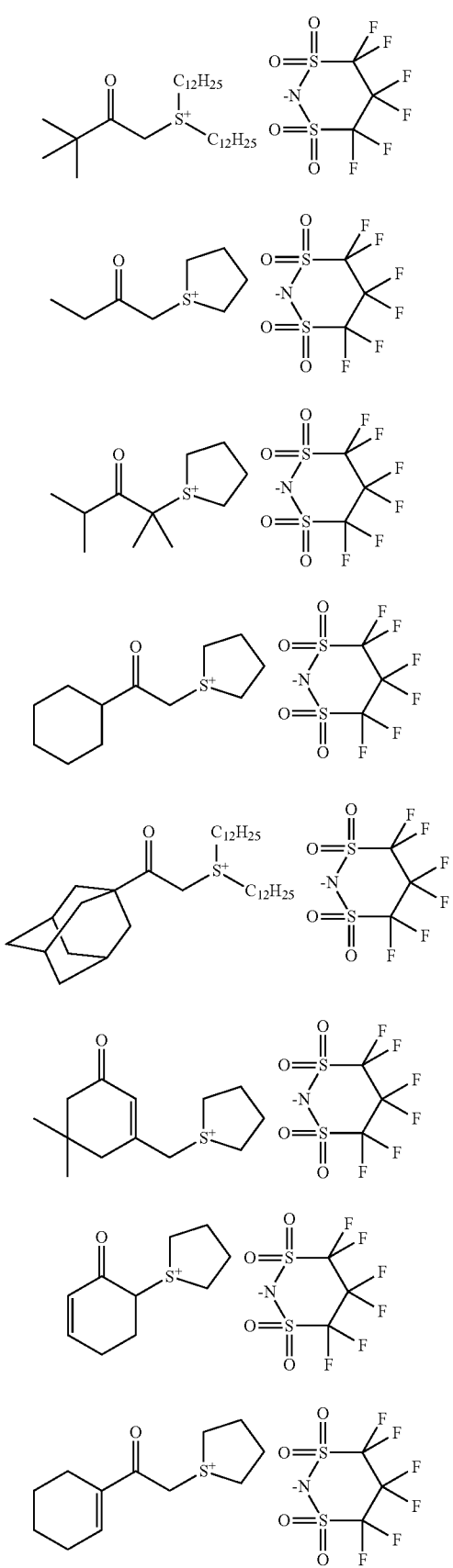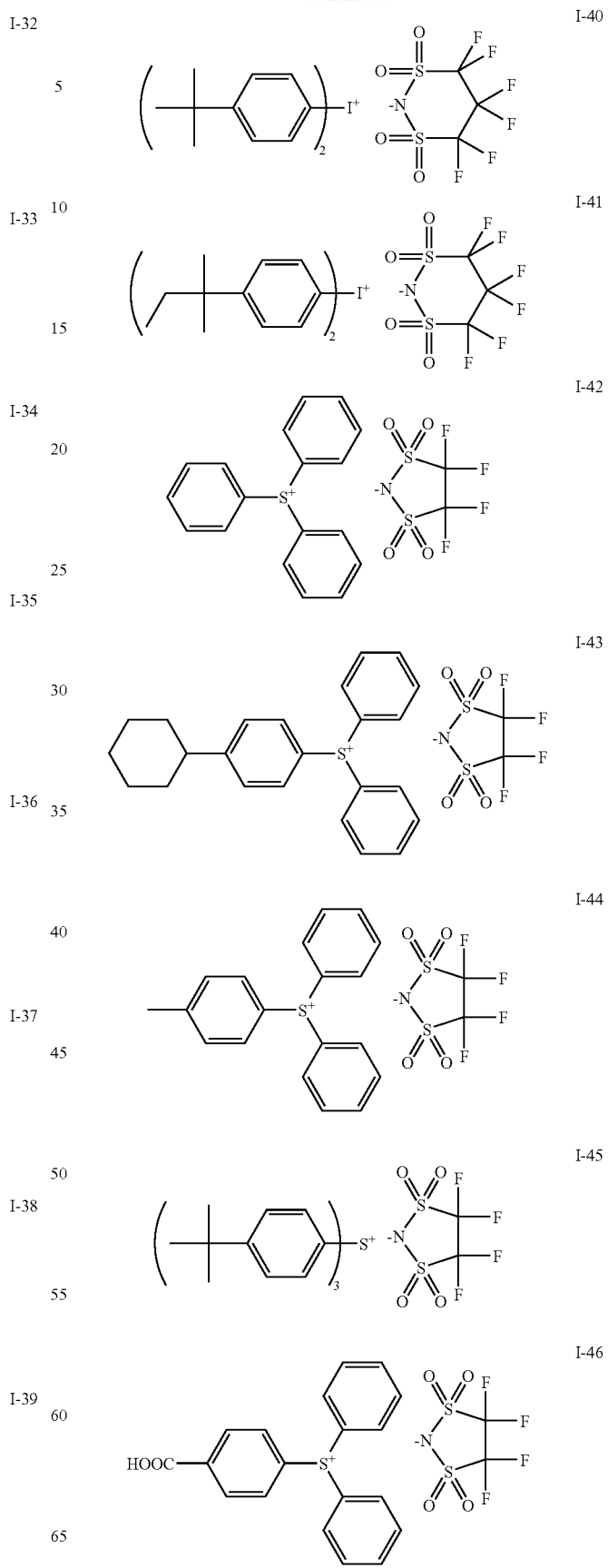

I-47 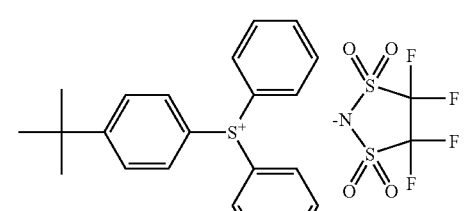
I-48 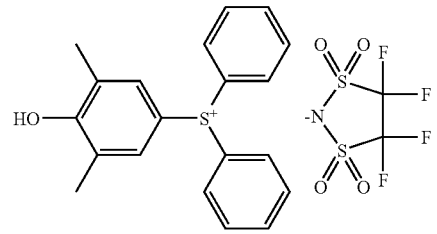
I-49 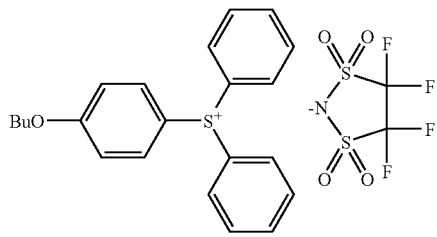
I-50 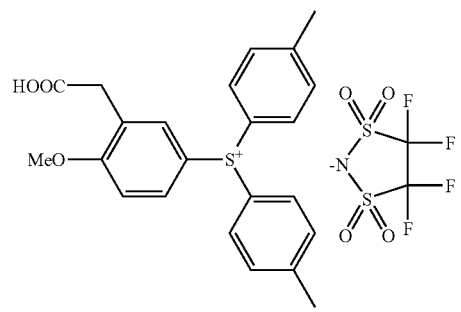
I-51 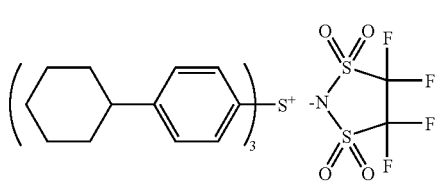
I-52 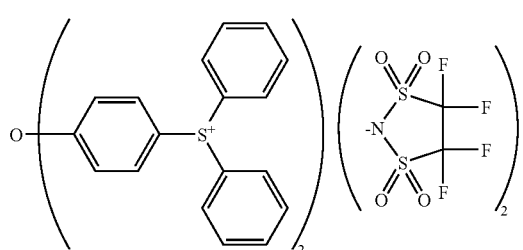
I-53 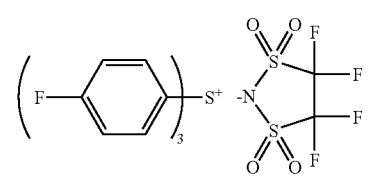
I-54 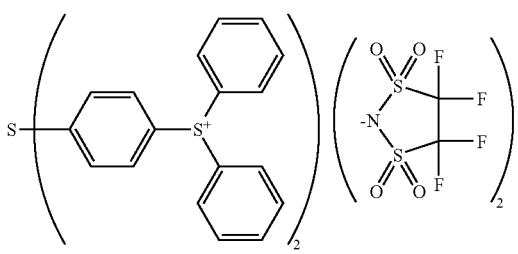
I-55 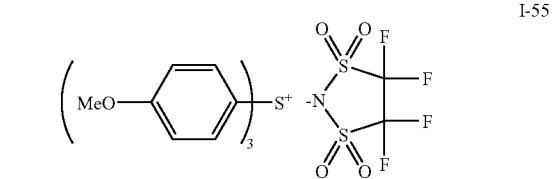
I-56 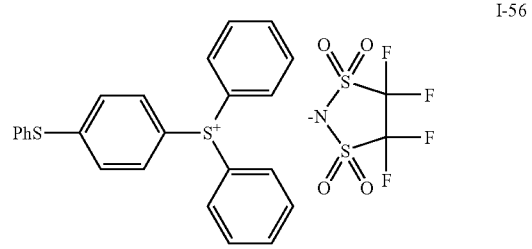
I-57 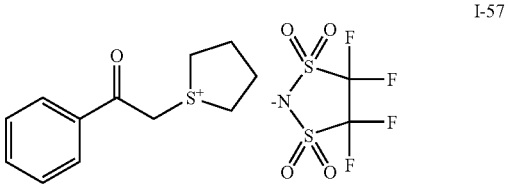
I-58 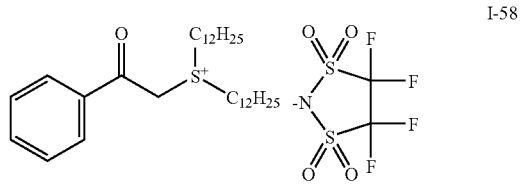
I-59 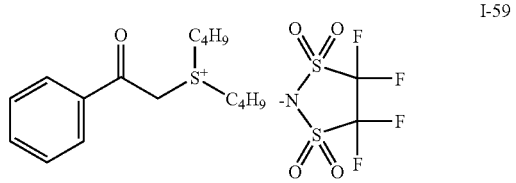
I-60 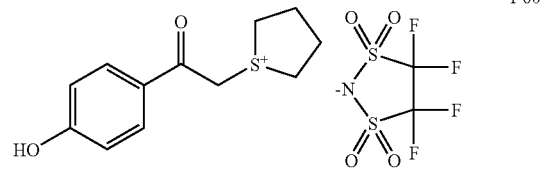
I-61 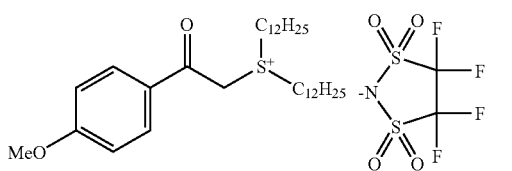

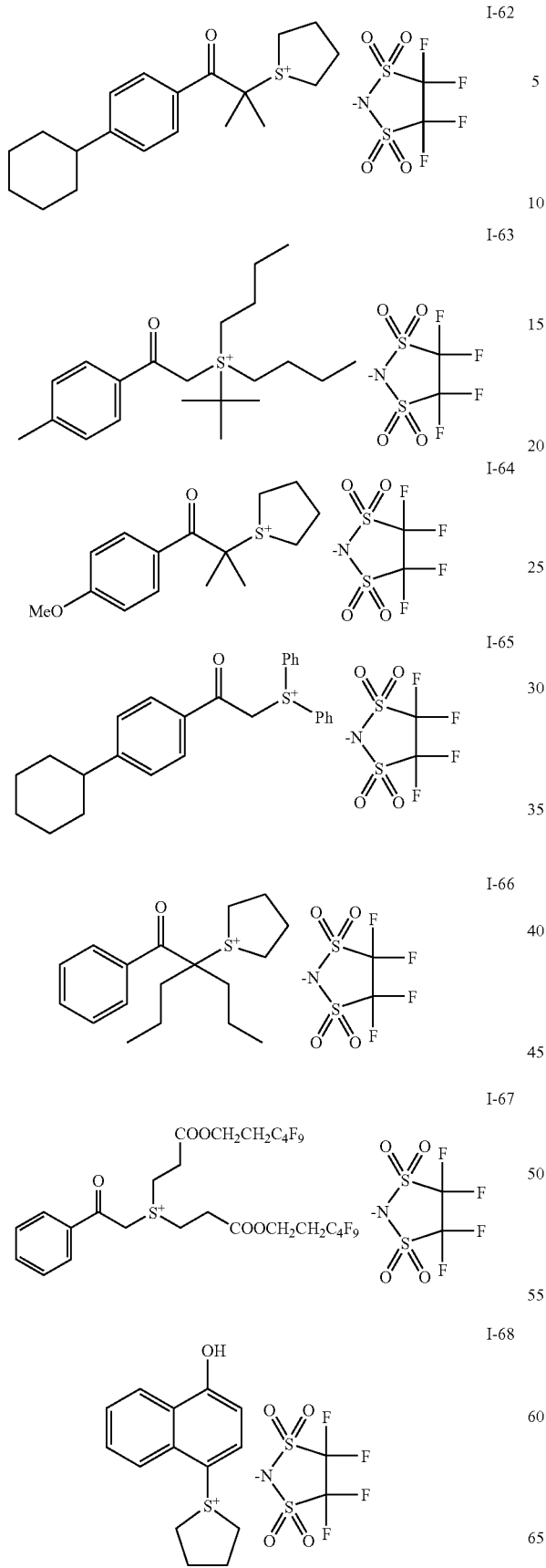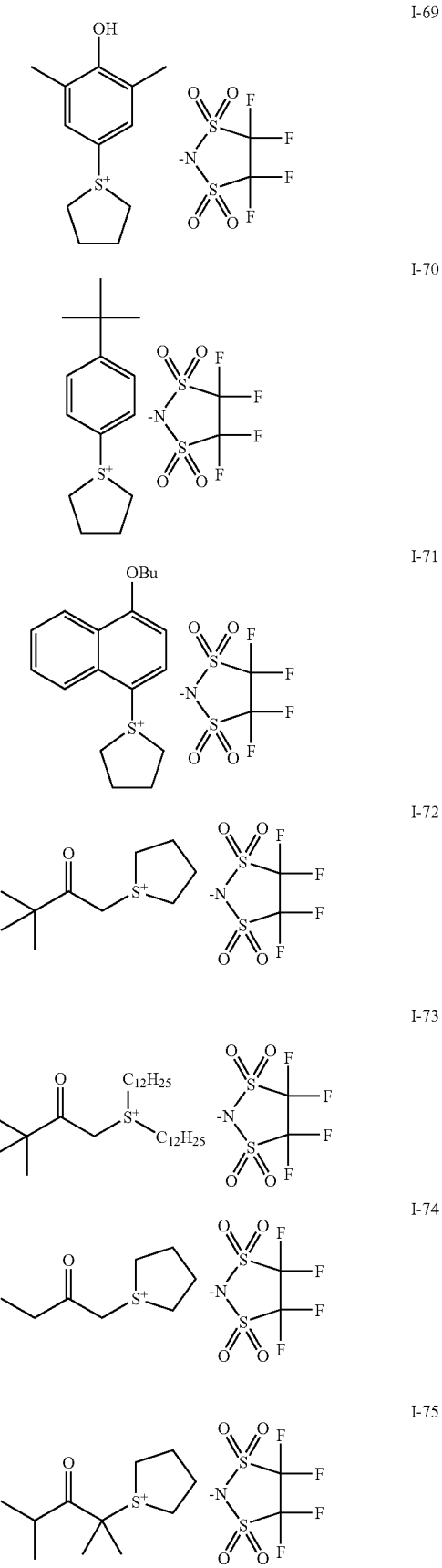

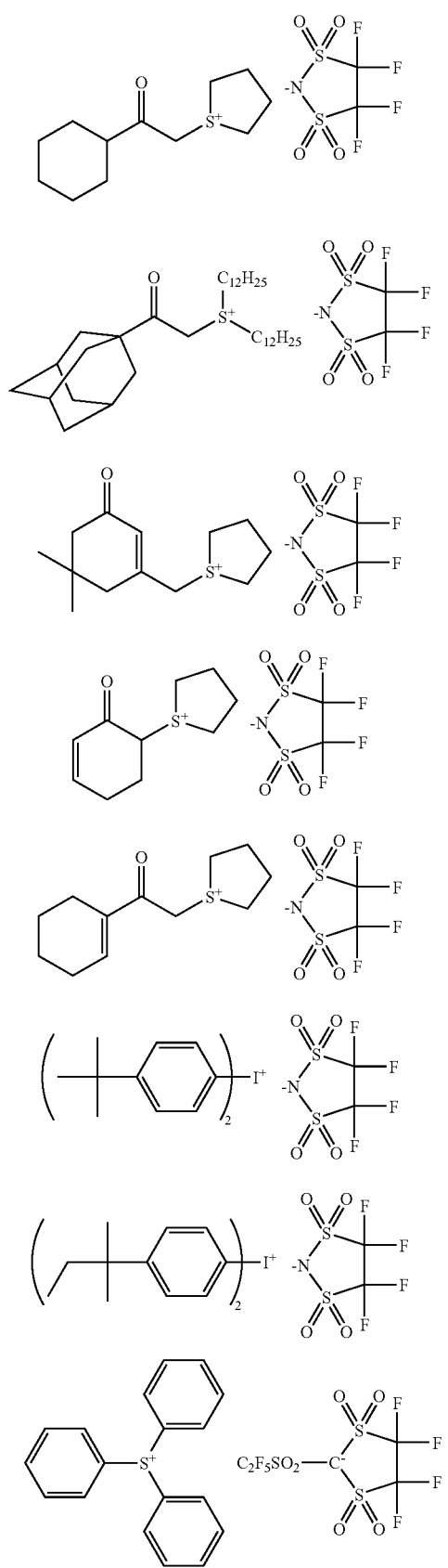
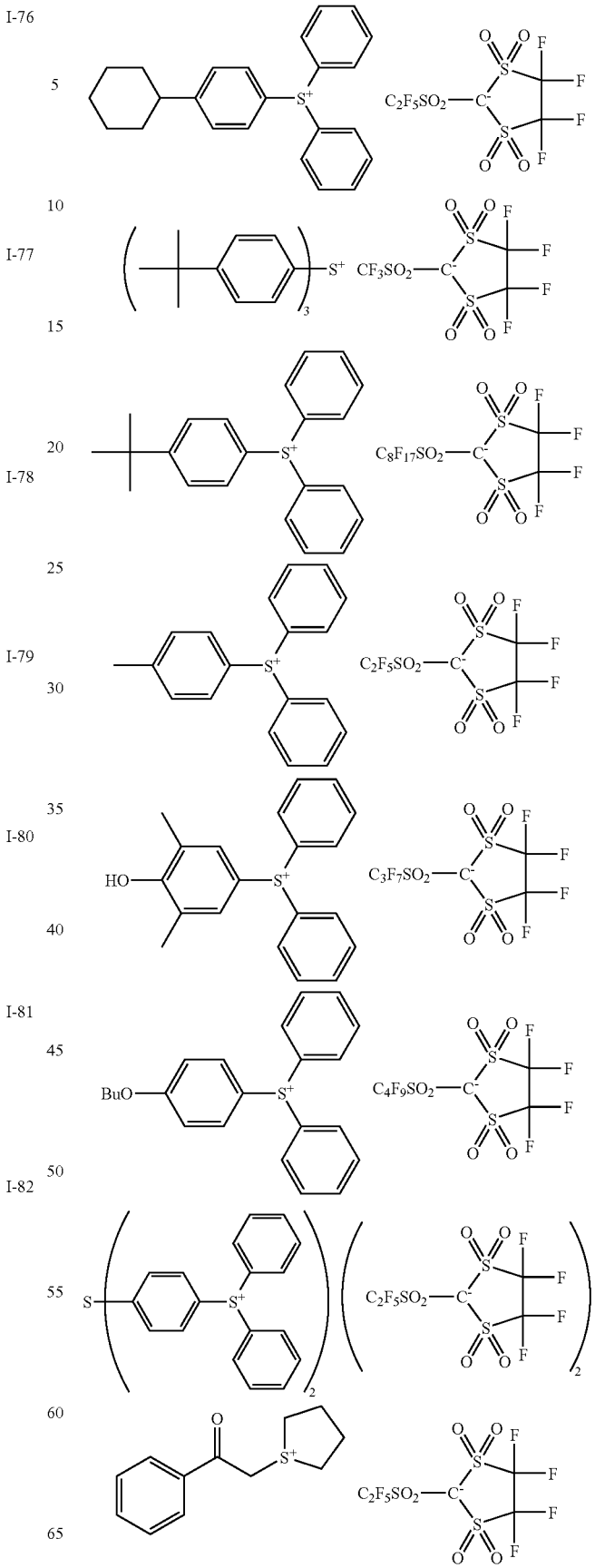

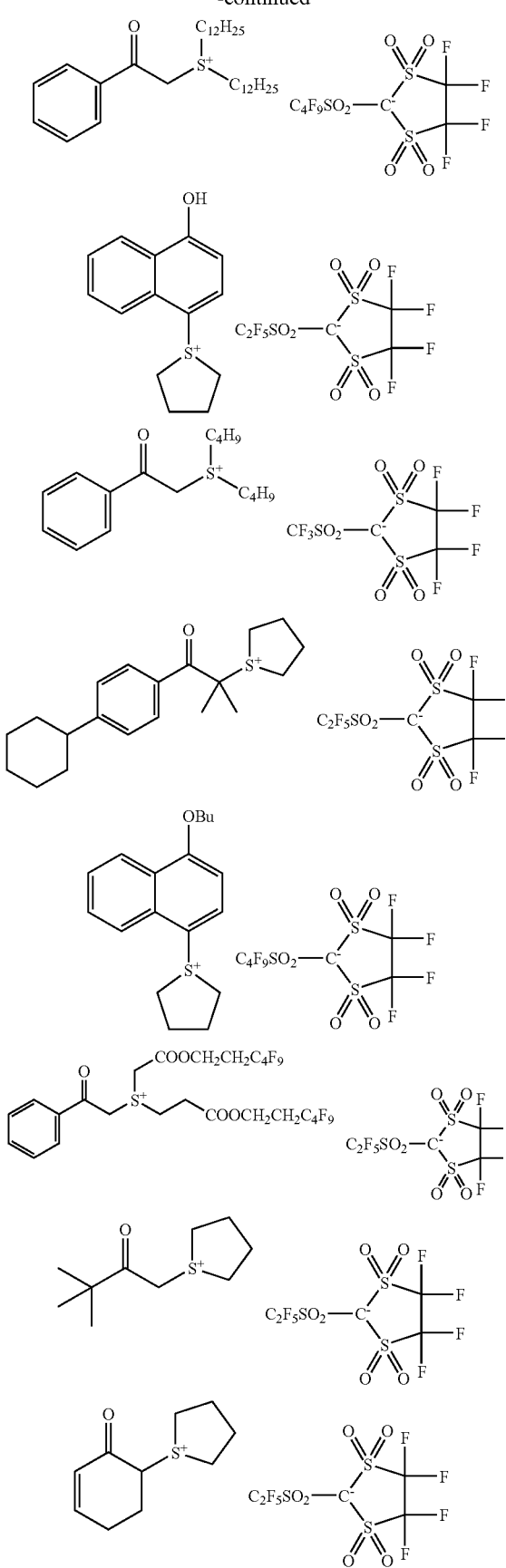
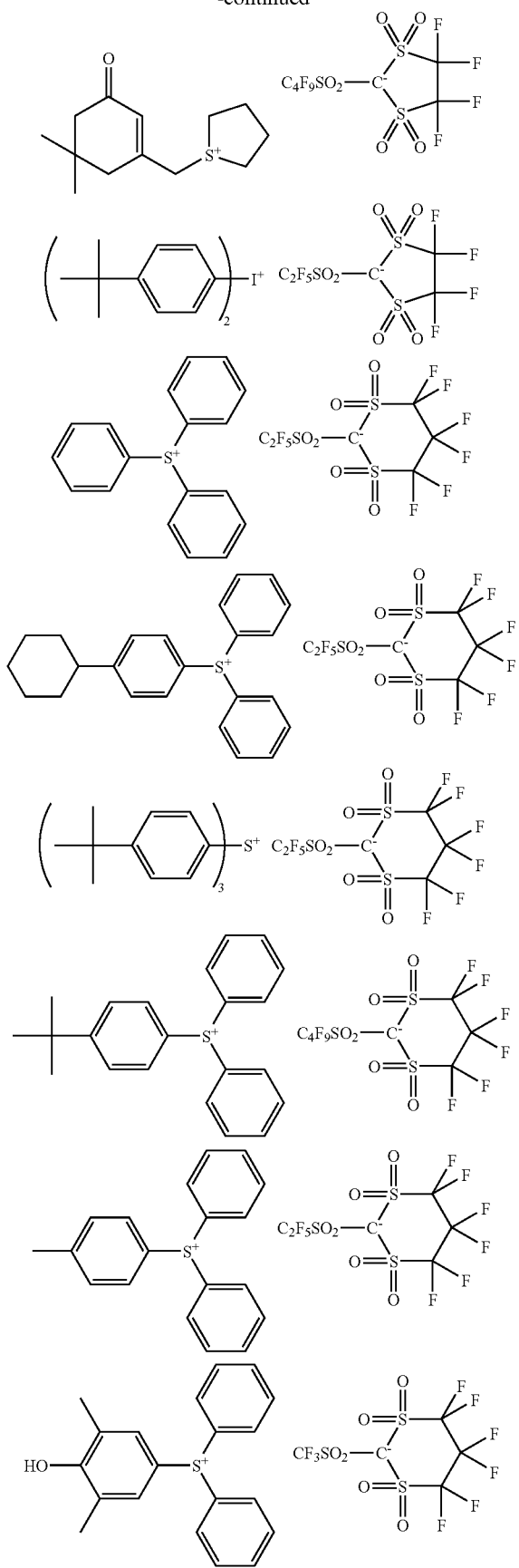

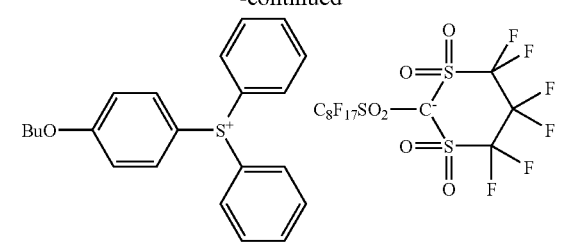
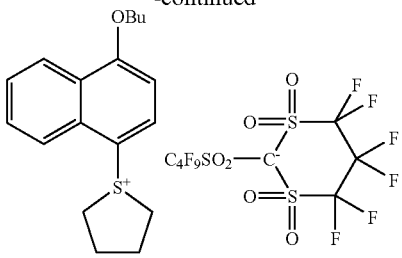
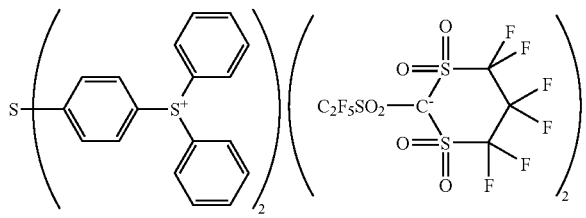
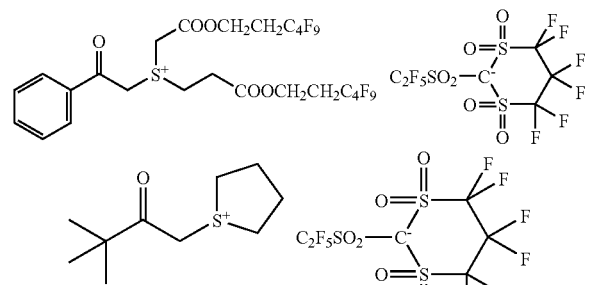
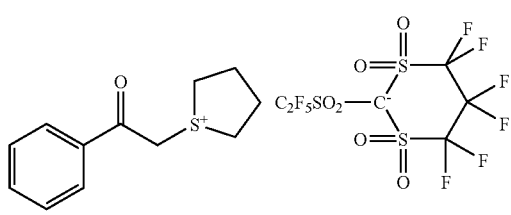
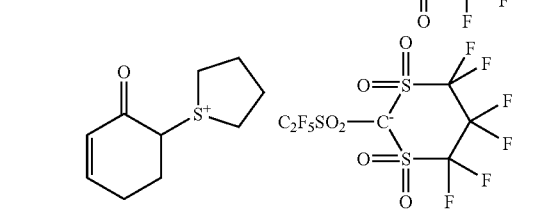
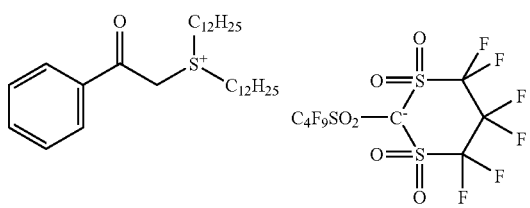
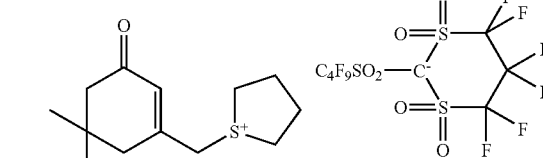
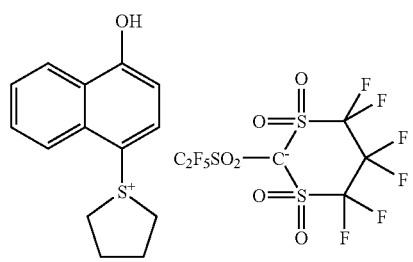
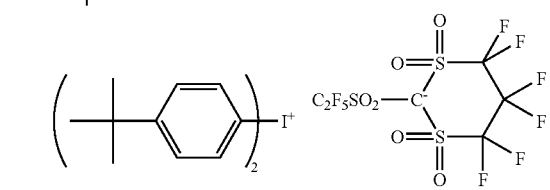
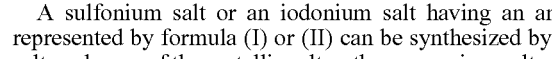
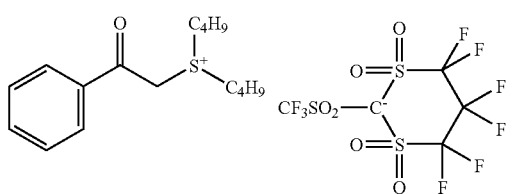
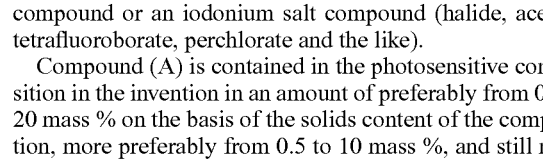
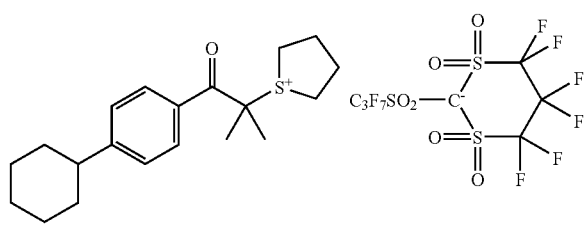
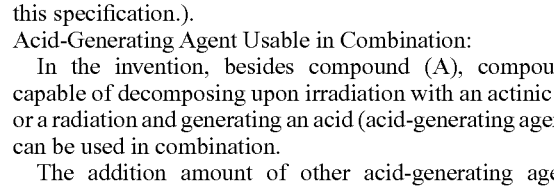
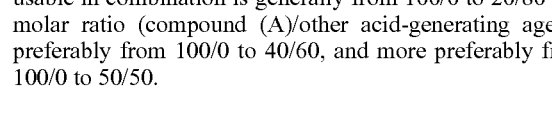

A sulfonium salt or an iodonium salt having an anion represented by formula (I) or (II) can be synthesized by the salt exchange of the metallic salt or the ammonium salt of an anion represented by formula (I) or (II) with a sulfonium salt compound or an iodonium salt compound (halide, acetate, tetrafluoroborate, perchlorate and the like).

Compound (A) is contained in the photosensitive composition in the invention in an amount of preferably from 0.1 to 20 mass % on the basis of the solids content of the composition, more preferably from 0.5 to 10 mass %, and still more preferably from 1 to 7 mass % ("mass %" means "wt %" in this specification.).

Acid-Generating Agent Usable in Combination:

In the invention, besides compound (A), compounds capable of decomposing upon irradiation with an actinic ray or a radiation and generating an acid (acid-generating agents) can be used in combination.

The addition amount of other acid-generating agents usable in combination is generally from 100/0 to 20/80 in a molar ratio (compound (A)/other acid-generating agent), preferably from 100/0 to 40/60, and more preferably from 100/0 to 50/50.

As such acid-generating agents usable in combination, photopolymerization initiators of photo-cationic polymerization, photopolymerization initiators of photo-radical polymerization, photo-decoloring agents of dyes, photo-discoloring agents, well-known compounds capable of generating an acid upon irradiation with an actinic ray or a radiation that are used in the process of micro-resist and the like, and the mixtures of these compounds can be optionally used.

For example, diazonium salt, phosphonium salt, sulfonium salt, iodonium salt, imidosulfonate, oximesulfonate, diazodisulfone, disulfone, and o-nitrobenzyl sulfonate are exemplified as such acid-generating agents.

Further, compounds obtained by introducing a group or a compound capable of generating an acid upon irradiation with an actinic ray or a radiation to the main chain or the side chain of the polymers, e.g., the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

The compounds generating an acid by the action of lights disclosed in U.S. Pat. No. 3,779,778, EP-126712 can also be used.

As preferred acid-generating agents usable in combination, compounds represented by the following formula (ZI), (ZII) or (ZIII) can be exemplified.

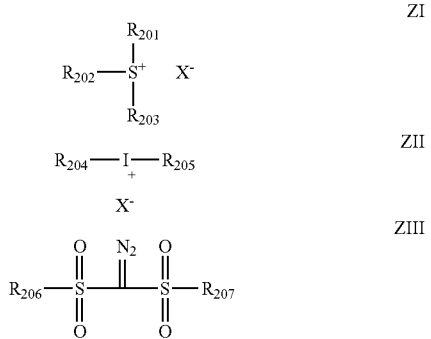

In formula (ZI), $R_{201}$, $R_{202}$ and $R_{203}$ each represents an organic group.

The organic groups represented by $R_{201}$, $R_{202}$ and $R_{203}$ have generally from 1 to 30 carbon atoms, preferably from 1 to 20.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by the bonding of two of $R_{201}$, $R_{202}$ and $R_{203}$, an alkylene group (e.g., a butylene group and a pentylene group) can be exemplified.

$X^-$ represents a non-nucleophilic anion.

As the non-nucleophilic anions represented by $X^-$, e.g., a sulfonate anion, a carboxylate anion, a sulfonylimide anion, a bis(alkylsulfonyl)imide anion, and a tris(alkylsulfonyl)-methyl anion can be exemplified.

A non-nucleophilic anion is an anion which is extremely low in the property of bringing about a nucleophilic reaction, and capable of restraining the aging decomposition by an intramolecular nucleophilic reaction. The aging stability of the resist can be improved by a non-nucleophilic anion.

As the sulfonate anions, e.g., an alkylsulfonate anion, an arylsulfonate anion, and a camphorsulfonate anion can be exemplified.

As the carboxylate anions, e.g., an alkylcarboxylate anion, an arylcarboxylate anion, and an aralkylcarboxylate anion can be exemplified.

The alkyl moiety in the alkylsulfonate anions may be an alkyl group or a cycloalkyl group, preferably an alkyl group having from 1 to 30 carbon atoms and a cycloalkyl group having from 3 to 30 carbon atoms, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbonyl group and a boronyl group can be exemplified.

As the aryl group in the arylsulfonate anions, preferably an aryl group having from 6 to 14 carbon atoms, e.g., a phenyl group, a tolyl group and a naphthyl group can be exemplified.

As the substituents of the alkyl group, the cycloalkyl group and the aryl group in the alkylsulfonate anions and the arylsulfonate anions, e.g., a nitro group, a halogen atom (a fluorine atom, a chlorine atom, a bromine atom, an iodine atom), a carboxyl group, a hydroxyl group, an amino group, a cyano group, an alkoxyl group (preferably having from 1 to 5 carbon atoms), a cycloalkyl group (preferably having from 3 to 15 carbon atoms), an aryl group (preferably having from 6 to 14 carbon atoms), an alkoxycarbonyl group (preferably having from 2 to 7 carbon atoms), an acyl group (preferably having from 2 to 12 carbon atoms), and an alkoxycarbonyloxy group (preferably having from 2 to 7 carbon atoms) can be exemplified. As for the aryl group and the cyclic structure that each group has, an alkyl group (preferably having from 1 to 15 carbon atoms) can further be exemplified as the substituent.

As the alkyl moiety in the alkylcarboxylate anions, the same alkyl groups and cycloalkyl groups as in the alkylsulfonate anions can be exemplified.

As the aryl group in the arylcarboxylate anions, the same aryl groups as in the arylsulfonate anions can be exemplified.

As the aralkyl group in the aralkylcarboxylate anions, preferably an aralkyl group having from 6 to 12 carbon atoms, e.g., a benzyl group, a phenethyl group, a naphthylmethyl group, a naphthylethyl group, and a naphthylmethyl group can be exemplified.

As the substituents of the alkyl group, cycloalkyl group, aryl group and aralkyl group in the alkylcarboxylate anions, arylcarboxylate anions and aralkylcarboxylate anions, e.g., the same halogen atoms, alkyl groups, cycloalkyl groups, alkoxyl groups and alkylthio groups as in the arylsulfonate anions can be exemplified.

As the sulfonylimide anion, e.g., a saccharin anion can be exemplified.

The alkyl group in the bis(alkylsulfonyl)imide anions and tris(alkylsulfonyl)methyl anions is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group can be exemplified. As the substituents of these alkyl groups, a halogen atom, an alkyl group substituted with a halogen atom, an alkoxyl group and an alkylthio group can be exemplified, and an alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $X^-$, an alkanesulfonate anion wherein the α-position of the sulfonic acid is substituted with a fluorine atom, an arylsulfonate anion substituted with a fluorine atom or a group having a fluorine atom, bis(alkylsulfonyl)imide anion wherein the alkyl group is substituted with a fluorine atom, and a tris(alkylsulfonyl) methyl anion wherein the alkyl group is substituted with a fluorine atom are preferred. Particularly preferred non-nucleophilic anions are a perfluoroalkane-sulfonate anion having from 4 to 8 carbon atoms and a benzenesulfonate anion having a fluorine atom, and the most preferred non-nucleophilic anions are a nonafluorobutane-sulfonate anion, a perfluorooctanesulfonate anion, a penta-fluorobenzenesulfonate anion and a 3,5-bis(trifluoromethyl)-benzenesulfonate anion.

As the organic groups represented by $R_{201}$, $R_{202}$ and $R_{203}$, the corresponding groups in compounds (Z1-1), (Z1-2) and (Z1-3) described later can be exemplified.

Compound (A) may comprise a plurality of structures represented by formula (ZI). For instance, compound (A) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (Z1-1), (Z1-2) and (Z1-3) can be exemplified as more preferred (ZI) components.

Compound (Z1-1) is an arylsulfonium compound wherein at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound and an aryl-dialkyl-sulfonium compound are exemplified.

As the aryl group of the arylsulfonium compound, a phenyl group and a naphthyl group are preferred, and a phenyl group is more preferred. When the arylsulfonium compound has two or more aryl groups, these two or more aryl groups may be the same or different.

The alkyl group or the cycloalkyl group that the arylsulfonium compound has according to necessity is preferably a straight chain or branched alkyl group having from 1 to 15 carbon atoms or a cycloalkyl group having from 3 to 15 carbon atoms, e.g., a methyl group, an ethyl group, a propyl group, an n-butyl group, a sec-butyl group, a t-butyl group, a cyclopropyl group, a cyclobutyl group and a cyclohexyl group can be exemplified.

The aryl, alkyl and cycloalkyl groups represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain or branched alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of three. When $R_{201}$, $R_{202}$ and $R_{203}$ each represents an aryl group, it is preferred that the substituent be substituted on the p-position of the aryl group.

In the next place, compound (Z1-2) is described.

Compound (Z1-2) is a compound in the case where $R_{201}$, $R_{202}$ and $R_{203}$ in formula (Z1) each represents an organic group not having an aromatic ring. Here, an aromatic ring having a hetero atom is also included in the aromatic ring.

The organic groups not having an aromatic ring represented by $R_{201}$, $R_{202}$ and $R_{203}$ generally have from 1 to 30, preferably from 1 to 20, carbon atoms.

$R_{201}$, $R_{202}$ and $R_{203}$ each preferably represents an alkyl group, a cycloalkyl group, an allyl group or a vinyl group, more preferably a straight chain or branched 2-oxoalkyl group, a 2-oxocycloalkyl group, or an alkoxycarbonylmethyl group, and most preferably a straight chain or branched 2-oxoalkyl group.

The alkyl group and the cycloalkyl group represented by $R_{201}$, $R_{202}$ and $R_{203}$ are preferably a straight chain or branched alkyl group having from 1 to 10 carbon atoms (e.g., a methyl group, an ethyl group, a propyl group, a butyl group, or a pentyl group), and a cycloalkyl group having from 3 to 10 carbon atoms (e.g., a cyclopentyl group, a cyclohexyl group or a norbonyl group). As the alkyl group, more preferably a 2-oxoalkyl group and an alkoxycarbonylmethyl group can be exemplified. As the cycloalkyl group, more preferably a 2-oxocycloalkyl group can be exemplified.

The 2-oxoalkyl group may be either straight chain or branched, preferably a group having $>C=O$ at the 2-position of the alkyl group can be exemplified.

As the 2-oxocycloalkyl group, preferably a group having $>C=O$ at the 2-position of the cycloalkyl group can be exemplified.

As the alkoxyl group in the alkoxycarbonylmethyl group, preferably an alkyl group having from 1 to 5 carbon atoms (e.g., a methyl group, an ethyl group, a propyl group, a butyl group, and a pentyl group) can be exemplified.

$R_{201}$, $R_{202}$ and $R_{203}$ may further be substituted with a halogen atom, an alkoxyl group (e.g., an alkoxyl group having from 1 to 5 carbon atoms), a hydroxyl group, a cyano group or a nitro group.

Two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by the bonding of two of $R_{201}$, $R_{202}$ and $R_{203}$, an alkylene group (e.g., a butylene group and a pentylene group) can be exemplified.

Compound (Z1-3) is a compound represented by the following formula (Z1-3), which compound has a phenacylsulfonium salt structure.

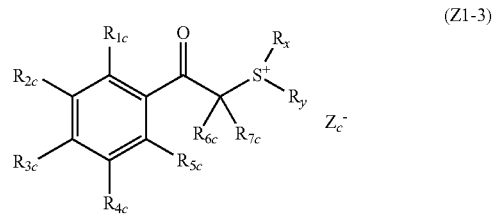

(Z1-3)

wherein $R_{1c}$, $R_{2c}$, $R_{3c}$, $R_{4c}$ and $R_{5c}$ each represents a hydrogen atom, an alkyl group, a cycloalkyl group, an alkoxyl group or a halogen atom; $R_{6c}$ and $R_{7c}$ each represents a hydrogen atom, an alkyl group or a cycloalkyl group; $R_x$ and $R_y$ each represents an alkyl group, a cycloalkyl group, an allyl group or a vinyl group.

Any two or more of $R_{1c}$ to $R_{5c}$, and $R_x$ and $R_y$ may be respectively bonded to form a cyclic structure, and an oxygen atom, a sulfur atom, an ester bond or an amido bond may be contained in these rings.

$Z_c^-$ represents a non-nucleophilic anion, and the same non-nucleophilic anions as $X^-$ in formula (ZI) can be exemplified.

The alkyl group represented by $R_{1c}$ to $R_{5c}$ may be either straight chain or branched, e.g., an alkyl group having from 1 to 20 carbon atoms, preferably a straight chain or branched alkyl group having from 1 to 12 carbon atoms (e.g., a methyl group, an ethyl group, a straight chain or branched propyl group, a straight chain or branched butyl group, and a straight chain or branched pentyl group) can be exemplified, and as the cycloalkyl group, e.g., a cycloalkyl group having from 3 to 8 carbon atoms (e.g., a cyclopentyl group and a cyclohexyl group) can be exemplified.

The alkoxyl group represented by $R_{1c}$ to $R_{5c}$ may be straight chain, branched or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group and a straight chain or branched pentoxy group), a cycloalkoxyl group having from 3 to 8 carbon atoms (e.g., a cyclopentyloxy group and a cyclohexyloxy group) can be exemplified.

Preferably any of $R_{1c}$ to $R_{5c}$ represents a straight chain or branched alkyl group, a cycloalkyl group, or a straight chain, branched or cyclic alkoxyl group, and more preferably the sum total of the carbon atoms of $R_{1c}$ to $R_{5c}$ is from 2 to 15. By selecting such substituents, the solvent solubility is improved and the generation of particles in storing can be reduced.

As the alkyl group and the cycloalkyl group represented by $R_x$ and $R_y$, the same alkyl groups and cycloalkyl groups as in $R_{1c}$ to $R_{5c}$ can be exemplified, and a 2-oxoalkyl group, a 2-oxocycloalkyl group and an alkoxycarbonylmethyl group are more preferred.

As the 2-oxoalkyl group and the 2-oxocycloalkyl group, groups having >C=O at the 2-positions of the alkyl group and the cycloalkyl group represented by $R_{1c}$ to $R_{5c}$ can be exemplified.

As the alkoxyl groups in the alkoxycarbonylmethyl group, the same alkoxyl groups as in $R_{1c}$ to $R_{5c}$ can be exemplified.

As the groups formed by the bonding of $R_x$ and $R_y$, a butylene group and a pentylene group can be exemplified.

$R_x$ and $R_y$ each preferably represents an alkyl group having 4 or more carbon atoms or a cycloalkyl group, and more preferably an alkyl group having 6 or more, still more preferably 8 or more, carbon atoms, or a cycloalkyl group.

In formulae (ZII) and (ZIII), $R_{204}$, $R_{205}$, $R_{206}$ and $R_{207}$ each represents an aryl group, an alkyl group or a cycloalkyl group.

As the aryl group represented by $R_{204}$ to $R_{207}$, a phenyl group and a naphthyl group are preferred, and a phenyl group is more preferred.

As the alkyl group and the cycloalkyl group represented by $R_{204}$ to $R_{207}$, preferably a straight chain or branched alkyl group having from 1 to 10 carbon atoms (e.g., a methyl group, an ethyl group, a propyl group, a butyl group, and a pentyl group), and a cycloalkyl group having from 3 to 10 carbon atoms (e.g., a cyclopentyl group, a cyclohexyl group and a norbonyl group) can be exemplified.

As the substituents which $R_{204}$ to $R_{207}$ may have, an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group and a phenylthio group can be exemplified.

$X^-$ represents a non-nucleophilic anion, and the same non-nucleophilic anions as $X^-$ in formula (ZI) are exemplified.

As the preferred acid-generating agent usable in combination, the compound represented by the following formula (ZIV), (ZV) or (ZVI) can further be exemplified.

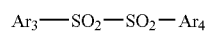

ZIV

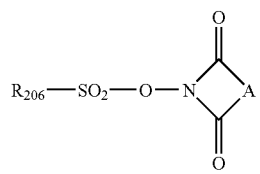

ZV

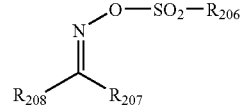

ZVI

In formulae (ZIV) to (ZVI), $Ar_3$ and $Ar_4$ each represents an aryl group.

$R_{206}$, $R_{207}$ and $R_{208}$ each represents an alkyl group, a cycloalkyl group or an aryl group.

A represents an alkylene group, an alkenylene group or an arylene group.

Of the acid-generating agents usable in combination, a compound represented by formula (ZI), (ZII) or (ZIII) is more preferred.

Further, as the acid-generating agents usable in combination, a compound generating a sulfonic acid having one sulfonic acid group is preferably used, a compound generating a monovalent perfluoroalkanesulfonic acid, and a compound generating an aromatic sulfonic acid substituted with a fluorine atom or a group containing a fluorine atom are more preferred, and a sulfonium salt of a monovalent perfluoroalkanesulfonic acid is particularly preferred.

Of the acid-generating agents usable in combination, particularly preferred examples are shown below.

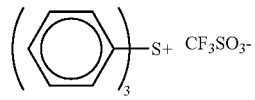

(z1)

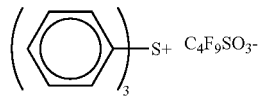

(z2)

-continued
(z3) 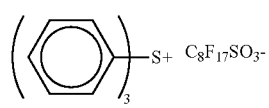
(z4) 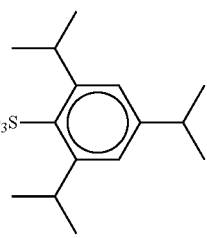
(z5) 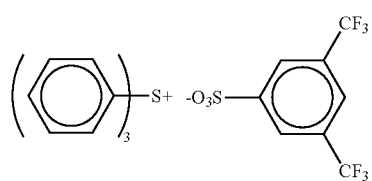
(z6) 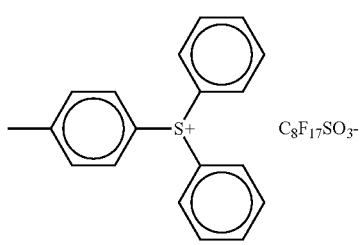
(z7) 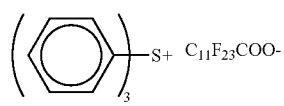
(z8) 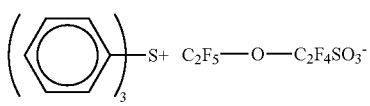
(z9) 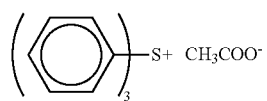
(z10) 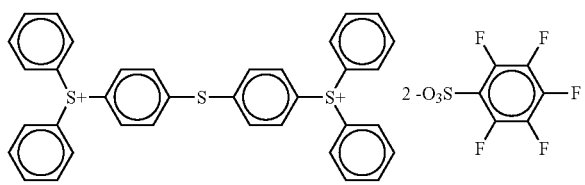
(z11) 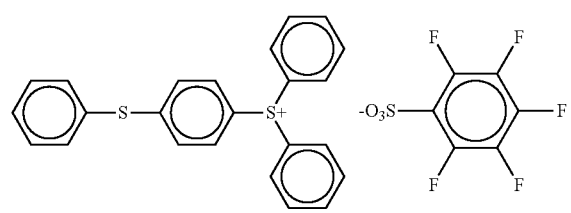
(z12) 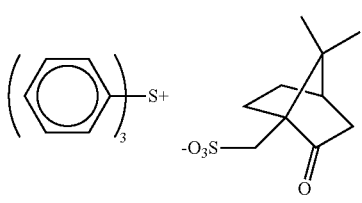
(z13) 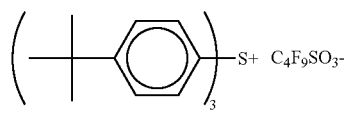
(z14) 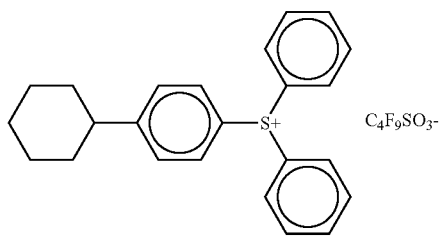
(z15) 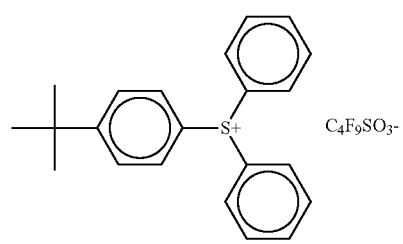
(z16) 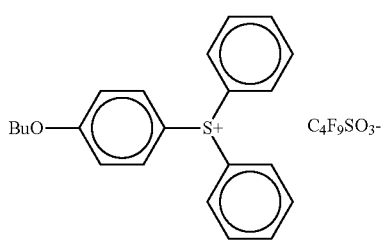

-continued
(z17) 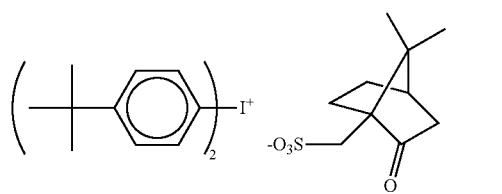 (z18)
(z19) 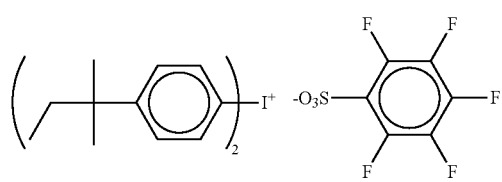 (z20)
(z21) 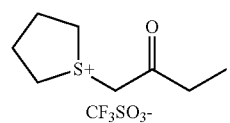 (z22)
(z23) 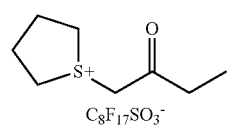 (z24)
(z25) 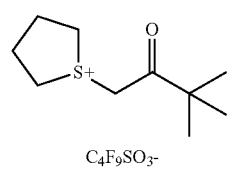 (z26)
(z27) 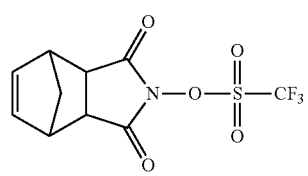 (z28)
(z29) 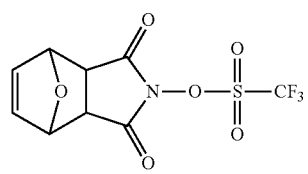 (z30)
(z31) 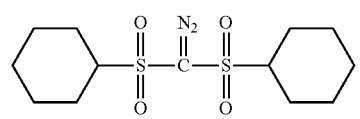 (z32)
(z33)
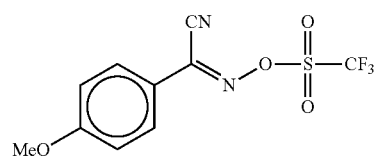

-continued
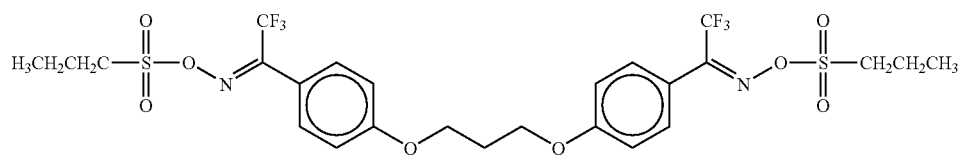
(z34)
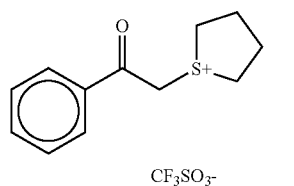
(z35)
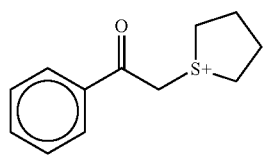
(z36)
(z37)
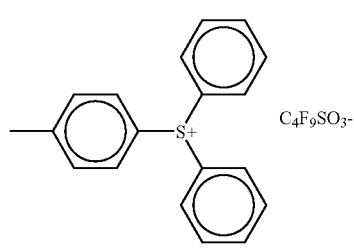
(z38)
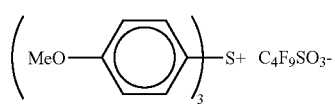
(z39)
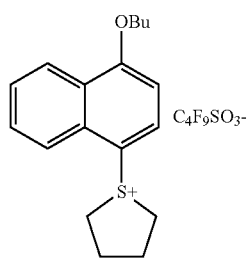
(z40)
(z41)
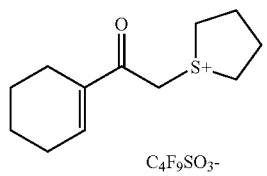
(z42)
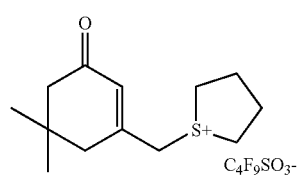
(z43)
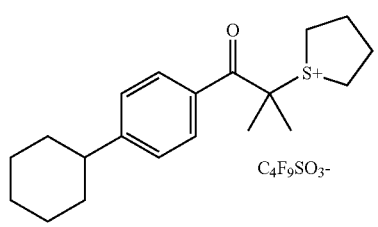
(z44)
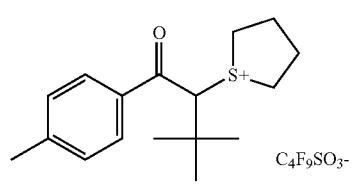
(z45)
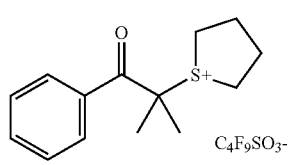
(z46)

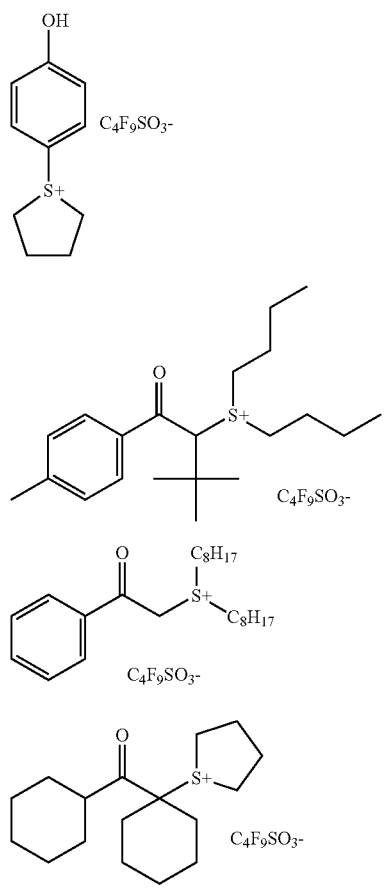

[2] (B) A Resin Capable of Decomposing by the Action of an Acid to Thereby Increase the Solubility in an Alkali Developer:

A resin capable of decomposing by the action of an acid to thereby increase the solubility in an alkali developer for use in the positive photosensitive composition of the present invention is a resin having a group capable of decomposing by the action of an acid on either the main chain or the side chain of the resin or on both the main chain and the side chain (hereinafter the group is also referred to as "acid-decomposable group"). A resin having a group capable of decomposing by the action of an acid on both chains is more preferred.

A preferred group as the group capable of decomposing by the action of an acid is a group substituted with a group capable of desorbing the hydrogen atom of a —COOH group or an —OH group with an acid.

The acid-decomposable group in the invention is an acetal group or a tertiary ester group.

The parent resins in the case where the acid-decomposable group is bonded as the side chain are alkali-soluble resins having an —OH group or a —COOH group on the side chain. For example, the later-described alkali-soluble resins can be exemplified.

The alkali dissolution rate of these alkali-soluble resins is preferably 170 Å/sec or more when measured using 0.261 N tetramethylammonium hydroxide (TMAH) at 23° C., particularly preferably 330 Å/sec or more.

From this point of view, particularly preferred alkali-soluble resins are o-, m-, p-poly(hydroxystyrene) and copolymers thereof, hydrogenated poly(hydroxystyrene), halogen- or alkyl-substituted poly(hydroxystyrene), a partially O-alkylated or O-acylated product of poly-(hydroxystyrene), styrene-hydroxystyrene copolymers, α-methylstyrene-hydroxystyrene copolymers, and alkali-soluble resins having a hydroxystyrene structural unit such as hydrogenated novolak resins.

As repeating units having a preferred acid-decomposable group, e.g., t-butoxycarbonyloxystyrene, 1-alkoxyethoxystyrene, and (meth)acrylic acid tertiary alkyl ester are exemplified, and 2-alkyl-2-adamantyl (meth)acrylate and dialkyl (1-adamantyl)methyl (meth)acrylate are more preferred.

Components (B) for use in the invention can be obtained, as disclosed in EP-254853, JP-A-2-25850, JP-A-3-223860 and JP-A-4-251259, by reacting an alkali-soluble resin with the precursor of an acid-decomposable group, or polymerizing an alkali-soluble resin monomer bonded with an acid-decomposable group with various monomers.

The specific examples of components (B) for use in the invention are shown below, but the invention is not limited thereto.

p-t-Butoxystyrene/p-hydroxystyrene copolymer,
p-(t-Butoxycarbonyloxy)styrene/p-hydroxystyrene copolymer,
p-(t-Butoxycarbonylmethyloxy)styrene/p-hydroxystyrene copolymer,
4-(t-Butoxycarbonylmethyloxy)-3-methylstyrene/4-hydroxy-3-methylstyrene copolymer,
p-(t-Butoxycarbonylmethyloxy)styrene/p-hydroxystyrene (10% hydrogenated product) copolymer, m-(t-Butoxycarbonylmethyloxy)styrene/m-hydroxystyrene copolymer,
o-(t-Butoxycarbonylmethyloxy)styrene/o-hydroxystyrene copolymer,
p-(Cumyloxycarbonylmethyloxy)styrene/p-hydroxystyrene copolymer,
Cumyl methacrylate/methyl methacrylate copolymer,
4-t-Butoxycarbonylstyrene/dimethyl maleate copolymer,
Benzyl methacrylate/tetrahydropyranyl methacrylate,
p-(t-Butoxycarbonylmethyloxy)styrene/p-hydroxystyrene/styrene copolymer,
p-t-Butoxystyrene/p-hydroxystyrene/fumaronitrile copolymer,
t-Butoxystyrene/hydroxyethyl methacrylate copolymer,
Styrene/N-(4-hydroxyphenyl)maleimide/N-(4-t-butoxy-carbonyloxyphenyl)maleimide copolymer,
p-Hydroxystyrene/t-butyl methacrylate copolymer,
Styrene/p-hydroxystyrene/t-butyl methacrylate copolymer,
p-Hydroxystyrene/t-butyl acrylate copolymer,
Styrene/p-hydroxystyrene/t-butyl acrylate copolymer,
p-(t-Butoxycarbonylmethyloxy)styrene/p-hydroxystyrene/N-methylmaleimide copolymer,
t-Butyl methacrylate/1-adamantyl methyl methacrylate copolymer,
p-Hydroxystyrene/t-butyl acrylate/p-acetoxystyrene copolymer,
p-Hydroxystyrene/t-butyl acrylate/p-(t-butoxycarbonyloxy)styrene copolymer,
p-Hydroxystyrene/t-butyl acrylate/p-(t-butoxycarbonyl-methyloxy)styrene copolymer.

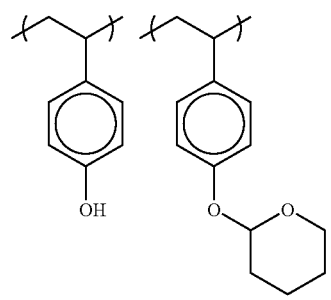
(R-1)

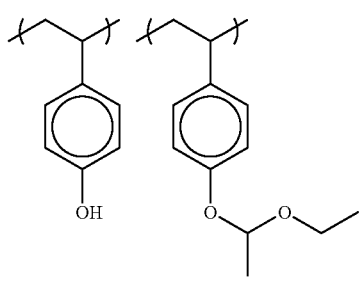
(R-2)

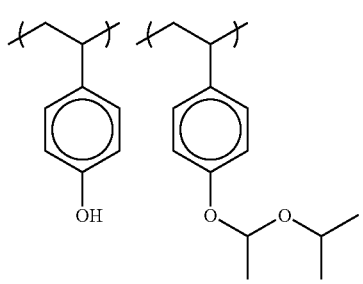
(R-3)

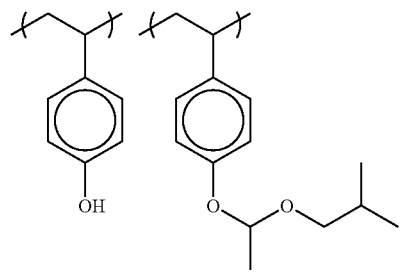
(R-4)

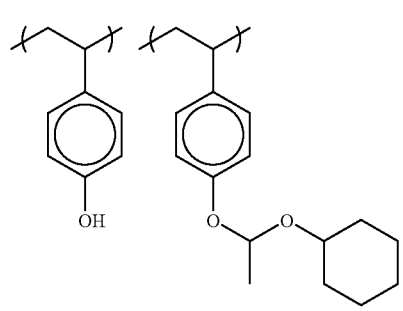
(R-5)

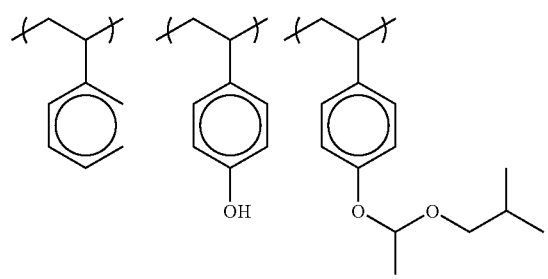
(R-6)

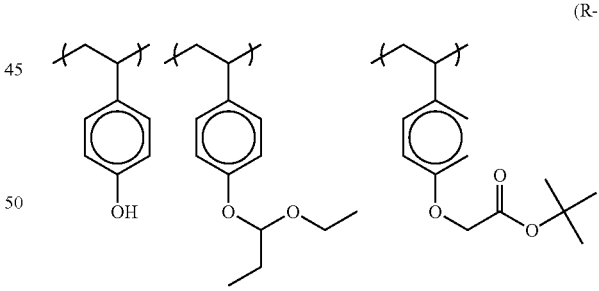
(R-7)

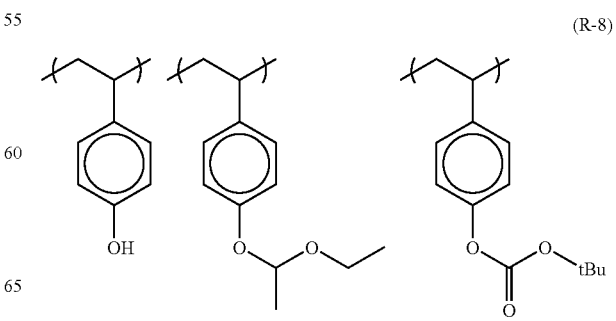
(R-8)

(R-9)
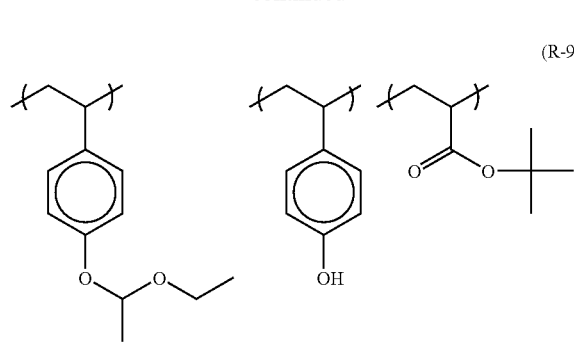
(R-10)
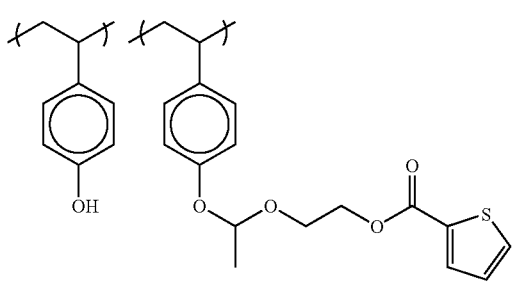
(R-11)
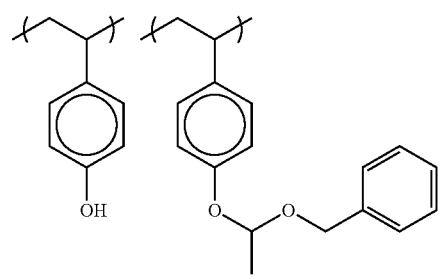
(R-12)
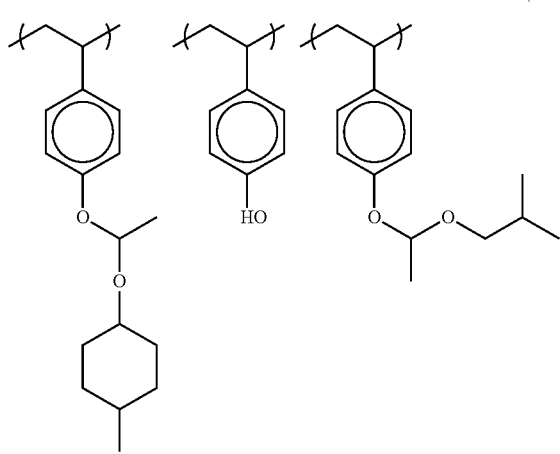
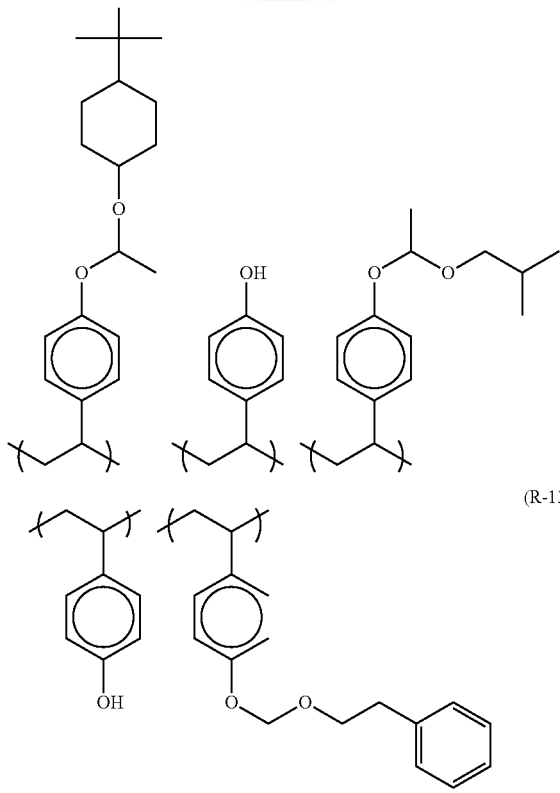
(R-13)
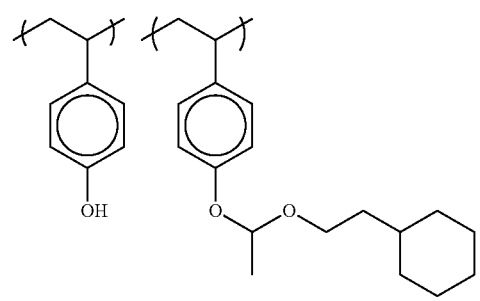
(R-14)
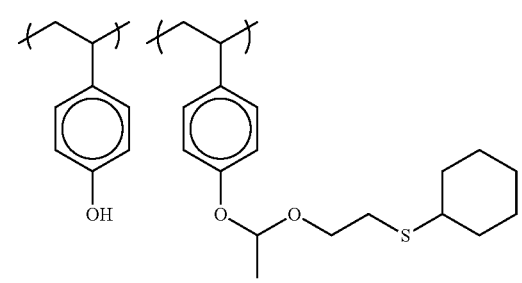
(R-15)
(r-16)
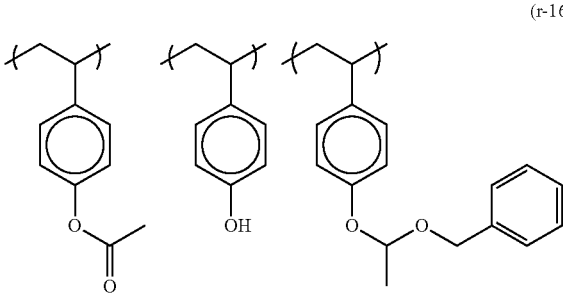

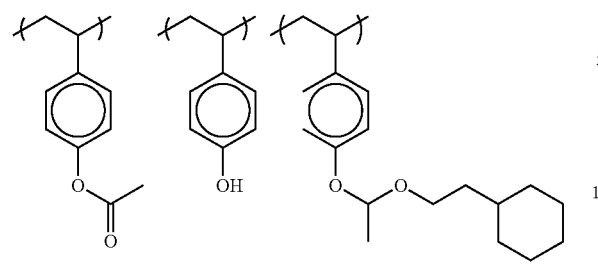
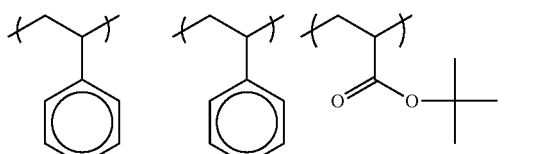
In the above specific examples, tBu means a t-butyl group.
The content of an acid-decomposable group is expressed by the equation of B/(B+S), taking the number of the acid-decomposable groups in a resin as (B), and the number of the alkali-soluble groups not protected with acid-decomposable groups as (S). The content is preferably from 0.01 to 0.7, more preferably from 0.05 to 0.50, and still more preferably from 0.05 to 0.40.

When the positive photosensitive composition in the invention is irradiated with ArF excimer laser beams, it is preferred that the resin of component (B) is a resin having a monocyclic or polycyclic alicyclic hydrocarbon structure and capable of decomposing by the action of an acid to thereby increase the solubility in an alkali developer.

As the resin having a monocyclic or polycyclic alicyclic hydrocarbon structure and capable of decomposing by the action of an acid to thereby increase the solubility in an alkali developer (hereinafter sometimes referred to as "alicyclic hydrocarbon-based acid-decomposable resin"), a resin containing at least one repeating unit selected from the group consisting of a repeating unit having a partial structure containing an alicyclic hydrocarbon represented by any of the following formulae (pI) to (pVI), and a repeating unit represented by the following formula (II-AB) is preferred.

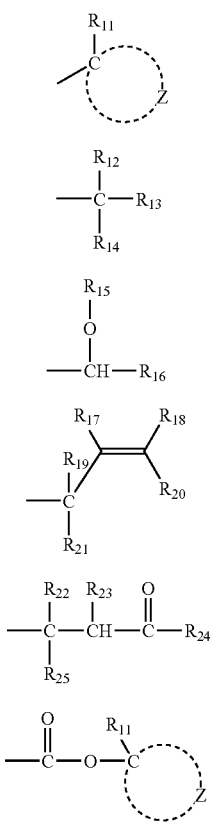

In formulae (pI) to (pVI), $R_{11}$ represents a methyl group, an ethyl group, an n-propyl group, an isopropyl group, an n-butyl group, an isobutyl group, or a sec-butyl group, and Z represents an atomic group necessary to form a cycloalkyl group together with hydrocarbons.

$R_{12}$, $R_{13}$, $R_{14}$, $R_{15}$ and $R_{16}$ each represents a straight chain or branched alkyl group having from 1 to 4 carbon atoms, or a cycloalkyl group, provided that at least one of $R_{12}$ to $R_{14}$, or either $R_{15}$ or $R_{16}$ represents a cycloalkyl group.

$R_{17}$, $R_{18}$, $R_{19}$, $R_{20}$ and $R_{21}$ each represents a hydrogen atom, a straight chain or branched alkyl group having from 1 to 4 carbon atoms or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms or a cycloalkyl group.

$R_{22}$, $R_{23}$, $R_{24}$ and $R_{25}$ each represents a hydrogen atom, a straight chain or branched alkyl group having from 1 to 4 carbon atoms or a cycloalkyl group, provided that at least one of $R_{22}$ to $R_{25}$ represents a cycloalkyl group, and $R_{23}$ and $R_{24}$ may be bonded to each other to form a ring.

In formula (II-AB), $R_{11}'$ and $R_{12}'$ each represents a hydrogen atom, a cyano group, a halogen atom or an alkyl group; and Z' contains two bonded carbon atoms (C—C) and represents an atomic group to form an alicyclic structure.

Formula (II-AB) is more preferably represented by the following formula (II-A) or (II-B).

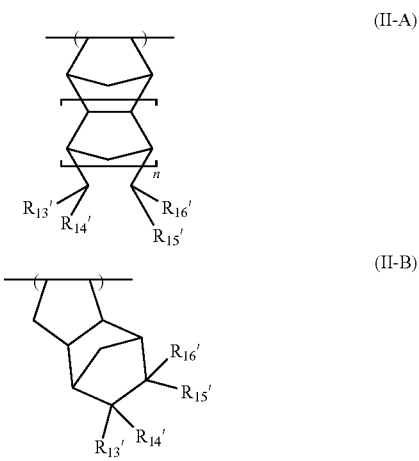

In formulae (II-A) and (II-B), $R_{13}'$, $R_{14}'$, $R_{15}'$ and $R_{16}'$ each represents a hydrogen atom, a halogen atom, a cyano group, —COOH, —COOR$_5$, a group decomposing by the action of an acid, —C(=O)—X-A'-R$_{17}'$, an alkyl group, or a cycloalkyl group; $R_5$ represents an alkyl group, a cycloalkyl group, —Y group shown below; X represents an oxygen atom, a sulfur atom, —NH—, —NHSO$_2$— or —NHSO$_2$NH—; A' represents a single bond or a divalent linking group; at least two of $R_{13}'$ to $R_{16}'$ may be bonded to form a ring; n represents 0 or 1; $R_{17}'$ represents —COOH, —COOR$_5$, —CN, a hydroxyl group, an alkoxyl group, —CO—NH—R$_6$, —CO—NH—SO$_2$—R$_6$, or —Y group shown below; and R$_6$ represents an alkyl group or a cycloalkyl group.

—Y group

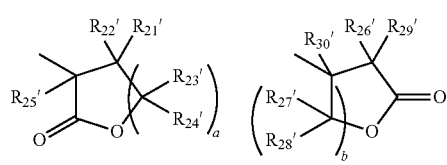

In —Y group, $R_{21}'$ to $R_{30}'$ each represents a hydrogen atom or an alkyl group; and a and b each represents 1 or 2.

In formulae (pI) to (pVI), the alkyl group represented by $R_{12}$ to $R_{25}$ is a straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of the substituents that the alkyl group and the alkoxyl group may have, an alkoxyl group having from to 4 carbon atoms, a halogen atom (e.g., a fluorine atom, a chlorine atom, a bromine atom, an iodine atom), an acyl group, an acyloxy group, a cyano group, a hydroxyl group, a carboxyl group, an alkoxycarbonyl group and a nitro group can be exemplified.

The cycloalkyl groups represented by $R_{11}$ to $R_{25}$ or formed by Z and carbon atoms may be monocyclic or polycyclic. Specifically, groups having a monocyclic, bicyclic, tricyclic or tetracyclic structure having 5 or more carbon atoms can be exemplified. The carbon atom number is preferably from 6 to 30, and particularly preferably from 7 to 25. These cycloalkyl groups may have a substituent.

As preferred cycloalkyl groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred cycloalkyl groups are an adamantyl group, a decalin residue, a norbornyl group, a cedrol group, a cyclohexyl group, a cycloheptyl group, a cyclooctyl group, a cyclodecanyl group and a cyclododecanyl group.

As the substituents of these cycloalkyl groups, an alkyl group, a halogen atom, a hydroxyl group, an alkoxyl group, a carboxyl group and an alkoxycarbonyl group can be exemplified. As the alkyl group, lower alkyl groups, e.g., a methyl group, an ethyl group, a propyl group, an isopropyl group and a butyl group are preferred, and more preferably the alkyl group is selected from the group consisting of a methyl group, an ethyl group, a propyl group and an isopropyl group. As the alkoxyl group, alkoxyl groups having from 1 to 4 carbon atoms, e.g., a methoxy group, an ethoxy group, a propoxy group and a butoxy group can be exemplified. As the substituents that these alkyl group, alkoxyl group and alkoxycarbonyl group may further have, a hydroxyl group, a halogen atom and an alkoxyl group can be exemplified.

The structures represented by formulae (pI) to (pVI) in the resin can be used for the protection of alkali-soluble groups. As the alkali-soluble groups, various groups well known in this technical field can be exemplified.

Specifically, as the alkali-soluble groups, a carboxylic acid group, a sulfonic acid group, a phenol group and a thiol group are exemplified, preferably a carboxylic acid group and a sulfonic acid group.

As the alkali-soluble groups protected with the structures represented by the above formulae (pI) to (pVI) in the above resins, the structures wherein the hydrogen atom of the carboxyl group is substituted with the structures represented by formulae (pI) to (pVI) are preferably exemplified.

As the repeating unit having the alkali-soluble group protected with the structure represented by any of the above formulae (pI) to (pVI), a repeating unit represented by the following formula (pA) is preferred.

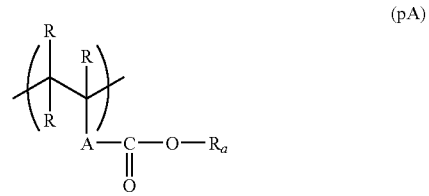

wherein R represents a hydrogen atom, a halogen atom or a straight chain or branched alkyl group having from 1 to 4 carbon atoms, and a plurality of R's may be the same or different; A represents a single group or the combination of two or more groups selected from the group consisting of a single bond, an alkylene group, an ether group, a thioether group, a carbonyl group, an ester group, an amido group, a sulfonamido group, a urethane group and a urea group; and Ra represents any group represented by the above formula (pI) to (pVI).

The most preferred repeating units represented by formula (pA) are repeating units by 2-alkyl-2-adamantyl (meth)acrylate and dialkyl(I-adamantyl)methyl (meth)acrylate.

The specific examples of the repeating units represented by formula (pA) are shown below.

(In the formulae, Rx represents H, $CH_3$ or $CF_3$)

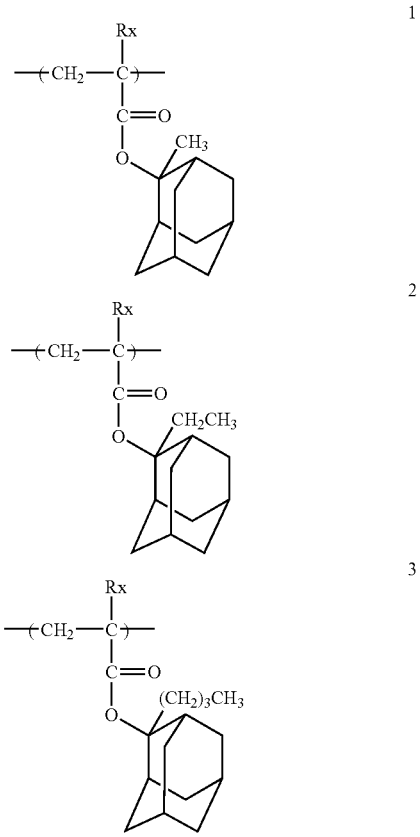

49
-continued
4
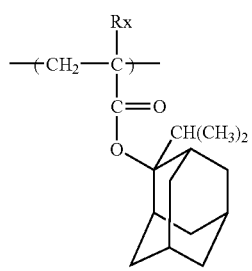
5
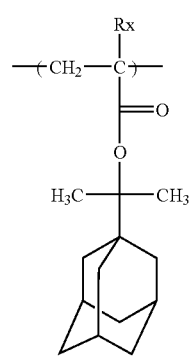
6
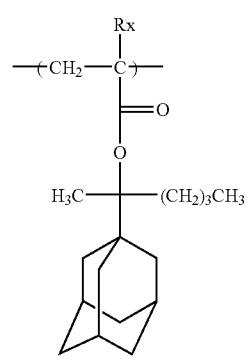
7
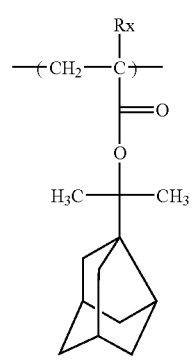
8
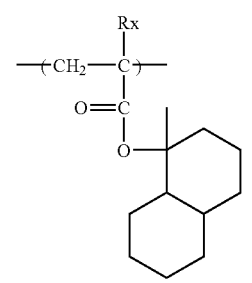
50
-continued
9
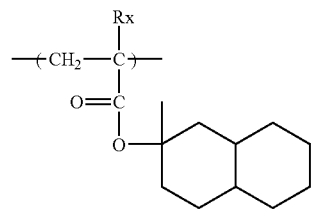
10
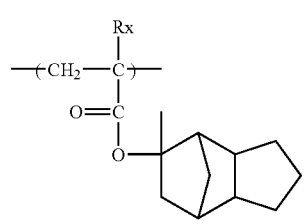
11
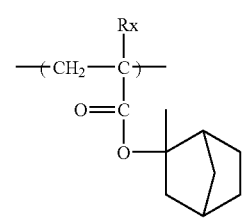
12
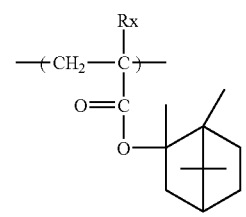
13
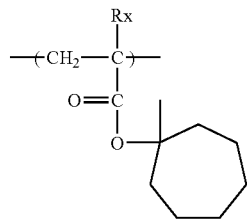
14
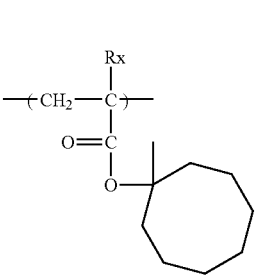
15
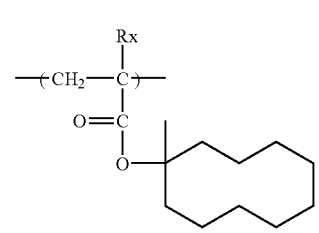

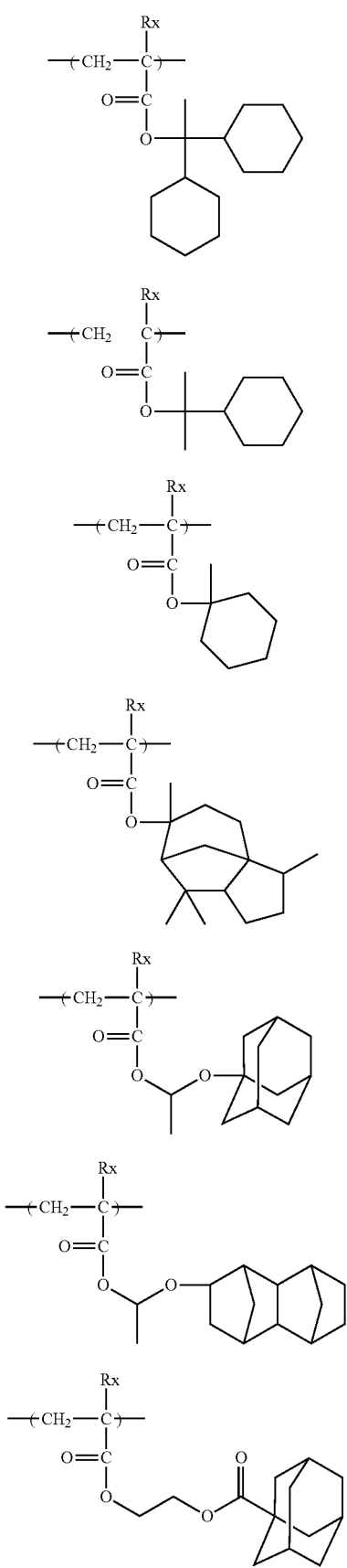

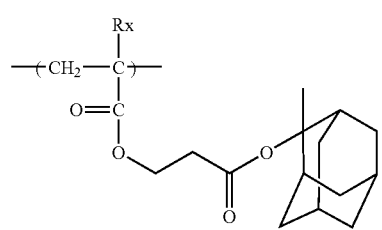

In formula (II-AB), $R_{11}'$ and $R_{12}'$ each represents a hydrogen atom, a cyano group, a halogen atom or an alkyl group; and $Z'$ contains two bonded carbon atoms (C—C) and represents an atomic group to form an alicyclic structure.

As the halogen atoms represented by $R_{11}'$ and $R_{12}'$, a chlorine atom, a bromine atom, a fluorine atom, an iodine atom can be exemplified.

As the alkyl groups represented by $R_{11}'$, $R_{12}'$, $R_{21}'$ to $R_{30}'$, straight chain or branched alkyl groups having from 1 to 10 carbon atoms are preferred, straight chain or branched alkyl groups having from 1 to 6 carbon atoms are more preferred, and a methyl group, an ethyl group, a propyl group, an isopropyl group, an n-butyl group, an isobutyl group, a sec-butyl group and a t-butyl group are still more preferred.

As further substituents of the alkoxyl group, a hydroxyl group, a halogen atom, a carboxyl group, an alkoxyl group, an acyl group, a cyano group and an acyloxy group can be exemplified. As the halogen atom, a chlorine atom, a bromine atom, a fluorine atom, an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The atomic group to form an alicyclic structure represented by $Z'$ is an atomic group to form an alicyclic hydrocarbon repeating unit which may have a substituent to a resin, and an atomic group to form a bridged alicyclic structure to form a repeating unit having bridged alicyclic hydrocarbon is preferred above all.

As the alicyclic hydrocarbon skeletons formed, the same as the alicyclic hydrocarbon groups represented by $R_{11}$ to $R_{25}$ in formulae (pI) to (pVI) are exemplified.

The alicyclic hydrocarbon skeletons may have a substituent. As the substituents, those described in $R_{13}'$ to $R_{16}'$ in formula (II-A) or (II-B) can be exemplified.

Of the repeating units having bridged alicyclic hydrocarbon, a repeating unit represented by formula (II-A) or (II-B) is more preferred.

In the alicyclic hydrocarbon-based acid-decomposable resin in the invention, the acid-decomposable group may be contained in the above-described —C(=O)—X-A'—$R_{17}'$, or may be contained as the substituent of $Z'$ in formula (II-AB).

The structure of the acid-decomposable is represented by formula —C(=O)—$X_1$—$R_0$.

In the formula, $R_0$ represents a tertiary alkyl group, e.g., a t-butyl group or a t-amyl group, a 1-alkoxyethyl group, e.g., an isoboronyl group, a 1-ethoxyethyl group, a 1-butoxyethyl group, a 1-isobutoxyethyl group, or a 1-cyclohexyloxyethyl group, an alkoxymethyl group, e.g., a 1-methoxymethyl group or a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl- 2-adamantyl group, or a mevalonic lactone residue; and $X_1$ has the same meaning as X as described above.

As the halogen atoms represented by $R_{13}'$ to $R_{16}'$, a chlorine atom, a bromine atom, a fluorine atom and an iodine atom can be exemplified.

As the alkyl groups represented by $R_5$, $R_6$, $R_{13}'$ to $R_{16}'$, a straight chain or branched alkyl group having from 1 to 10 carbon atoms is preferred, a straight chain or branched alkyl group having from 1 to 6 carbon atoms is more preferred, and a methyl group, an ethyl group, a propyl group, an isopropyl group, an n-butyl group, an isobutyl group, a sec-butyl group and a t-butyl group are still more preferred.

The cycloalkyl groups represented by $R_5$, $R_6$, $R_{13}'$ to $R_{16}'$ are, e.g., monocyclic alkyl groups and bridged hydrocarbons, and a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group, and a tetracyclododecanyl group can be exemplified.

As the rings formed by the bonding of at least two of $R_{13}'$ and $R_{16}'$, rings having from 5 to 12 carbon atoms, e.g., cyclopentene, cyclohexene, cycloheptane and cyclooctane can be exemplified.

As the alkoxyl group represented by $R_{17}'$, an alkoxyl group having from 1 to 4 carbon atoms, e.g., a methoxy group, an ethoxy group, a propoxy group or a butoxy group can be exemplified.

As further substituents of the alkyl, cycloalkyl and alkoxyl groups, a hydroxyl group, a halogen atom, a carboxyl group, an alkoxyl group, an acyl group, a cyano group, an acyloxy group, an alkyl group, and a cycloalkyl group can be exemplified. As the halogen atom, a chlorine atom, a bromine atom, a fluorine atom, an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The alkyls group and cyclic hydrocarbon groups are the same as those described above.

As the divalent linking group represented by A', represents a single group or the combination of two or more groups selected from the group consisting of an alkylene group, an ether group, a thioether group, a carbonyl group, an ester group, an amido group, a sulfonamido group, a urethane group and a urea group.

In the alicyclic hydrocarbon-based acid-decomposable resin in the invention, a group capable of decomposing by the action of an acid can be contained in at least one repeating unit of a repeating unit having a partial structure containing alicyclic hydrocarbon represented by formula (pI), (pII), (pIII) or (pIV), a repeating unit represented by formula (II-AB), and a repeating unit of copolymer component described later.

Various substituents of $R_{13}'$ to $R_{16}'$ in formula (II-A) or (II-B) can also be used as the substituents of the atomic group to form an alicyclic structure in formula (II-AB), or atomic group Z to form a bridged alicyclic structure.

The specific examples of the repeating units represented by formula (II-A) or (II-B) are shown below, but the invention is not limited thereto.

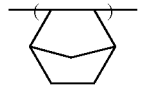 [II-1]

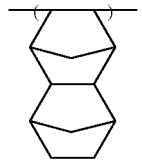 [II-2]

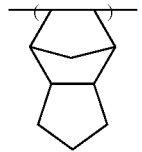 [II-3]

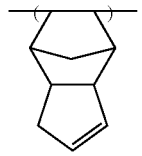 [II-4]

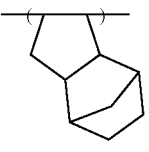 [II-5]

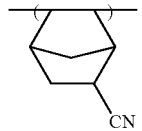 [II-6]

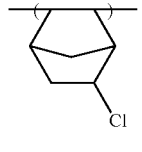 [II-7]

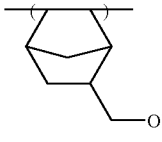 [II-8]

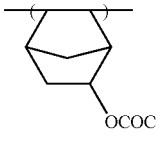 [II-9]

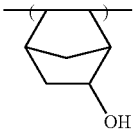 [II-10]

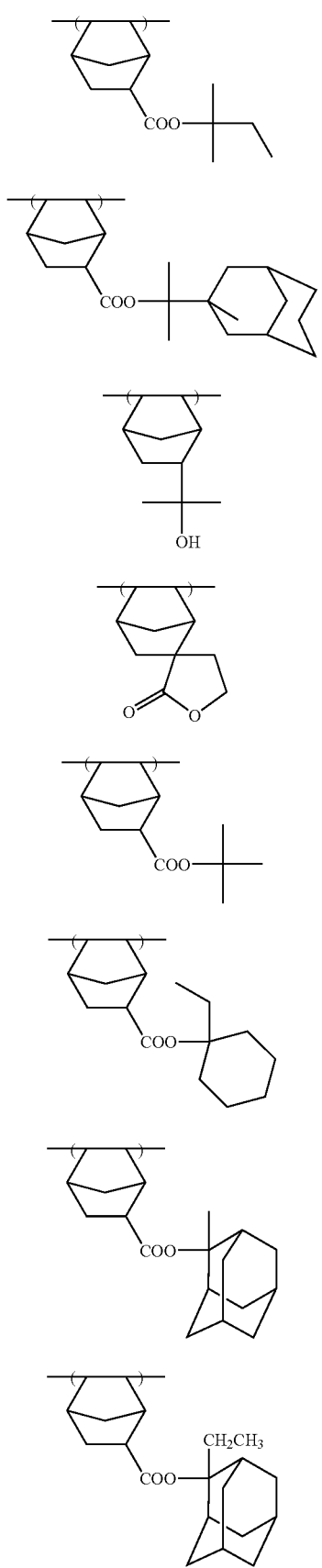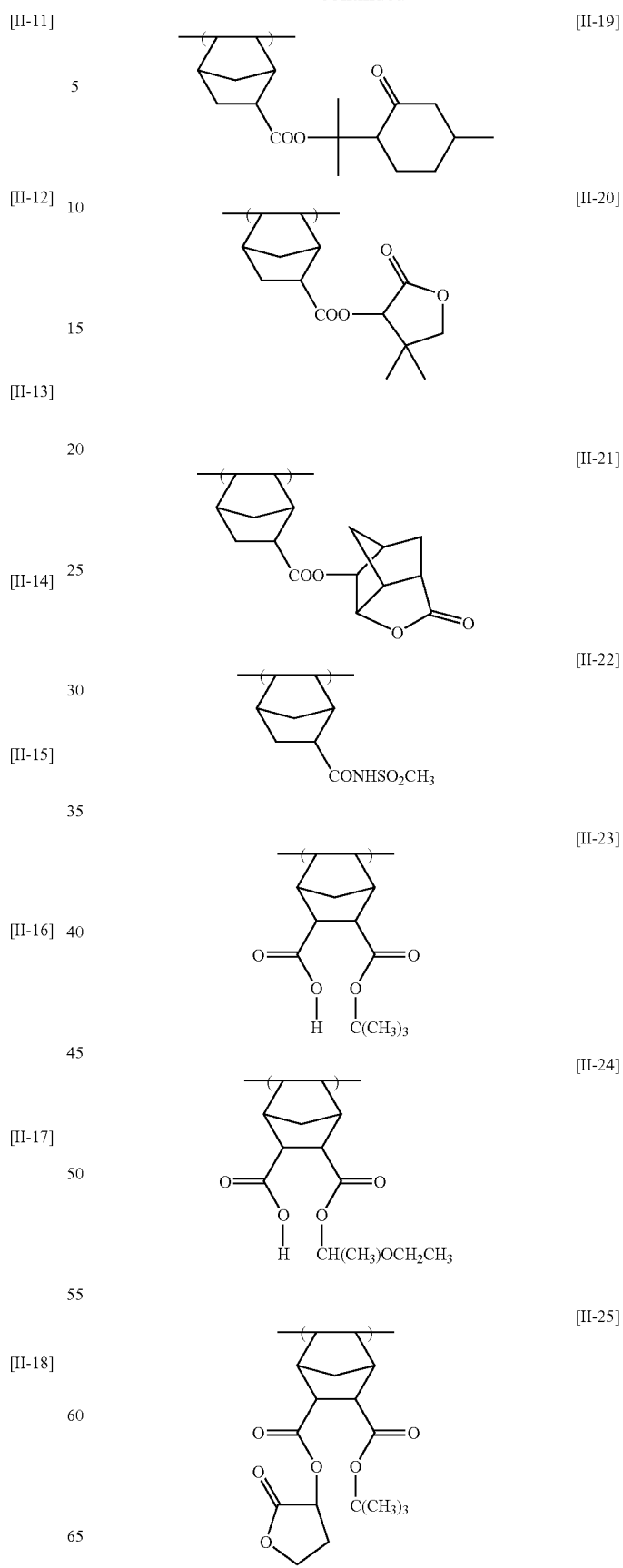

[II-26] 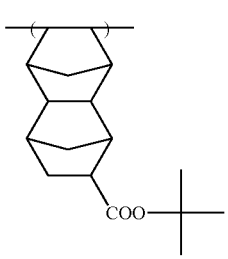

[II-27] 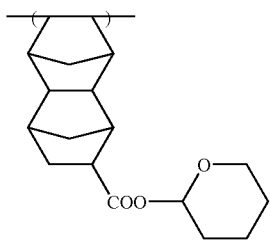

[II-28] 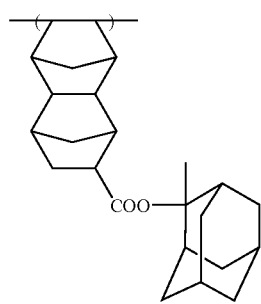

[II-29] 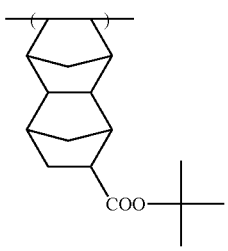

[II-30] 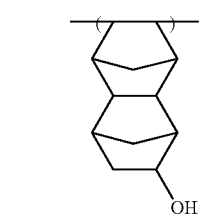

[II-31] 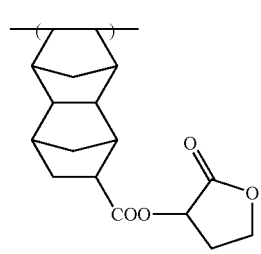

[II-32] 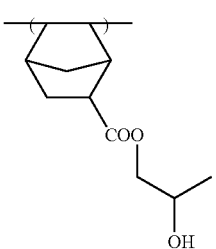

The alicyclic hydrocarbon-based acid-decomposable resin in the invention preferably has a lactone structure, more preferably has a repeating unit having a group having a lactone structure represented by the following formula (Lc) or any of formulae (V-1) to (V-5). Further, a group having a lactone structure may be directly bonded to the main chain.

(Lc)

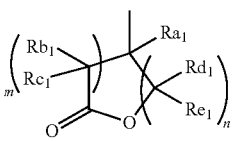

(v-1)

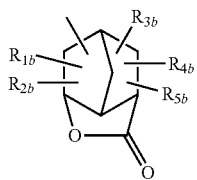

(v-2)

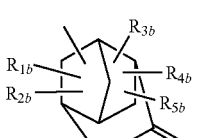

(v-3)

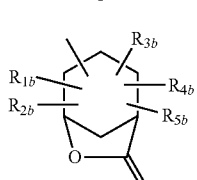

(v-4)

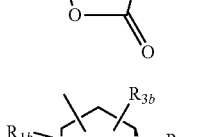

(v-5)

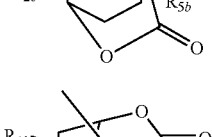

In formula (Lc), $Ra_1$, $Rb_1$, $Rc_1$, $Rd_1$ and $Re_1$ each represents a hydrogen atom or an alkyl group; m and n each represents an integer of from 0 to 3, and m+n is from 2 to 6.

In formulae (V-1) to (V-5), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkylsulfonyl-imino group or an alkenyl group. Two of $R_{1b}$ to $R_{5b}$ may be bonded to form a ring.

As the alkyl groups represented by $Ra_1$ to $Re_1$ in formula (Lc), and the alkyl groups in the alkyl groups, alkoxyl groups, alkoxycarbonyl groups and alkylsulfonylimino groups represented by $R_{1b}$ to $R_{5b}$ in formulae (V-1) to (V-5), straight chain or branched alkyl groups are exemplified, and these alkyl groups may have a substituent. As the preferred substituents, a hydroxyl group, a halogen atom, a carboxyl group, an alkoxyl group, an acyl group, a cyano group, an acyloxy group and a cycloalkyl group can be exemplified.

As the repeating units having a group having a lactone structure represented by formula (Lc) or any of formulae (V-1) to (V-5), a repeating unit in which at least one of $R_{13}'$ to $R_{16}'$ in formula (II-A) or (II-B) has a group represented by formula (Lc) or any of formulae (V-1) to (V-5) (for example, $R_5$ in —$COOR_5$ represents a group represented by formula (Lc) or any of formulae (V-1) to (V-5)), or a repeating unit represented by the following formula (AI) can be exemplified.

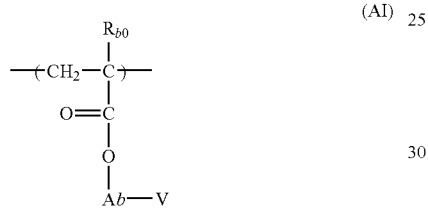

(AI)

In formula (AI), $R_{b0}$ represents a hydrogen atom, a halogen atom, or an alkyl group having from 1 to 4 carbon atoms. As the preferred substituents that the alkyl group represented by $R_{b0}$ may have, those described above as the preferred substituents that the alkyl group represented by $R_{1b}$ in formulae (V-1) to (V-5) may have can be exemplified.

As the halogen atom represented by $R_{b0}$, a fluorine atom, a chlorine atom, a bromine atom and an iodine atom can be exemplified. $R_{b0}$ preferably represents a hydrogen atom.

$A_b$ represents a single bond, an ether group, an ester group, a carbonyl group, an alkylene group, or a divalent linking group combining these groups.

V represents a group represented by formula (Lc) or any of formulae (V-1) to (V-5).

The specific examples of repeating units having a group having a lactone structure are shown below, but the invention is not limited thereto.

(In the formulae, Rx represents H, $CH_3$ or $CF_3$)

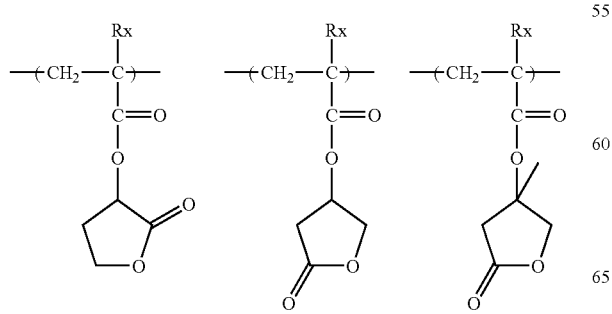

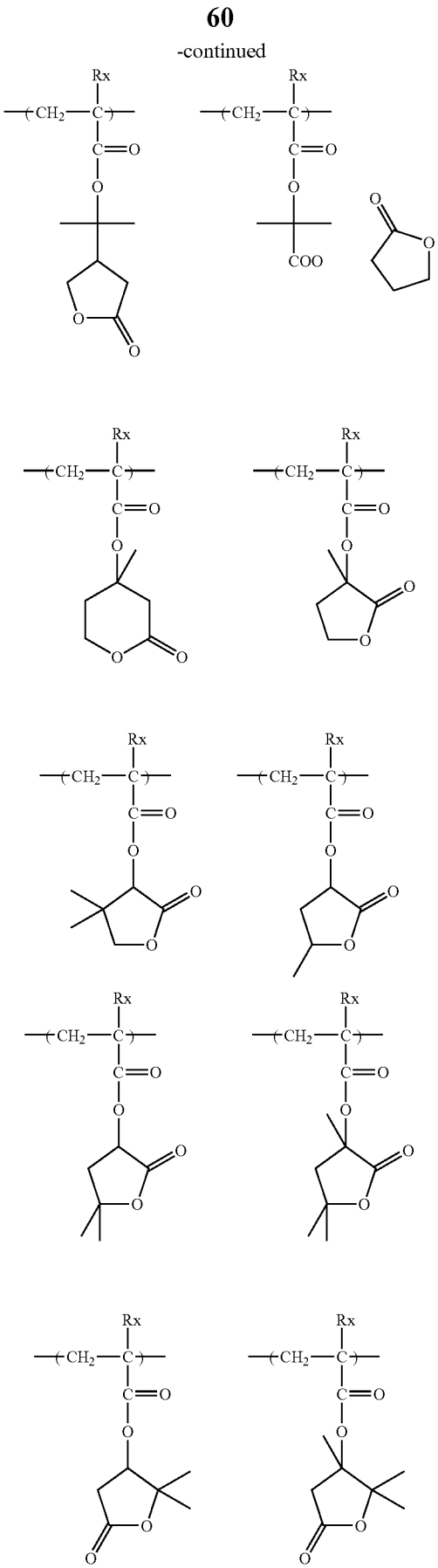

61
-continued
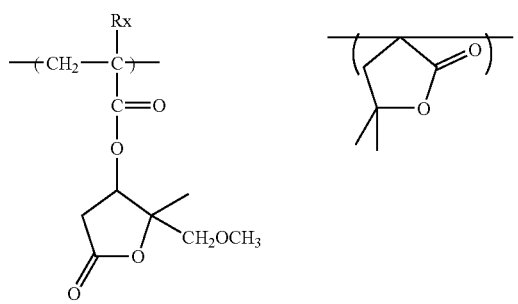
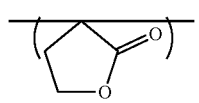
(In the formulae, Rx represents H, CH₃ or CF₃)
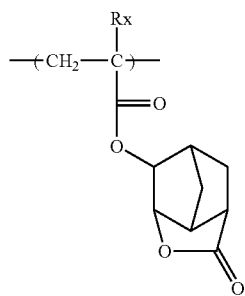 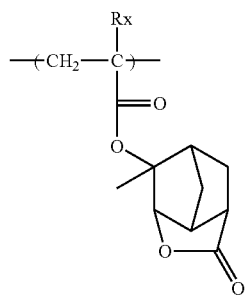
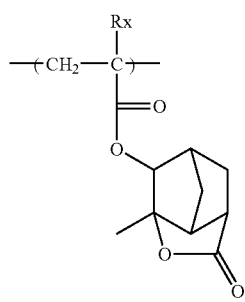 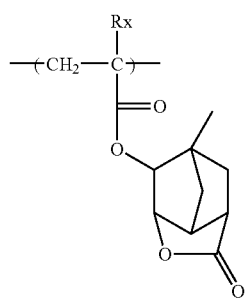
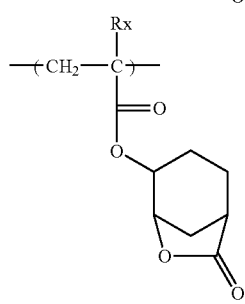 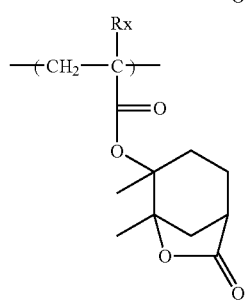
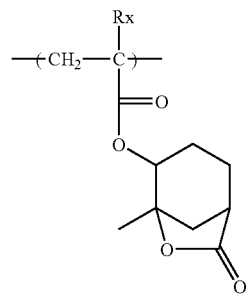
62
-continued
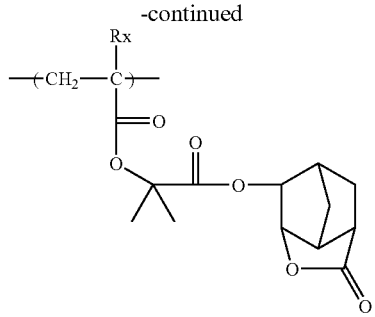
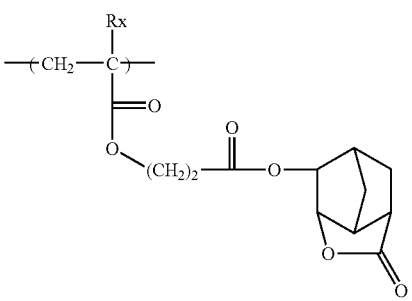
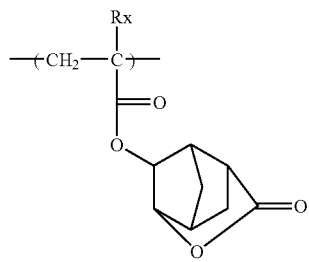
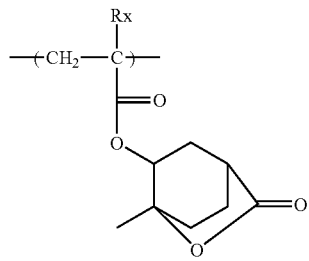
(In the formulae, Rx represents H, CH₃ or CF₃)
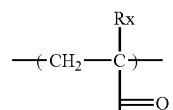
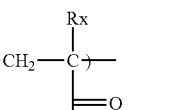
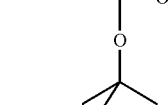
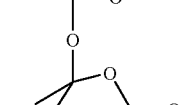
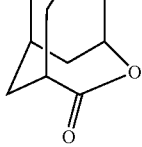

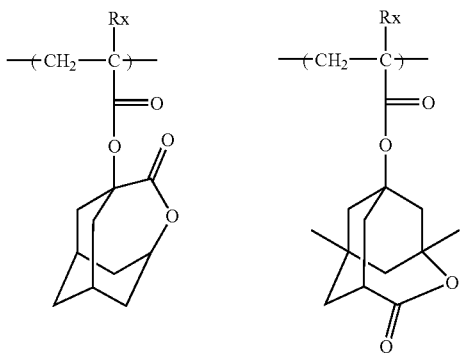
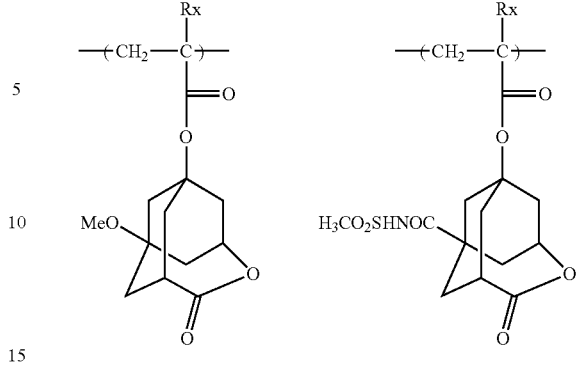
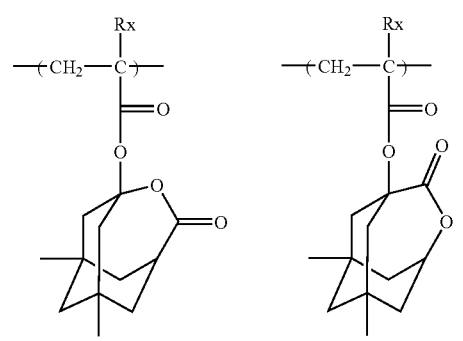
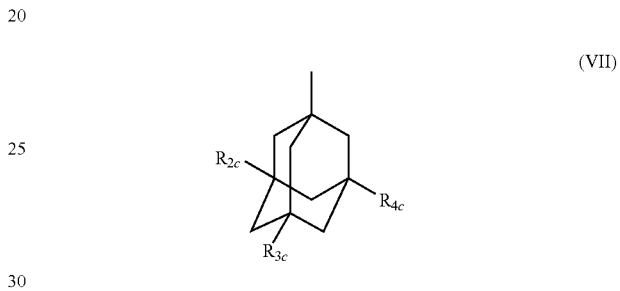

The alicyclic hydrocarbon-based acid-decomposable resin in the invention may contain a repeating unit having an adamantane skeleton represented by the following formula (VII).

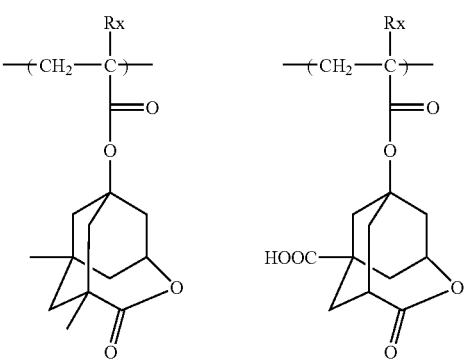

(VII)

In formula (VII), $R_{2c}$, $R_{3c}$ and $R_{4c}$ each represents a hydrogen atom or a hydroxyl group, provided that at least one of $R_{2c}$, $R_{3c}$ and $R_{4c}$ represents a hydroxyl group.

The group represented by formula (VII) is preferably a dihydroxy body or a monohydroxy body, more preferably a dihydroxy body.

As the repeating unit having a group represented by formula (VII), a repeating unit in which at least one of $R_{13}'$ to $R_{16}'$ in formula (II-A) or (II-B) has a group represented by formula (VII) (for example, $R_5$ in —COOR$_5$ represents a group represented by formula (VII)), or a repeating unit represented by the following formula (AII) can be exemplified.

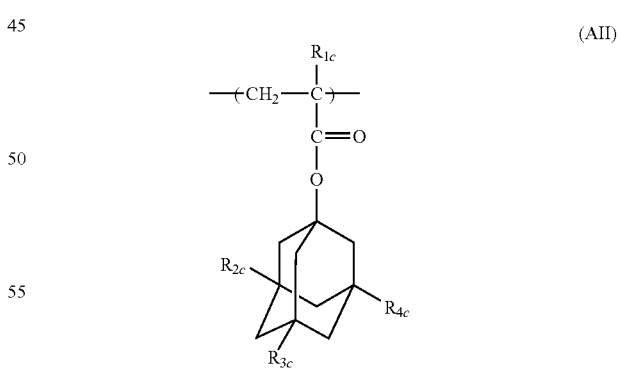

(AII)

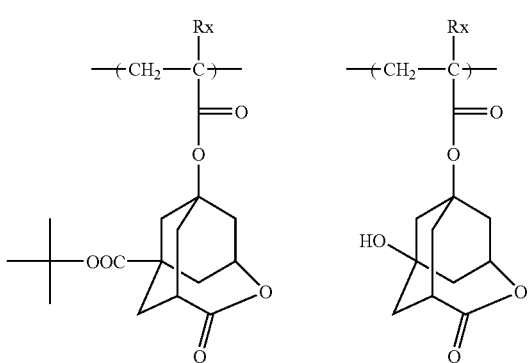

In formula (AII), $R_{1c}$ represents a hydrogen atom or a methyl group; and $R_{2c}$, $R_{1c}$ and $R_{4c}$ each represents a hydrogen atom or a hydroxyl group, provided that at least one of $R_{2c}$, $R_{1c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not limited thereto.

(1)

[Structure 1: -CH₂-CH- with C(=O)-O- linked to adamantane bearing two OH groups]

(2)

[Structure 2: -CH₂-CH- with C(=O)-O- linked to adamantane bearing OH]

(3)

[Structure 3: -CH₂-C(CH₃)- with C(=O)-O- linked to adamantane bearing OH groups]

(4)

[Structure 4: -CH₂-C(CH₃)- with C(=O)-O- linked to adamantane bearing OH]

The alicyclic hydrocarbon-based acid-decomposable resin in the invention may contain a repeating unit represented by the following formula (VIII).

$$\begin{array}{c}\text{—CH—CH—}\\ \diagup\quad\diagdown\\ O=C\quad C=O\\ \diagdown Z_2 \diagup\end{array}\quad\text{(VIII)}$$

In formula (VIII), $Z_2$ represents —O— or —N($R_{41}$)—; $R_{41}$ represents a hydrogen atom, a hydroxyl group, an alkyl group or —OSO₂—$R_{42}$; and $R_{42}$ represents an alkyl group, a cycloalkyl group, or a camphor residue. The alkyl group represented by $R_{41}$ and $R_{42}$ may be substituted with a halogen atom (preferably a fluorine atom), etc.

The specific examples of the repeating units represented by formula (VIII) are shown below, but the invention is not limited thereto.

[Six maleic anhydride/maleimide-type repeating unit structures shown: with O, NH, N-OH, N-CH₃, N-CF₃, N-O-SO₂-CF₃]

-continued

[Additional structure with N-O-SO₂-camphor residue]

It is preferred for the alicyclic hydrocarbon-based acid-decomposable resin in the invention to have a repeating unit having an alkali-soluble group, and more preferred to have a repeating unit having a carboxyl group, by containing this repeating unit, the resolution in contact hole use increases. a repeating unit in which a carboxyl group is directly bonded to the main chain of a resin, such as a repeating unit by an acrylic acid or a methacrylic acid, and a repeating unit in which a carboxyl group is bonded to the main chain of a resin via a linking group are preferred as the repeating unit having a carboxyl group, and the linking group may have either a monocyclic or polycyclic hydrocarbon structure. A repeating unit by acrylic acid or methacrylic acid is most preferred.

The alicyclic hydrocarbon-based acid-decomposable resin in the invention may contain various repeating structural units besides the above repeating units for the purpose of adjusting dry etching resistance, standard developer aptitude, adhesion to a substrate, resist profile, and in addition to these, general requisite characteristics of resists, e.g., resolution, heat resistance and sensitivity.

As these repeating structural units, the repeating structural units corresponding to monomers shown below can be exemplified, but the invention is not limited thereto.

By containing various kinds of repeating structural units, fine adjustment of performances required of the alicyclic hydrocarbon-based acid-decomposable resins, in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the alicyclic hydrocarbon-based acid-decomposable resins, the molar ratio of the content of each repeating structural unit is arbitrarily selected to adjust dry etching resistance, standard developer aptitude, adhesion to the substrates of resists, and resist profile, in addition to these, to adjust general requisite characteristics of resists, e.g., resolution, heat resistance and sensitivity.

The preferred modes of the alicyclic hydrocarbon-based acid-decomposable resins in the invention include the following.

(1) Resins containing a repeating unit having a partial structure containing the alicyclic hydrocarbon represented by any of formulae (pI) to (pVI) (a side chain type).

(2) Resins containing a repeating unit represented by formula (II-AB) (a main chain type), and the following mode is further exemplified in (2).
(3) Resins containing a repeating unit represented by formula (II-AB), a maleic anhydride derivative and a (meth)acrylate structure (a hybrid type).

In the alicyclic hydrocarbon-based acid-decomposable resins, the content of a repeating unit having an acid decomposable group is preferably from 10 to 60 mol % in all the repeating structural units, more preferably from 20 to 50 mol %, and still more preferably from 25 to 40 mol %.

In the alicyclic hydrocarbon-based acid-decomposable resins, the content of a repeating unit having a partial structure containing alicyclic hydrocarbon represented by any of formulae (pI) to (pVI) is preferably from 30 to 70 mol % in all the repeating structural units, more preferably from 35 to 65 mol %, and still more preferably from 40 to 60 mol %.

In the alicyclic hydrocarbon-based acid-decomposable resins, the content of a repeating unit represented by formula (II-AB) is preferably from 10 to 60 mol % in all the repeating structural units, more preferably from 15 to 55 mol %, and still more preferably from 20 to 50 mol %.

The content of repeating structural units on the basis of the monomers of the further copolymer components in the resin can also be optionally set according to the desired resist performances, and the content is generally preferably 99 mol % or less based on the total mol number of a repeating structural unit having a partial structure containing alicyclic hydrocarbon represented by any of formulae (pI) to (pVI) and a repeating unit represented by formula (II-AB), more preferably 90 mol % or less, and still more preferably 80 mol % or less.

When the photosensitive composition according to the invention is a composition for ArF exposure, it is preferred that the resin should not contain an aromatic group from the point of the transparency to ArF light.

The alicyclic hydrocarbon-based acid-decomposable resins for use in the invention can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent such as ethers, e.g., tetrahydrofuran, 1,4-dioxane or diisopropyl ether, ketones, e.g., methyl ethyl ketone or methyl isobutyl ketone, an ester solvent, e.g., ethyl acetate, or the later-described solvents capable of dissolving the composition of the invention, e.g., propylene glycol monomethyl ether acetate to make the monomer homogeneous. The solution is then heated, if necessary, under the inert gas atmosphere such as nitrogen or argon, and polymerization is initiated with commercially available radical polymerization initiator (e.g., azo initiators, peroxide and the like). If necessary, the initiator is further added at a time or in parts, and after completion of the reaction, the reaction system is put into a solvent, and the desired polymer is recovered as powder or solid. The reaction concentration is 20 mass % or more, preferably 30 mass % or more, and more preferably 40 mass % or more. The reaction temperature is from 10 to 150° C., preferably from 30 to 120° C., and more preferably from 50 to 100° C.

When the photosensitive composition according to the invention is used in the upper layer resist of a multilayer resist, it is preferred that the resin of component (B) should have a silicon atom.

As resins having a silicon atom and capable of decomposing by the action of an acid to thereby increase the solubility in an alkali developer, resins having a silicon atom at least on one side of the main chain and the side chain can be used. As resins having a siloxane structure on the side chain of the resins, e.g., an olefin monomer having a silicon atom on the side chain, and the copolymer of a (meth)acrylic acid monomer having maleic anhydride and an acid decomposable group on the side chains.

As resins having a silicon atom, resins having a trialkylsilyl structure and a monocyclic or polycyclic siloxane structure are preferred, resins having repeating units having the structures represented by the following formulae (SS-1) to (SS-4) are more preferred, and (meth)acrylic ester series repeating units, vinyl series repeating units and allyl series repeating units having the structures represented by formulae (SS-1) to (SS-4) are still more preferred.

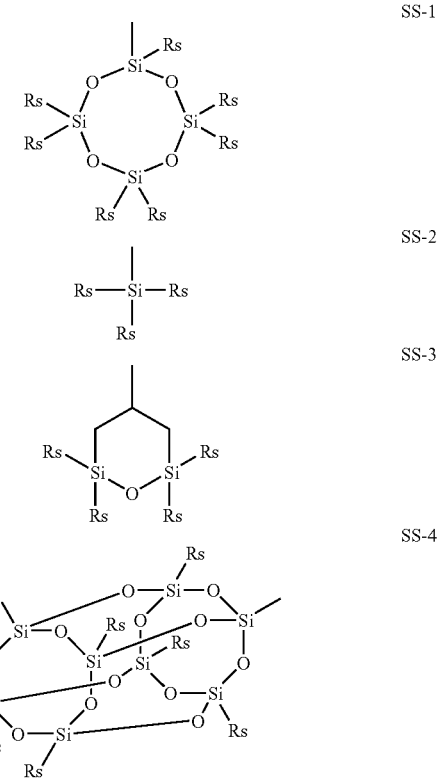

In formulae (SS-1) to (SS-4), Rs represents an alkyl group having from 1 to 5 carbon atoms, preferably a methyl group or a methyl group.

It is preferred that resins having a silicon atom have two or more different repeating units having silicon atoms, resins having both (Sa) repeating unit having from 1 to 4 silicon atoms and (Sb) repeating unit having from 5 to 10 silicon atoms are more preferred, and resins having at least one repeating unit having a structure represented by any of formulae (SS-1) to (SS-3) and a repeating unit having a structure represented by formula (SS-4) are still more preferred.

When the positive photosensitive composition of the invention is irradiated with $F_2$ excimer laser rays, the resin of component (B) is preferably a resin having a structure wherein fluorine atoms are substituted on the main chain of the polymer skeleton and/or the side chain and capable of decomposing by the action of an acid to thereby increase the solubility in an alkali developer (hereinafter also referred to as "a fluorine group-containing resin), the resin is more preferably a resin containing a hydroxyl group the 1-position of which is substituted with a fluorine atom or a fluoroalkyl group, or containing a hydroxyl group the 1-position of which is substituted with a fluorine atom or a fluoroalkyl group that is protected with an acid-decomposable group. The most preferred resin is a resin having a hexafluoro-2-propanol structure or the structure of protecting the hydroxyl group of a hexafluoro-2-propanol with an acid-decomposable group. By the incorporation of fluorine atoms, the transparency to the far ultraviolet rays, in particular $F_2$ light (157 nm) can be improved.

As the fluorine-containing resins in acid-decomposable resin (B), the resins containing at least one repeating unit represented by any of the following formulae (FA) to (FG) are preferably exemplified.

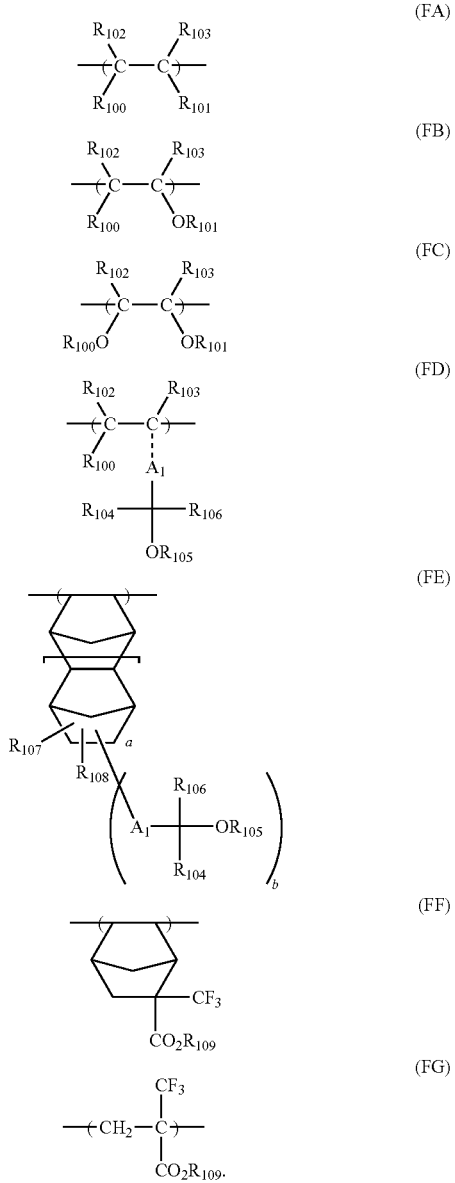

In the above formulae, $R_{100}$, $R_{102}$ and $R_{103}$ each represents a hydrogen atom, a fluorine atom, an alkyl group or an aryl group.

$R_{104}$ and $R_{106}$ each represents a hydrogen atom, a fluorine atom or an alkyl group, and at least one of $R_{104}$ and $R_{106}$ represents a fluorine atom or a fluoroalkyl group. Preferably both $R_{104}$ and $R_{106}$ represent a trifluoromethyl group.

$R_{105}$ represents an alkyl group, a cycloalkyl group, an acyl group, an alkoxycarbonyl group, or a group capable of decomposing by the action of an acid.

$A_1$ represents a single bond, a divalent linking group, e.g., a straight, branched or cyclic alkylene group, alkenylene group, arylene group, —COO—, —COO—, —CON($R_{24}$)—, or a linking group containing a plurality of these groups. $R_{24}$ represents a hydrogen atom or an alkyl group.

$R_{107}$ and $R_{108}$ each represents a hydrogen atom, a halogen atom, an alkyl group, an alkoxyl group, an alkoxycarbonyl group, or a group capable of decomposing by the action of an acid.

$R_{109}$ represents a hydrogen atom, an alkyl group, a cycloalkyl group, or a group capable of decomposing by the action of an acid.

b represents 0, 1 or 2.

Further, $R_{100}$ and $R_{101}$ in formulae (FA) and (FC) may form a ring through an alkylene group (having from 1 to 5 carbon atoms) which may be substituted with a fluorine atom.

The repeating units represented by formulae (FA) to (FG) contain at least 1, preferably 3 or more, fluorine atoms per one repeating unit.

In formulae (FA) to (FG), the alkyl group is an alkyl group having from 1 to 8 carbon atoms, specifically, a methyl group, an ethyl group, a propyl group, an n-butyl group, a sec-butyl group, a hexyl group, a 2-ethylhexyl group, and an octyl group are preferably exemplified.

The cycloalkyl group may be monocyclic or polycyclic. As the monocyclic groups, preferably those having from 3 to 8 carbon atoms, e.g., a cyclopropyl group, a cyclopentyl group, a cyclohexyl group, a cycloheptyl group and a cyclooctyl group can be exemplified. As the polycyclic groups, preferably those having from 6 to 20 carbon atoms, e.g., an adamantyl group, a norbornyl group, an isoboronyl group, a camphonyl group, a dicyclopentyl group, an α-pinel group, a tricyclodecanyl group, a tetracyclododecyl group and an androstanyl group can be exemplified. However, the carbon atoms in the monocyclic or polycyclic cycloalkyl groups may be substituted with hetero atoms such as an oxygen atom, etc.

The fluoroalkyl group is preferably, e.g., a fluoroalkyl group having from 1 to 12 carbon atoms, specifically a trifluoromethyl group, a perfluoroethyl group, a perfluoro-propyl group, a perfluorobutyl group, a perfluorohexyl group, a perfluorooctyl group, a perfluorooctylethyl group, and a perfluorododecyl group can be exemplified.

As the aryl group, an aryl group having from 6 to 15 carbon atoms, specifically a phenyl group, a tolyl group, a dimethylphenyl group, a 2,4,6-trimethylphenyl group, a naphthyl group, an anthryl group and a 9,10-dimethoxyanthryl group can be preferably exemplified.

As the alkoxyl group, e.g., an alkoxyl group having from 1 to 8 carbon atoms, specifically a methoxy group, an ethoxy group, an n-propoxy group, an isopropoxy group, a butoxy group, a pentoxy group, an allyloxy group and an octoxy group can be preferably exemplified.

As the acyl group, e.g., an acyl group having from 1 to 10 carbon atoms, specifically a formyl group, an acetyl group, a propanoyl group, a butanoyl group, a pivaloyl group, an octanoyl group and a benzoyl group can be preferably exemplified.

As the alkoxycarbonyl group, an i-propoxycarbonyl group, a t-butoxycarbonyl group, a t-amyloxycarbonyl group and a 1-methyl-1-cyclohexyloxycarbonyl group, preferably a secondary, and more preferably a tertiary, alkoxycarbonyl group can be exemplified.

As the halogen atom, e.g., a fluorine atom, a chlorine atom, a bromine atom and an iodine atom can be exemplified.

As the alkylene group, an alkylene group having from 1 to 8 carbon atoms, preferably a methylene group, an ethylene group, a propylene group, a butylene group, a hexylene group and an octylene group can be exemplified.

As the alkenylene group, preferably an alkenylene group having from 2 to 6 carbon atoms, e.g., an ethenylene group, a propenylene group and a butenylene group can be exemplified.

As the cycloalkylene group, preferably a cycloalkylene group having from 5 to 8 carbon atoms, e.g., a cyclopentylene group and a cyclohexylene group can be exemplified.

As the arylene group, an arylene group having from 6 to 15 carbon atoms, e.g., a phenylene group, a tolylene group and a naphthylene group can be exemplified.

These groups may have a substituent, and the examples of these substituents include groups having active hydrogen, e.g., an alkyl group, a cycloalkyl group, an aryl group, an amino group, an amido group, a ureido group, a urethane group, a hydroxyl group and a carboxyl group, a halogen atom (e.g., a fluorine atom, a chlorine atom, a bromine atom and an iodine atom), an alkoxyl group (e.g., a methoxy group, an ethoxy group, a propoxy group, a butoxy group), a thioether group, an acyl group (e.g., an acetyl group, a propanoyl group, a benzoyl group), an acyloxy group (e.g., an acetoxy group, a propanoyloxy group, a benzoyloxy group), an alkoxycarbonyl group (e.g., a methoxycarbonyl group, an ethoxycarbonyl group, a propoxycarbonyl group), a cyano group, and a nitro group can be exemplified.

Here, as the alkyl, cycloalkyl and aryl groups, those described above are exemplified, but the alkyl group may further be substituted with a fluorine atom or a cycloalkyl group.

As the groups contained in the fluorine-containing resins in the invention and capable of decomposing by the action of an acid to thereby increase the solubility in an alkali developer, —O—C(R$_{36}$)(R$_{37}$)(R$_{38}$), —O—C(R$_{36}$)(R$_{37}$)(OR$_{39}$), —O—COO—C(R$_{36}$)(R$_{37}$)(R$_{38}$), —O—C(R$_{01}$)(R$_{02}$)COO—C(R$_{36}$)(R$_{37}$)(R$_{38}$), —COO—C(R$_{36}$)(R$_{37}$)(R$_{38}$), and —COO—C(R$_{36}$)(R$_{37}$)(OR$_{39}$) can be exemplified.

R$_{36}$, R$_{37}$, R$_{38}$ and R$_{39}$ each represents an alkyl group, a cycloalkyl group, an aryl group, an aralkyl group or an alkenyl group; R$_{01}$ and R$_{02}$ each represents a hydrogen atom, an alkyl group, a cycloalkyl group, an alkenyl group (e.g., a vinyl group, an allyl group, a butenyl group, a cyclohexenyl group), an aralkyl group (e.g., a benzyl group, a phenethyl group, a naphthylmethyl group), or an aryl group.

The preferred specific examples of the groups include the ether groups or the ester groups of tertiary alkyl groups such as a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, acetal groups or acetal ester groups such as a 1-alkoxy-1-ethoxy group and a tetrahydropyranyl group, a t-alkylcarbonate group and a t-alkylcarbonylmethoxy group.

The specific examples of the repeating units represented by formulae (FA) to (FG) are shown below, but the invention is not limited thereto.

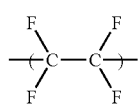
(F-1)

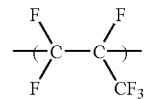
(F-2)

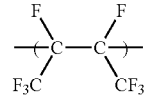
(F-3)

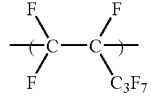
(F-4)

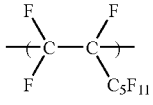
(F-5)

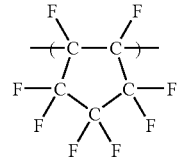
(F-6)

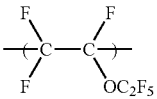
(F-7)

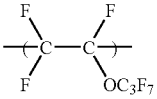
(F-8)

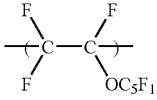
(F-9)

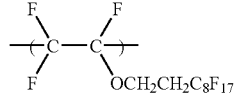
(F-10)

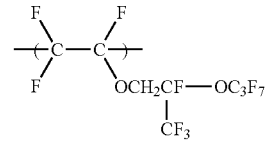
(F-11)

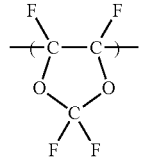
(F-12)

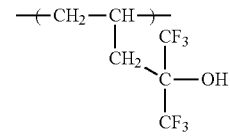
(F-13)

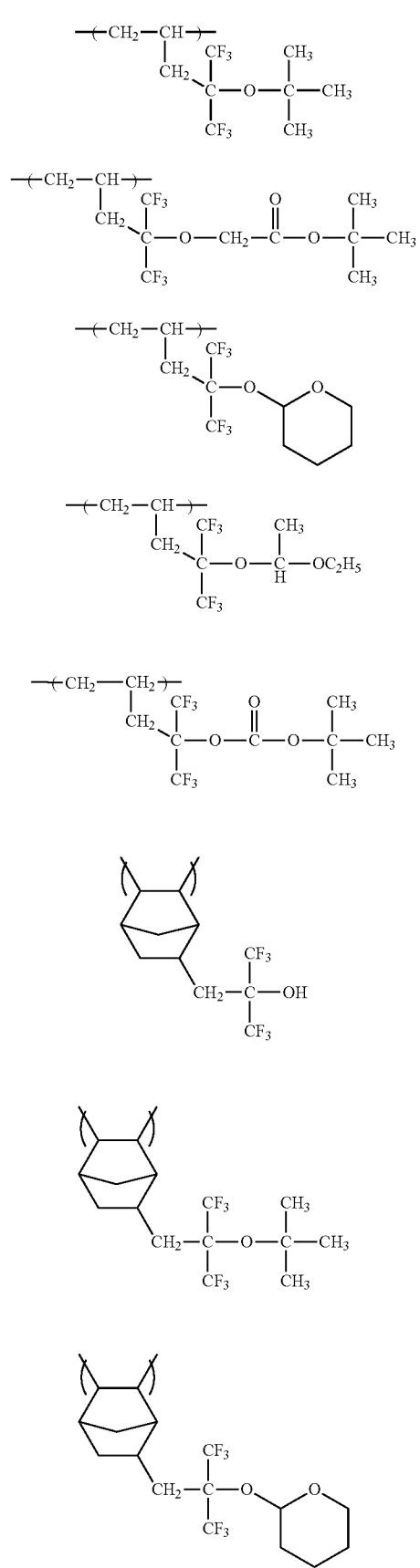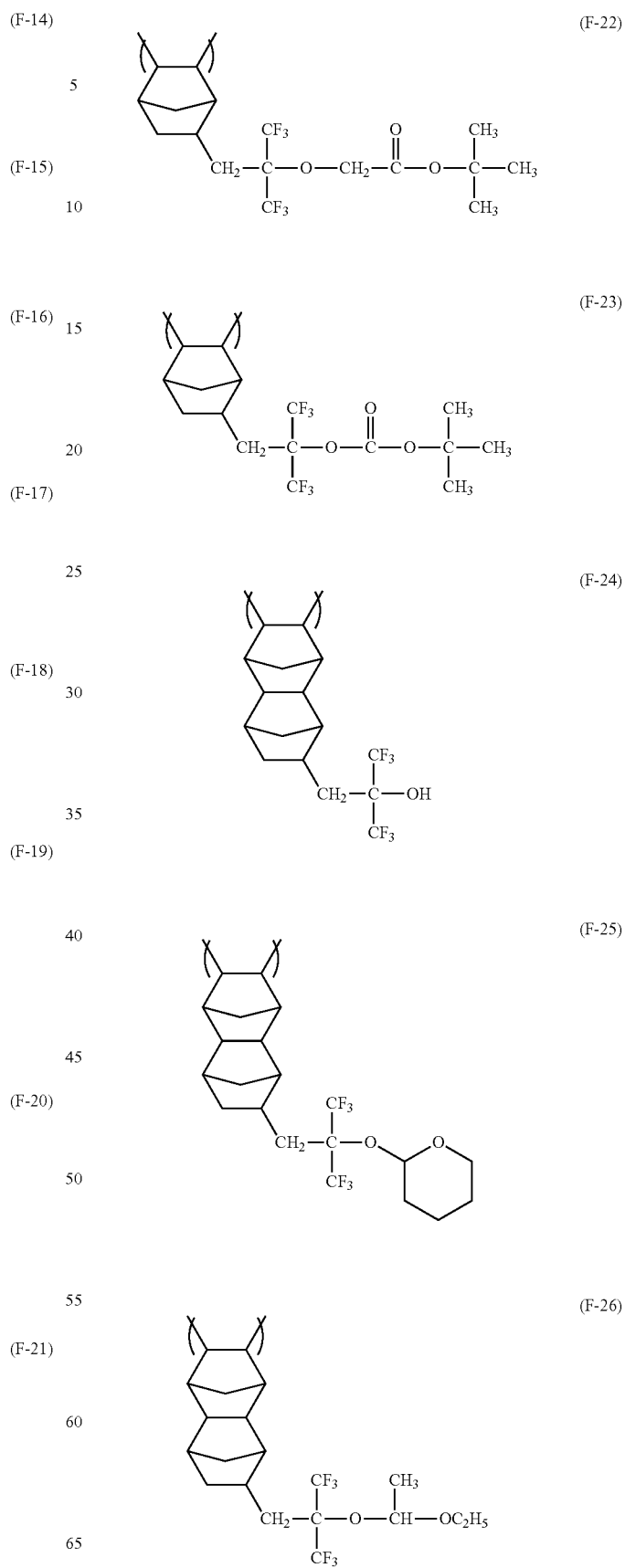

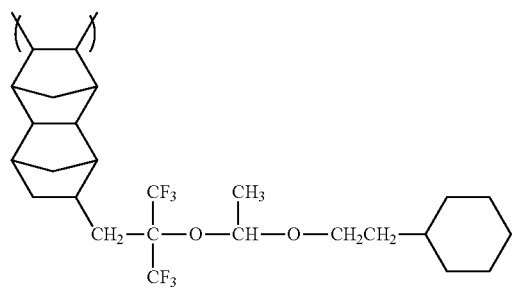
(F-27)
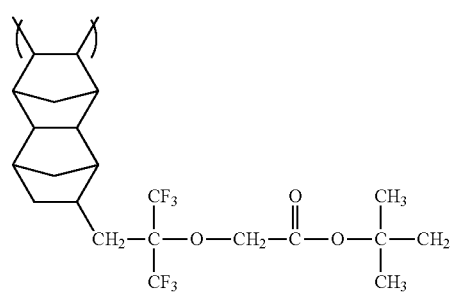
(F-28)
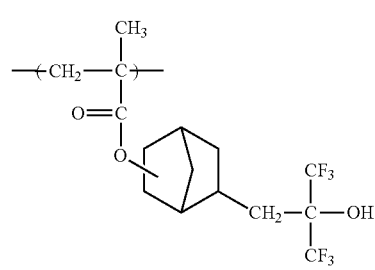
(F-29)
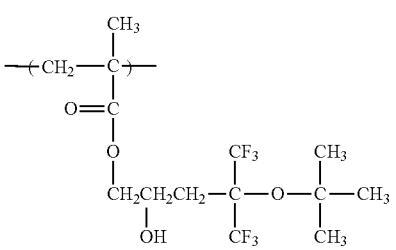
(F-32)
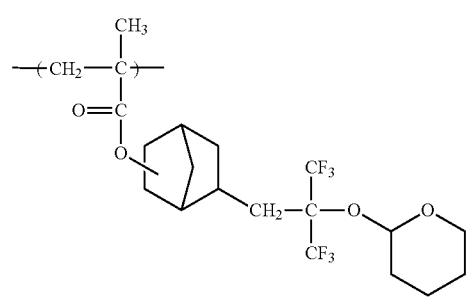
(F-30)
(F-31)
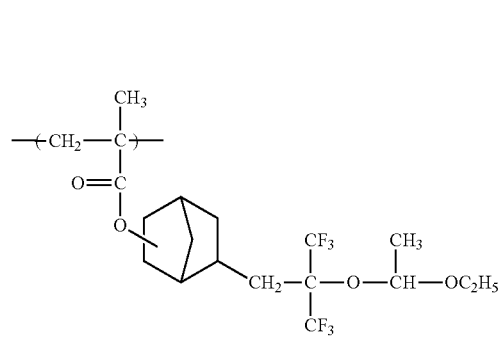
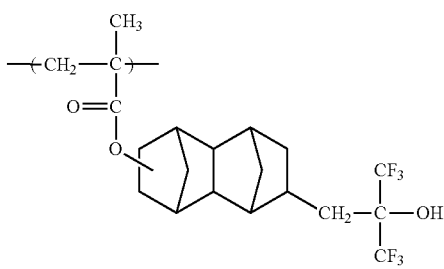
(F-33)
(F-34)
(F-35)
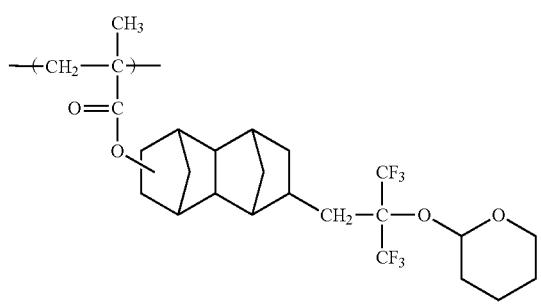
(F-36)

(F-37) 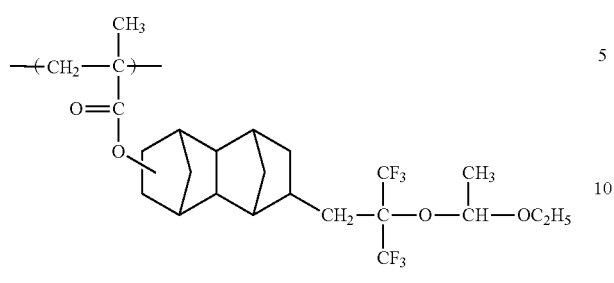
(F-38) 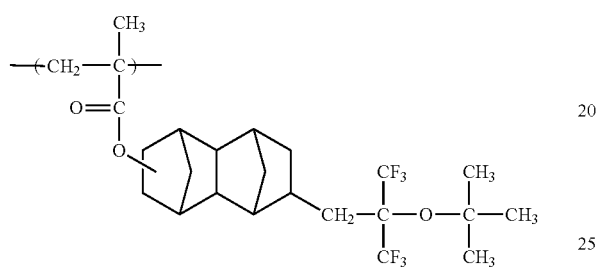
(F-39) 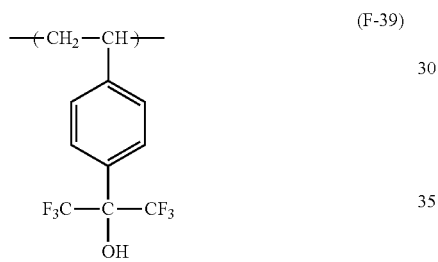
(F-40) 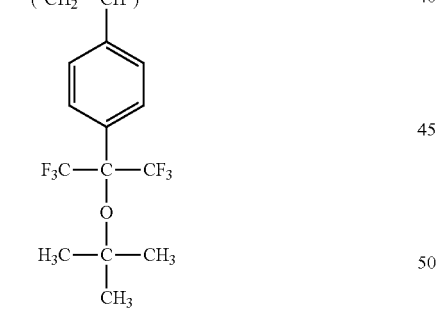
(F-41) 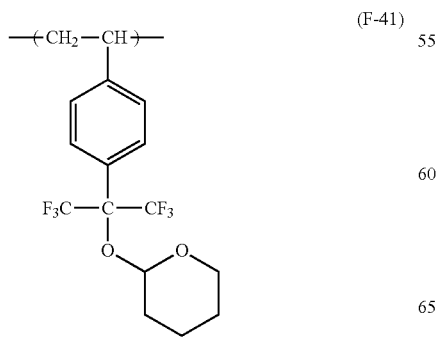
(F-42) 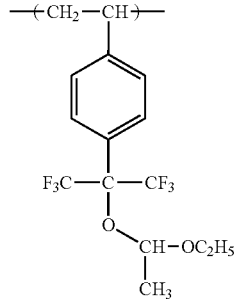
(F-43) 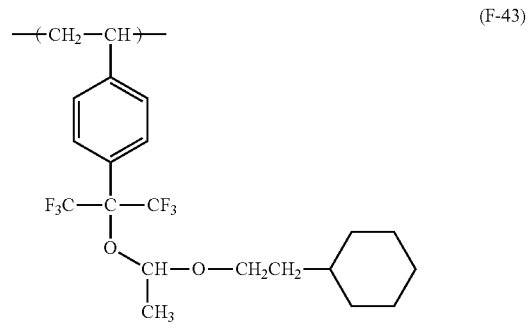
(F-44) 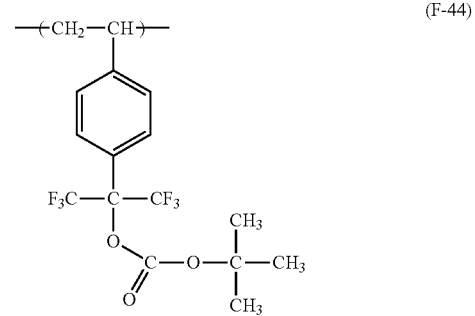
(F-45) 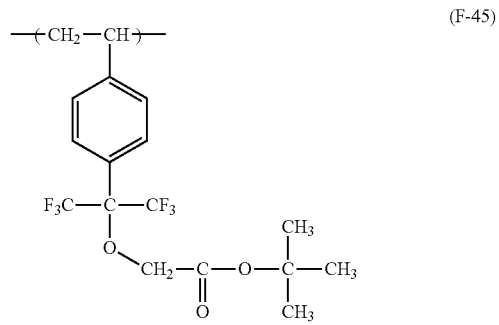
(F-46) 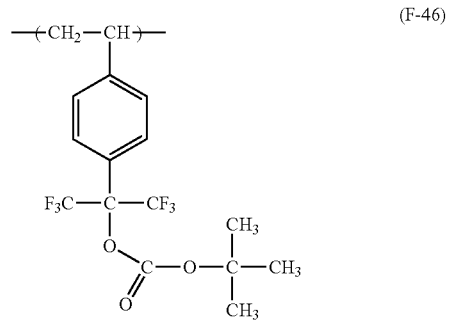

(F-47) 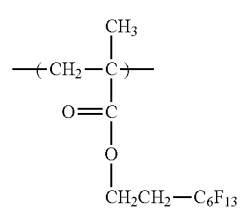
(F-48) 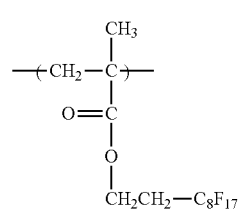
(F-49) 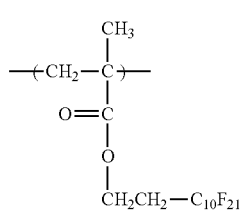
(F-50) 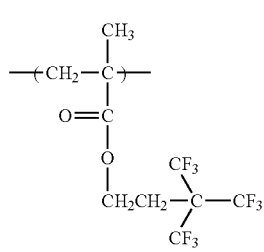
(F-51) 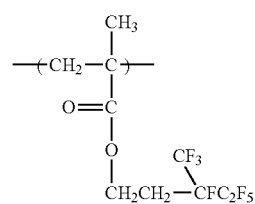
(F-52) 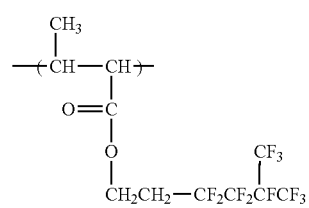
(F-53) 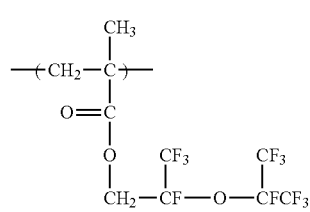
(F-54) 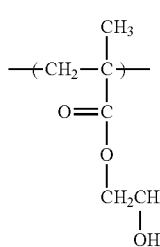
(F-55) 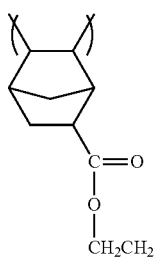
(F-56) 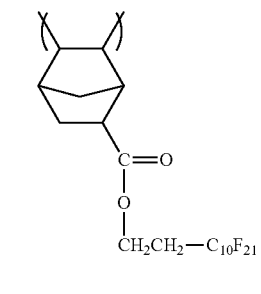
(F-57) 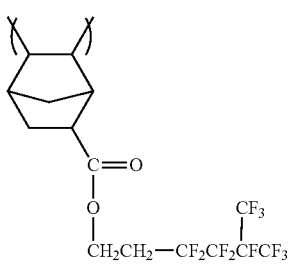
(F-58) 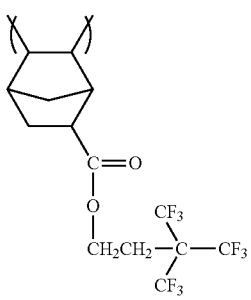

(F-59) 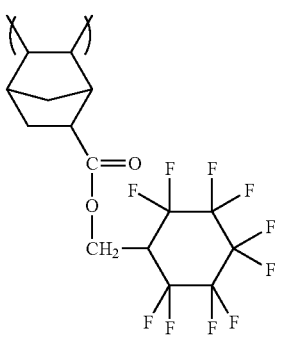

(F-60) 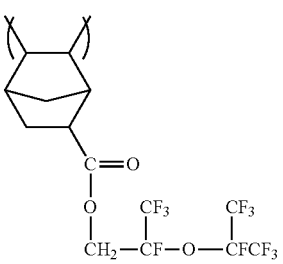

(F-61) 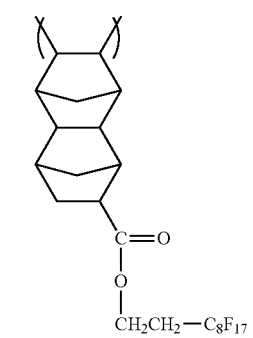

(F-62) 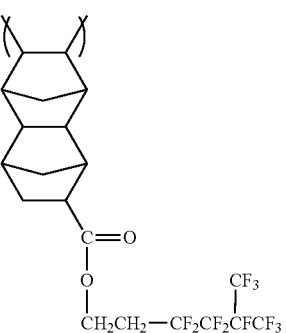

(F-63) 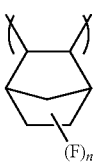

$n = 8$ (F-64) 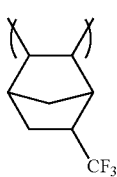

(F-65) 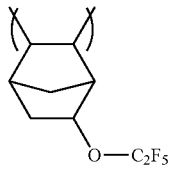

The total content of the repeating units represented by formulae (FA) to (FG) is generally from 10 to 80 mol % to all the repeating units constituting the resin, preferably from 30 to 70 mol %, and more preferably from 35 to 65 mol %.

For the purpose of further improving the performances of the resist of the invention, the above resins may contain other polymerizable monomers by copolymerization in addition to the above repeating structural units.

As the usable copolymerizable monomers, compounds having addition polymerizable unsaturated bond selected from acrylic esters, acrylamides, methacrylic esters, methacrylamides, allyl compounds, vinyl ethers, vinyl esters, styrens, and crotonic esters other than described above are exemplified.

It is preferred that these fluorine-containing resins contain other repeating units as the copolymerization components besides the above repeating units containing fluorine atoms from the points of improving dry etching resistance, adjusting alkali solubility, and improving adhesion with the substrate. Other preferred repeating units are as follows.

1) The repeating units having an alicyclic hydrocarbon structure represented by formula (II-AB) and any of formulae (pI) to (pVI). Specifically repeating units 1 to 23 and repeating units [II-1] to [II-32] shown above. Preferably repeating units 1 to 23, wherein Rx represents $CF_3$.

2) The repeating units having a lactone structure represented by formula (Lc) and any of formulae (V-1) to (V-5). Specifically the above-exemplified repeating units, in particular, the above-exemplified repeating units represented by formula (Lc) and formulae (V-1) to (V-4).

3) The repeating units derived from the vinyl compounds having maleic anhydride, vinyl ether or a cyano group represented by the following formula (XV), (XVI) or (XVII). Specifically repeating units (C-1) to (C-15) shown below. These repeating units may or may not contain a fluorine atom.

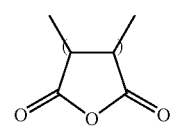 (XV)

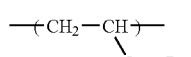 (XVI)

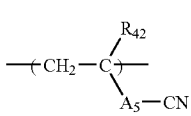 (XVII)

In each of the above formulae, $R_{41}$ represents an alkyl group, a cycloalkyl group, an aralkyl group or an aryl group, and the alkyl group represented by $R_{41}$ may be substituted with an aryl group.

$R_{42}$ represents a hydrogen atom, a halogen atom, a cyano group or an alkyl group.

$A_5$ represents a single bond, a divalent alkylene group, alkenylene group, cycloalkylene group, arylene group, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represents a single bond, or a divalent linking group, e.g., an alkylene group, an alkenylene group, a cycloalkylene group or an arylene group which may have an ether group, an ester group, an amido group, a urethane group or a ureido group.

$R_{24}$ represents a hydrogen atom, an alkyl group, a cycloalkyl group, an aralkyl group or an aryl group.

Here, the examples of the substituents are the same as the substituents in formulae (FA) to (FG).

The specific examples of the repeating structural units represented by formulae (XV) to (XVII) are shown below, but the invention is not limited thereto.

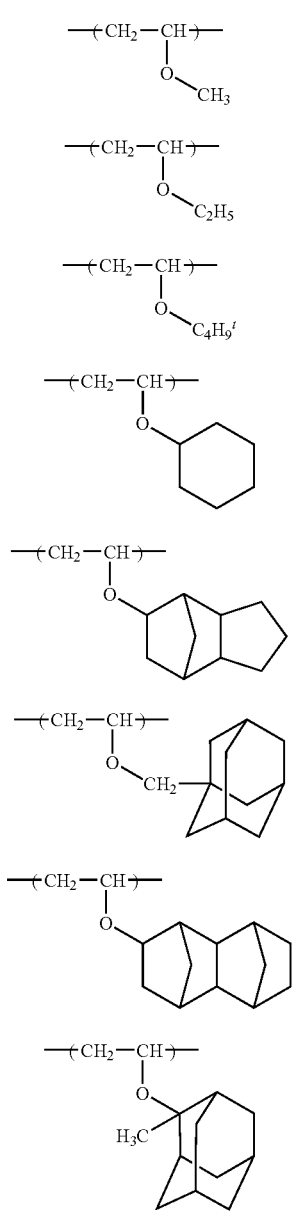

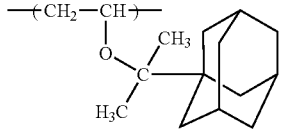

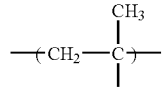

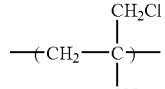

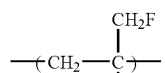

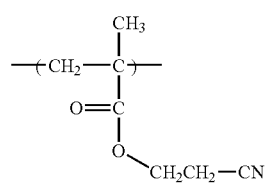

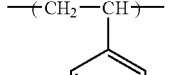

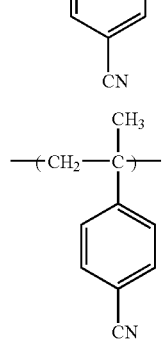

The total amount of the repeating units represented by formulae (XV) to (XVII) and other repeating units is generally from 0 to 70 mol % to the total repeating units constituting the resin, preferably from 10 to 60 mol %, and more preferably from 20 to 50 mol %.

A fluorine-containing resin as the acid-decomposable resin may contain the acid-decomposable group in any repeating unit.

The proportion of a repeating unit having an acid decomposable group is preferably from 10 to 70 mol % to the total repeating units, more preferably from 20 to 60 mol %, and still more preferably from 30 to 60 mol %.

A fluorine-containing resin can be synthesized by radical polymerization almost similar to the synthesis of alicyclic hydrocarbon-based acid-decomposable resin.

The weight average molecular weight of fluorine-containing resins is preferably from 1,000 to 200,000 as the polystyrene equivalent by the GPC method. By making the weight average molecular weight 1,000 or more, heat resistance and dry etching resistance can be improved, and by making the weight average molecular weight 200,000 or less, developability can be improved, and film-forming property can be heightened, since the viscosity becomes extremely low.

In the positive photosensitive composition in the invention, the proportion of the resin of component (B) in all the composition is preferably from 40 to 99.99 mass % in the total solids content, more preferably from 50 to 99.97 mass %.

[3] (C) a Dissolution Inhibiting Compound Having a Molecular Weight of 3,000 or Less which is Capable of Decomposing by the Action of an Acid to Thereby Increase the Solubility in an Alkali Developer:

As (C) the dissolution inhibiting compound having a molecular weight of 3,000 or less which is capable of decomposing by the action of an acid to thereby increase the solubility in an alkali developer, alicyclic or aliphatic compounds containing acid-decomposable groups, such as cholic acid derivatives containing acid-decomposable groups described in Processing of SPIE, 2724, 355 (1996) are preferred so as not to reduce transparency of the lights of 220 nm or less. Acid-decomposable group having an alicyclic structure, the same as those described in the alicyclic hydrocarbon-based acid-decomposable resin are exemplified.

When the photosensitive composition according to the invention is exposed with a KrF excimer laser or irradiated with electron beams, it is preferred for the photosensitive composition to. As the phenolic compounds, compounds having from 1 to 9 phenolic skeletons are preferred, and those having from 2 to 6 are more preferred.

The molecular weight of the dissolution-inhibiting compound in the invention is 3,000 or less, preferably from 300 to 3,000, and more preferably from 500 to 2,500.

The addition amount of the dissolution-inhibiting compound is preferably from 3 to 50 mass % based on the solids content of the photosensitive composition, and more preferably from 5 to 40 mass %.

The specific examples of the dissolution-inhibiting compounds are shown below, but the invention is not limited thereto.

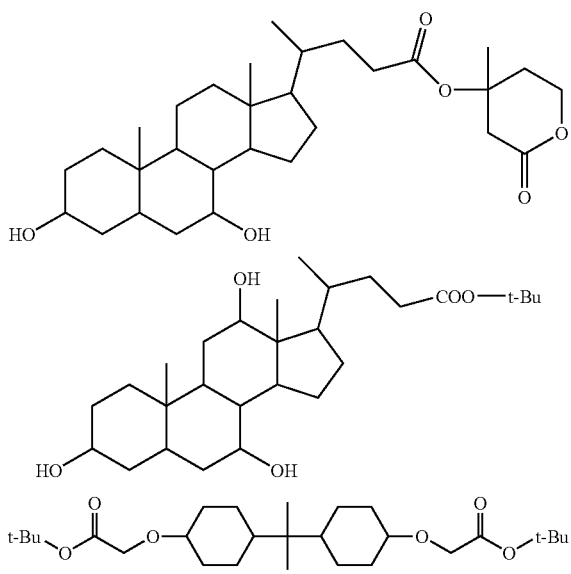

-continued

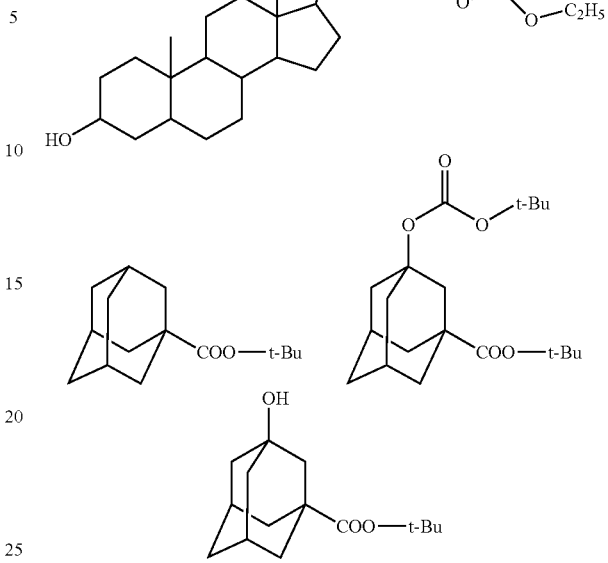

[4] (D) A Resin Soluble in an Alkali Developer (Hereinafter Sometimes Referred to as "Component (D)" or "Alkali-Soluble Resin"):

The alkali dissolution rate of alkali-soluble resins is preferably 20 Å/sec or more when measured using 0.261 N tetramethylammonium hydroxide (TMAH) at 23° C., particularly preferably 200 Å/sec or more.

As alkali-soluble resins for use in the invention, e.g., novolak resins, hydrogenated novolak resins, acetone-pyrogallol resins, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymers, o/p- and m/p-hydroxystyrene copolymers, partially O-alkylated products of the hydroxyl group of polyhydroxystyrene (e.g., from 5 to 30 mol % O-methylated, O-(1-methoxy)ethylated, O-(1-ethoxy)ethylated, O-2-tetrahydropyranylated, and O-(t-butoxycarbonyl)methylated products), or partially O-acylated products (e.g., from 5 to 30 mol % O-acetylated and O-(t-butoxy)carbonylated products), styrene-maleic anhydride copolymers, styrene-hydroxystyrene copolymers, α-methylstyrene-hydroxystyrene copolymers, carboxyl group-containing methacrylic resins and derivatives thereof, and polyvinyl alcohol derivatives can be exemplified, but the invention is not limited to these resins.

Particularly preferred alkali-soluble resins are novolak resins, o-polyhydroxystyrene, m-polyhydroxystyrene p-polyhydroxystyrene, copolymers of these, alkyl-substituted polyhydroxystyrene, partially O-alkylated or O-acylated products of polyhydroxystyrene, styrene-hydroxystyrene copolymers, and α-methylstyrene-hydroxystyrene copolymers.

The novolak resins can be obtained by addition condensation to aldehydes with the prescribed monomers as main components in the presence of acid catalysts.

The weight average molecular weight of alkali-soluble resins is 2,000 or more, preferably from 5,000 to 200,000, and more preferably from 5,000 to 100,000.

Here, the weight average molecular weight is defined as the polystyrene equivalent by gel permeation chromatography method.

Alkali-soluble resins (D) may be used in combination of two kinds or more in the invention.

The addition amount of alkali-soluble resins is from 40 to 97 mass %, preferably from 60 to 90 mass %, based on the total solids content of the photosensitive composition.

[5] (E) An Acid Crosslinking Agent Capable of Crosslinking with the Alkali-Soluble Resin by the Action of an Acid (Hereinafter Also Referred to as "Component (E)" or "Crosslinking Agent"):

Crosslinking agents are used in the negative photosensitive composition of the invention.

Any compound capable of crosslinking the resins soluble in an alkali developer by the action of an acid can be used as crosslinking agents, but the following (1) to (3) are preferably used.

(1) Hydroxymethyl body, alkoxymethyl body and acyloxymethyl body of phenol derivatives (2) Compounds having an N-hydroxymethyl group, an N-alkoxymethyl group and an N-acyloxymethyl group (3) Compounds having an epoxy group As the alkoxymethyl groups, those having 6 or less carbon atoms, and as the acyloxymethyl groups, those having 6 or less carbon atoms are preferred.

Of these crosslinking agents, particularly preferred compounds are shown below.

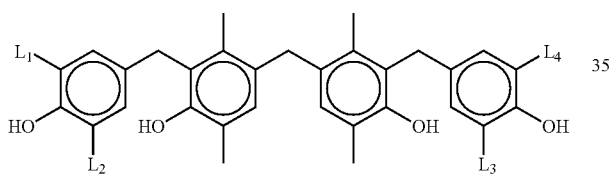

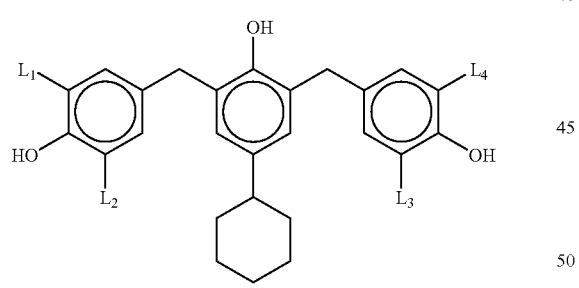

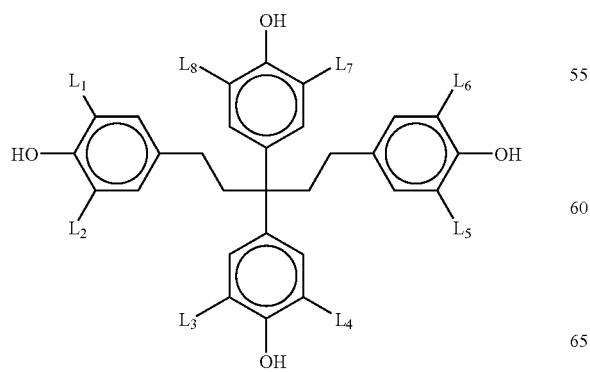

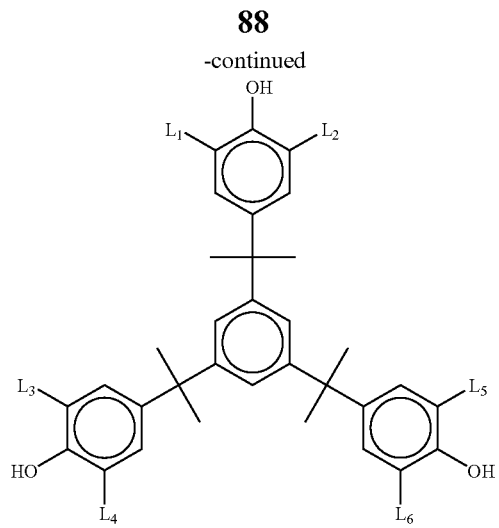

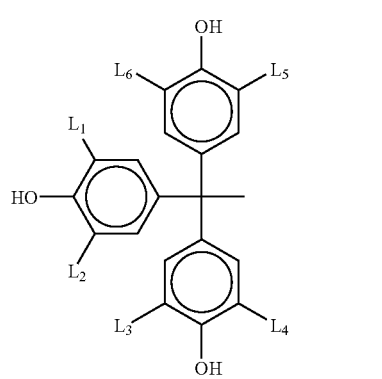

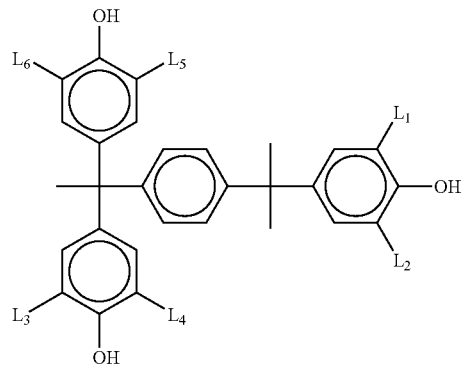

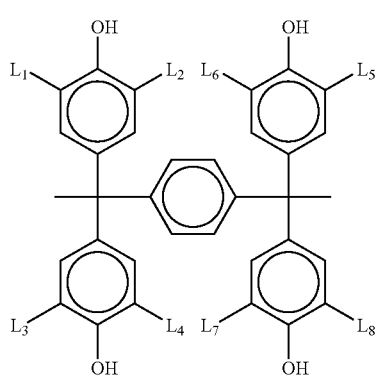

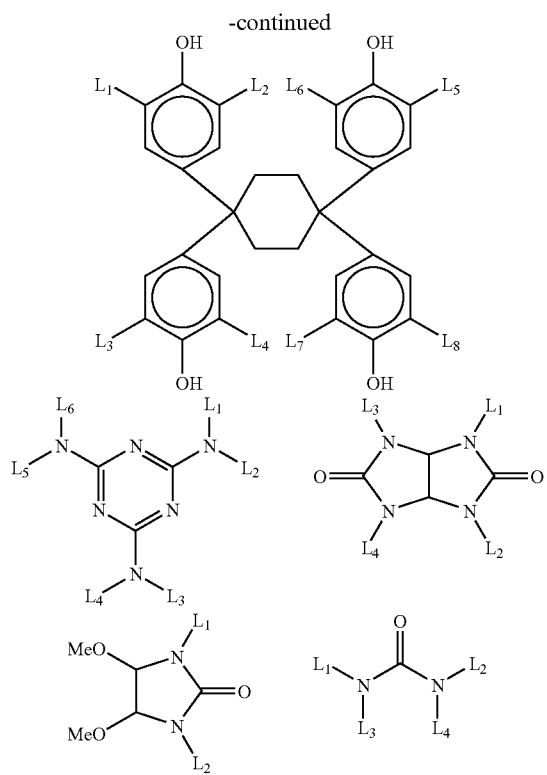

In the above formulae, $L_1$ to $L_8$, which may be the same or different, each represents a hydrogen atom, a hydroxymethyl group, a methoxymethyl group, an ethoxymethyl group, or an alkyl group having from 1 to 6 carbon atoms.

Crosslinking agents are used generally in proportion of from 3 to 70 mass % in the solids content of the photosensitive composition, preferably from 5 to 50 mass %.

Other Components:

[6] (F) Basic Compounds:

For decreasing the fluctuation of performances during the period of time from exposure to heating, it is preferred for the photosensitive composition of the invention to contain (F) basic compounds.

As the preferred structures, the structures represented by the following formulae (A) to (E) can be exemplified.

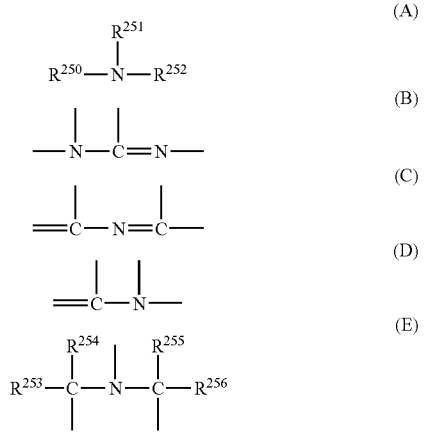

In formula (A), $R^{250}$, $R^{251}$ and $R^{252}$ each represents a hydrogen atom, an alkyl group having from 1 to 20 carbon atoms, a cycloalkyl group having from 3 to 20 carbon atoms, or an aryl group having from 6 to 20 carbon atoms, and $R^{250}$ and $R^{251}$ may be bonded to each other to form a ring. These groups may have a substituent, and as the alkyl group and the cycloalkyl group having a substituent, an aminoalkyl group having from 1 to 20 carbon atoms or an aminocycloalkyl group having from 3 to 20 carbon atoms, a hydroxyalkyl group having from 1 to 20 carbon atoms or a hydroxycycloalkyl group having from 3 to 20 carbon atoms are preferred.

These groups may contain an oxygen atom, a sulfur atom and a nitrogen atom in the alkyl chain.

In formula (E), $R^{253}$, $R^{254}$, $R^{255}$ and $R^{256}$ each represents an alkyl group having from 1 to 6 carbon atoms, or a cycloalkyl group having from 3 to 6 carbon atoms.

As preferred examples of basic compounds, guanidine, aminopyrrolidine, pyrazole, pyrazoline, piperazine, aminomorpholine, aminoalkylmorpholine, and piperidine can be exemplified, and these compounds may have a substituent. As further preferred compounds, compounds having an imidazole structure, a diazabicyclo structure, an onium hydroxy structure, an onium carboxylate structure, a trialkylamine structure, an aniline structure and a pyridine structure, alkylamine derivatives having a hydroxyl group and/or an ether bond, and aniline derivatives having a hydroxyl group and/or an ether bond can be exemplified.

As compounds having an imidazole structure, 2,4,5-triphenylimidazole and benzimidazole can be exemplified. As compounds having a diazabicyclo structure, 1,4-diazabicyclo-[2,2,2]octane, 1,5-diazabicyclo[4,3,0]nona-5-ene, and 1,8-diazabicyclo[5,4,0]undeca-7-ene can be exemplified. As compounds having an onium hydroxide structure, triarylsulfonium hydroxide, phenacylsulfonium hydroxide, sulfonium hydroxide having a 2-oxoalkyl group, specifically triphenyl-sulfonium hydroxide, tris(t-butylphenyl)sulfonium hydroxide, bis(t-butylphenyl)iodonium hydroxide, phenacylthiophenium hydroxide, and 2-oxopropylthiophenium hydroxide can be exemplified. Compounds having an onium carboxylate structure are compounds having an onium hydroxide structure in which the anionic part is carboxylated, e.g., acetate, adamantane-1-carboxylate and perfluoroalkyl carboxylate are exemplified. As compounds having a trialkylamine structure, tri(n-butyl)-amine and tri(n-octyl)amine can be exemplified. As aniline compounds, 2,6-diisopropylaniline and N,N-dimethylaniline can be exemplified. As alkylamine derivatives having a hydroxyl group and/or an ether bond, ethanolamine, diethanol-amine, triethanolamine and tris(methoxyethoxyethyl)amine can be exemplified. As aniline derivatives having a hydroxyl group and/or an ether bond, N,N-bis(hydroxyethyl)aniline can be exemplified.

These basic compounds are used alone or in combination of two or more. The use amount of basic compounds is generally from 0.001 to 10 mass % based on the solids content of the photosensitive composition, and preferably from 0.01 to 5 mass %. For obtaining a sufficient addition effect, the addition amount is preferably 0.001 mass % or more, and in view of sensitivity and the developability of a non-exposed area, it is preferably 10 mass % or less.

[7] (G) Fluorine and/or Silicon Surfactants:

It is preferred for the photosensitive composition in the invention to further contain either one or two or more of fluorine and/or silicon surfactants (a fluorine surfactant and a silicon surfactant, a surfactant containing both a fluorine atom and a silicon atom).

By containing fluorine and/or silicon surfactants, it becomes possible for the photosensitive in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As the fluorine and silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene) acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyethylene)) acrylate (or methacrylate), copolymers of acrylate (or methacrylate) having a $C_8F_{17}$ group, (poly(oxy-ethylene)) acrylate (or methacrylate), and poly(oxypropylene) acrylate (or methacrylate) are exemplified.

The amount of fluorine and/or silicon surfactants is preferably from 0.0001 to 2 mass % to the total amount of the photosensitive composition (excluding solvents), more preferably from 0.001 to 1 mass %.

[8] (H) Organic Solvent:

For using the photosensitive composition in the invention, the above components are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran are exemplified.

Organic solvents may be used alone or as mixed solvents, but it is preferred in the invention to use a mixed solvent of a solvent containing a hydroxyl group in the structure and a solvent not containing a hydroxyl group, by which the generation of particles can be reduced in storing a resist solution.

As solvents containing a hydroxyl group, e.g., ethylene glycol, ethylene glycol monomethyl ether, ethylene glycol monoethyl ether, propylene glycol, propylene glycol monomethyl ether, propylene glycol monoethyl ether and ethyl lactate are exemplified. Of these solvents, propylene glycol monomethyl ether and ethyl lactate are particularly preferred.

As solvents not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide are exemplified. Of these solvents, propylene glycol monomethyl ether acetate, ethylethoxy propionate, 2-heptanone, γ-butyrolactone, cyclohexanone and butyl acetate are particularly preferred, and propylene glycol monomethyl ether acetate, ethylethoxy propionate and 2-heptanone are most preferred.

The mixing ratio (by mass) of a solvent containing a hydroxyl group and a solvent not containing a hydroxyl group is from 1/99 to 99/1, preferably from 10/90 to 90/10, and more preferably from 20/80 to 60/40. A mixed solvent containing 50 mass % or more of a solvent not containing a hydroxyl group is particularly preferred in the point of coating uniformity.

Other Additives:

If necessary, dyes, plasticizers, surfactants other than the surfactants of component (G), photosensitizers, and compounds for accelerating dissolution in a developer may be further added to the photosensitive composition in the present invention.

Compounds for accelerating dissolution in a developer usable in the invention are low molecular weight compounds having a molecular weight of 1,000 or less and having two or more phenolic OH groups or one or more carboxyl groups. When carboxyl groups are contained, alicyclic or aliphatic compounds are preferred.

The preferred addition amount of these dissolution accelerating compounds is preferably from 2 to 50 mass % based on the addition amount of the resin of component (B) or the resin of component (D), more preferably from 5 to 30 mass %. The amount is preferably 50 mass % or less in the point of restraint of development residue and prevention of pattern deformation in development.

These phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but the present invention is not limited to these compounds.

Surfactants other than fluorine and/or silicon surfactants of component (G) can be used in the invention. As the specific examples of other surfactants, nonionic surfactants, e.g., polyoxyethylene alkyl ethers, polyoxy-ethylene alkylaryl ethers, polyoxyethylene-polyoxypropylene block copolymers, sorbitan aliphatic acid esters, and polyoxyethylene sorbitan aliphatic acid esters can be exemplified.

These surfactants may be used alone or in combination of two or more.

Pattern Forming Method:

The photosensitive composition in the invention is used by dissolving each of the above components in a prescribed organic solvent, preferably dissolving in a mixed solvent as described above, and coating the solution on a prescribed support as follows.

For example, the photosensitive composition is coated on a substrate such as the one used in the manufacture of precision integrated circuit element (e.g., silicon/silicon dioxide coating) by an appropriate coating method with a spinner or a coater, and dried, to thereby form a photosensitive layer.

The photosensitive layer is irradiated with an actinic ray or radiation through a prescribed mask, the exposed photosensitive layer is preferably subjected to baking (heating), and then development. Thus, a good pattern can be obtained.

As actinic rays or radiation, infrared rays, visible rays, ultraviolet rays, far ultraviolet rays, X-rays and electron beams can be exemplified, and preferably far ultraviolet rays of wavelength of 250 nm or less, and more preferably 220 nm or less. Specifically, a KrF excimer laser (248 nm), an ArF excimer laser (193 nm), an $F_2$ excimer laser (157 nm), X-rays and electron beams are exemplified, and ArF excimer lasers, $F_2$ excimer lasers, EUV (13 nm), and electron beams are preferred.

In a development process, an alkali developer is used as follows. As alkali developers of the resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkali developers.

The alkali concentration of alkali developers is generally from 0.1 to 20 mass %.

The pH of alkali developers is generally from 10.0 to 15.0.

EXAMPLE

The present invention is described in detail below with reference to examples, but the invention is not limited thereto.

Synthesis Example of Compound (A)

Synthesis Example 1

Synthesis of Compound (I-1)

Triphenylsulfonium iodide (3.3 g) was dissolved in acetonitrile/distilled water (2/1, by mass), 1.5 g of silver acetate was added to the above solution, and the solution was stirred for 30 minutes. The precipitated silver compound was filtered, and 3.0 g of the following shown compound (IA) dissolved in acetonitrile/distilled water (2/1, by mass) was added to the filtrate. The reaction solution was concentrated, and then dissolved in 200 ml of chloroform. The resulted solution was washed with distilled water, an aqueous solution of ammonium chloride, and water. The organic phase was filtered through a polyfluorotetraethylene filter having a pore diameter of 0.1 μm and concentrated, whereby 4.2 g of compound I-1 was obtained.

$^1$H-NMR (300 MHz, CHCl$_3$)

δ 7.6-7.8 (m. 15H)

$^{19}$F-NMR (300 MHz, CHCl$_3$)

δ 115.59 (4F), δ 122.29 (2F)

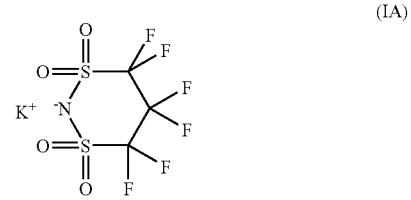

(IA)

Synthesis Example 2

Synthesis of Compound (I-2)

4-Cyclohexylphenyldiphenylsulfonium bromide (2.4 g) was dissolved in acetonitrile, and 2.0 g of compound (IA) was dissolved in acetonitrile and added to the above solution. The reaction solution was filtered, concentrated, and then dissolved in 200 ml of chloroform. The resulted solution was washed with distilled water two times. The organic phase was filtered through a polyfluorotetraethylene filter having a pore diameter of 0.1 μm and concentrated, and then washed with diisopropyl ether/hexane, whereby 2.4 g of compound I-22 was obtained.

$^1$H-NMR (300 MHz, CHCl$_3$)

δ 1.2-2.0 (m. 10H), δ 2.5-2.7 (m. 1H), δ 7.5-7.8 (m. 15H)

$^{19}$F-NMR (300 MHz, CHCl$_3$)

δ 115.60 (4F), δ 122.30 (2F)

Other acid generating agents were also synthesized in the similar manner.

Resin (B):
The structure and molecular weight of each resin (B) used in Examples are shown below.
| | Molecular Weight |
|---|---|
| (1) 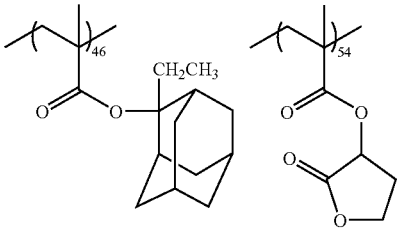 | 10700 |
| (2) 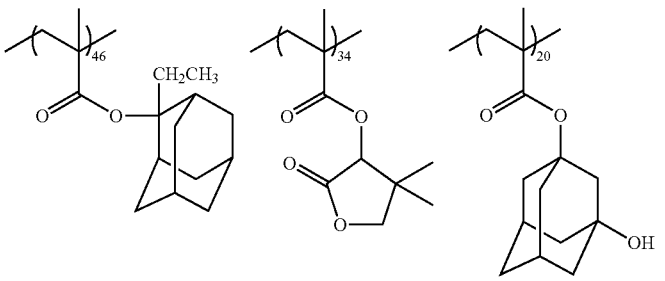 | 9400 |
| (4) 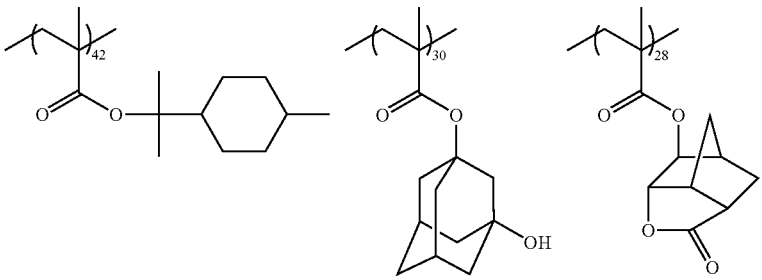 | 10300 |
| (6) 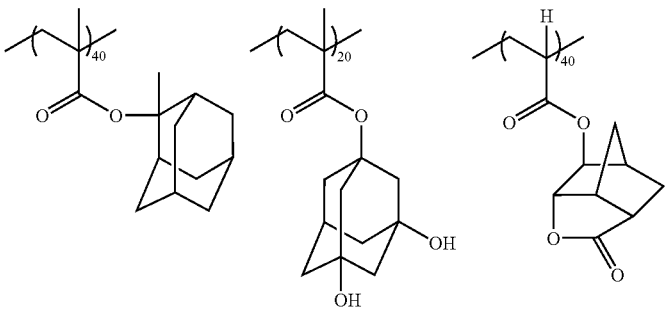 | 11300 |
| (7) 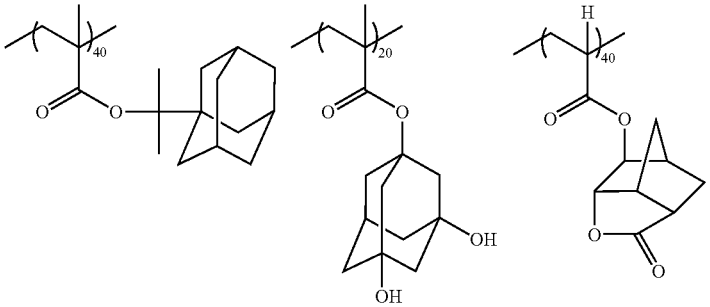 | 8900 |

|  | Molecular Weight |
|---|---|
| (11) | 13400 |
| (15) | 9600 |
| (16) | 5800 |
| (17) | 4700 |
| (20) | 12100 |
| (24) | 10800 |

|  | Molecular Weight |
|---|---|
| (25) [structures] | 9300 |
| (28) [structures] | 7300 |
| (29) [structures] | 7600 |
| (30) [structures] | 8400 |
| (31) [structures] | 6500 |

Fluorine-Containing Resin:

The structures of fluorine-containing resins (FII-1) to (FII-10) for use in Examples are shown below.

The weight average molecular weight and the like of fluorine-containing resins (FII-1) to (FII-10) are shown in Table 1 below.

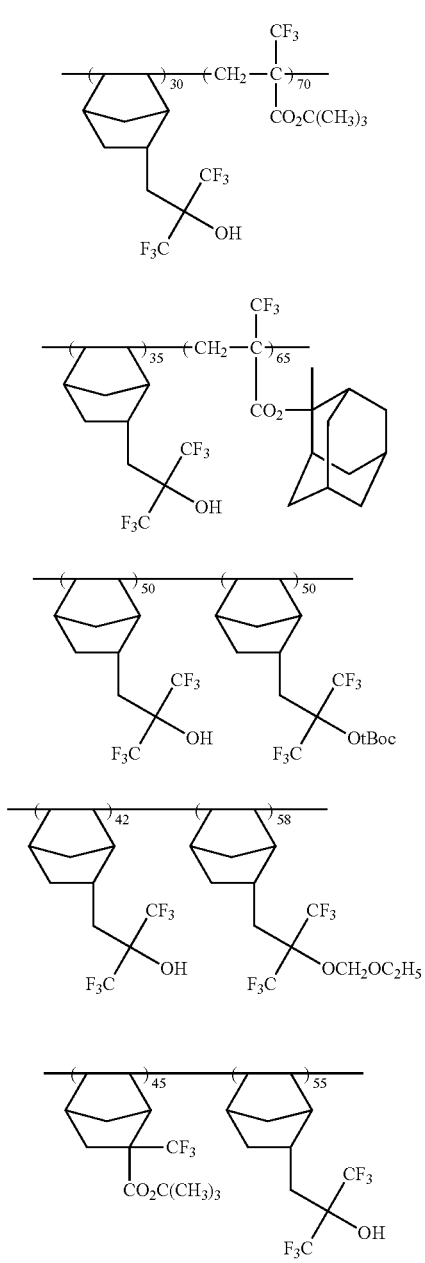

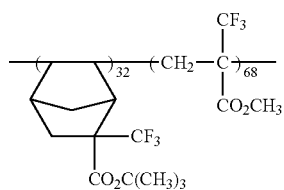

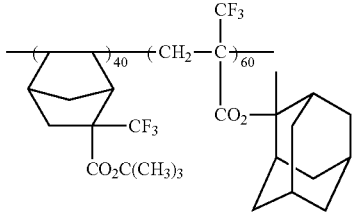

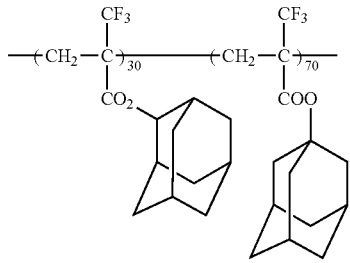

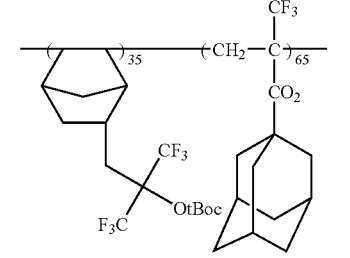

TABLE 1

| Resin | Weight Average Molecular Weight (Mw) | Degree of Dispersion | Content of Oligomer Having A Molecular Weight of 1,000 Or Less (%) |
|---|---|---|---|
| (FII-1) | 15,200 | 1.45 | 5 |
| (FII-2) | 24,000 | 1.75 | 8 |
| (FII-3) | 18,200 | 1.85 | 7 |
| (FII-4) | 16,500 | 1.46 | 6 |
| (FII-5) | 9,500 | 1.58 | 8 |
| (FII-6) | 19,500 | 2.02 | 8 |
| (FII-7) | 6,500 | 1.85 | 7 |
| (FII-8) | 28,400 | 1.68 | 9 |
| (FII-9) | 28,600 | 1.44 | 5 |
| (FII-10) | 12,800 | 1.65 | 8 |

Examples Ar 1 to Ar 22 and Comparative Example ar 1

Preparation of Resist

The components shown in Table 2 below were dissolved in a solvent to prepare a solution having solids concentration of 12 mass %, and the solution was filtered through a polytetrafluoroethylene filter having a pore diameter of 0.1 μm, whereby a positive resist solution was prepared. The prepared positive resist solution was evaluated by the method described below. The results of evaluation are shown in Table 2 below.

Solvents:
A1: Propylene glycol methyl ether acetate
A2: 2-Heptanone

TABLE 2

| | Composition | | | | | | Evaluation Line Width of Critical Pattern collapse (nm) | |
|---|---|---|---|---|---|---|---|---|
| Example | (A) Acid Generating Agent (g) | Acid Generating Agent Used in Combination (g) | (B) Resin (10 g) | Basic Compound (g) | Surfactant (g) | Solvent (by mass) | Dense Pattern | Lone Pattern |
| Ar 1 | I-1 (0.3) | — | (1) | DIA (0.03) | W-4 (0.01) | A1/B1 = 70/30 | 95 | 83 |
| Ar 2 | I-1 (0.4) | z43 (0.4) | (4) | TPA (0.03) | W-2 (0.02) | A1/A3 = 40/60 | 96 | 81 |
| Ar 3 | I-2 (0.2) | z6 (0.2) | (6) | HAP (0.02) | W-1 (0.01) | A1/B1 = 50/50 | 92 | 80 |
| Ar 4 | I-6 (0.3) | z8 (0.1) | (6) | DIA (0.03) | W-4 (0.01) | A1/B1 = 60/40 | 94 | 81 |
| Ar 5 | I-1 (0.4) | z12 (0.05) | (7) | PEA (0.01) | W-4 (0.01) | A1/B1 = 60/40 | 90 | 78 |
| Ar 6 | I-2 (0.2) I-24 (0.2) | z36 (0.1) | (7) | DIA (0.02) PEA (0.02) | W-4 (0.01) | A1/A3 = 60/40 | 89 | 79 |
| Ar 7 | I-42 (0.3) | z40 (0.1) | (15) | TMEA (0.03) | W-3 (0.03) | A1/B2 = 80/20 | 97 | 84 |
| Ar 8 | I-40 (0.6) | z41 (0.3) | (16) | TBAH (0.04) | W-1 (0.005) | A2/B1 = 80/20 | 96 | 83 |
| Ar 9 | I-30 (0.5) | z42 (0.3) | (17) | HEP (0.03) | W-3 (0.02) | A3/B1 = 70/30 | 98 | 81 |
| Ar 10 | I-1 (0.3) | z14 (0.1) | (24) | TPSA (0.05) | W-3 (0.02) | A1/A3 = 60/40 | 95 | 84 |
| Ar 11 | I-6 (0.2) | z25 (0.4) | (25) | DCMA (0.03) | W-4 (0.01) | A1/A3 = 60/40 | 96 | 82 |
| Ar 12 | I-3 (0.3) | — | (28) | DIA (0.03) | W-4 (0.01) | A1/B1 = 60/40 | 90 | 79 |
| Ar 13 | I-17 (0.7) | — | (29) | PEA (0.04) | W-2 (0.02) | A1/A3 = 60/40 | 91 | 78 |
| Ar 14 | I-21 (0.5) | — | (30) | PEA (0.04) | W-4 (0.01) | A1/A3 = 60/40 | 92 | 80 |
| Ar 15 | I-26 (0.1) | z14 (0.3) | (31) | DIA (0.03) | W-2 (0.02) | A1/A3 = 60/40 | 91 | 80 |
| Ar 16 | I-27 (0.2) | z14 (0.2) | (6) | DIA (0.03) | W-2 (0.01) | A1/A3 = 60/40 | 90 | 81 |
| Ar 17 | I-2 (0.15) | z50 (0.2) | (7) | DIA (0.02) | W-4 (0.01) | A1/A3 = 60/40 | 91 | 79 |
| Ar 18 | I-1 (0.4) | z4 (0.02) | (28) | PEA (0.02) | W-4 (0.01) | A1/B1 = 60/40 | 89 | 79 |
| Ar 19 | I-23 (0.3) | z6 (0.1) z1 (0.1) | (28) 5 g (20) 5 g | DIA (0.02) DCMA (0.02) | W-4 (0.01) | A1/A3 = 60/40 | 88 | 78 |
| Ar 20 | I-37 (0.5) I-6 (0.1) | z14 (0.2) | (4) 5 g (7) 5 g | TPA (0.02) PEA (0.02) | W-4 (0.01) | A1/B1 = 60/40 | 90 | 80 |
| Ar 21 | I-2 (0.2) | z5 (0.1) z6 (0.1) | (28) 5 g (11) 5 g | DIA (0.02) TMEA (0.02) | W-4 (0.01) | A1/B1 = 60/40 | 89 | 79 |
| Ar 22 | I-3 (0.2) | z38 (0.1) z44 (0.1) | (28) 5 g (2) 5 g | TPSA (0.02) PEA (0.02) | W-4 (0.01) | A1/A4 = 95/5 | 91 | 79 |
| Comp. Ex. ar 1 | PAG-A (0.3) | — | (1) | DIA (0.03) | W-4 (0.01) | A1/B1 = 70/30 | 110 | 97 |

The abbreviations used in the above Table 2 and the following Tables 3 to 6 are summarized below.

Acid-Generating Agents:

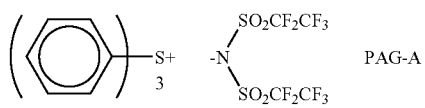

PAG-A

Basic Compounds:
TPI: 2,4,5-Triphenylimidazole
TPSA: Triphenylsulfonium acetate
HEP: N-hydroxyethylpiperidine
DIA: 2,6-Diisopropylaniline
DCMA: Dicyclohexylmethylamine
TPA: Tripentylamine
HAP: Hydroxyantipyrine
TBAH: Tetrabutylammonium hydroxide
TMEA: Tris(methoxyethoxyethyl)amine
PEA: N-Phenyldiethanolamine
Surfactants:
W-1: Megafac F176 (fluorine surfactant, manufactured by Dainippon Ink and Chemicals Inc.)
W-2: Megafac R08 (fluorine and silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)

A3: Cyclohexanone
A4: γ-Butyrolactone
B1: Propylene glycol methyl ether
B2: Ethyl lactate Evaluation of Resist:

Antireflection film DUV-42 (manufactured by Brewer Science) was uniformly coated in a thickness of 600 Å by a spin coater on a silicone substrate treated with hexamethyl-disilazane, dried on a hot plate at 100° C. for 90 seconds, and then dried with heating at 190° C. for 240 seconds. After that, each positive resist solution was coated thereon by a spin coater and dried at 120° C. for 90 seconds to form a resist film having a thickness of 0.30 μm.

The resist film was subjected to exposure through a mask with an ArF excimer laser stepper (manufactured by ISI Co., NA=0.6), and the exposed resist film was heated on a hot plate at 120° C. for 90 seconds immediately after exposure. Further, the resist film was developed with a 2.38 mass % tetramethyl-ammonium hydroxide aqueous solution at 23° C. for 60 seconds, rinsed with pure water for 30 seconds, and then dried, whereby a line pattern was obtained.

Evaluating Method of Pattern Collapse:

With the exposure amount to reproduce a mask pattern of line and space of 1/1 of 130 nm being optimal exposure amount, and when a dense pattern of line and space of 1/1 and a lone pattern of line and space of 1/10 were subjected to exposure with the optimal exposure amount, the line width resolved without causing pattern collapse in a finer mask size was taken as the line width of critical pattern collapse. The smaller the value, the finer pattern is resolved without collapsing, that is, pattern collapse occurs with difficulty.

From the results shown in Table 2, it can be seen that the photosensitive compositions in the invention are narrow in the line width of critical pattern collapse in ArF exposure.

Examples Si 1 to Si 5 and Comparative Example si 1

(1) Formation of Lower Resist Layer

FHi-028DD resist (resist for i-ray exposure, manufactured by Fuji Photo Film Olin Co., Ltd.) was coated on 6 inch silicone wafer with Spin Coater Mark 8 (manufactured by Tokyo Electron Limited) and baked at 90° C. for 90 seconds, whereby a uniform film having a thickness of 0.55 μm was obtained.

The obtained film was further heated at 200° C. for 3 minutes to form a lower resist layer having a thickness of 0.40 μm.

(2) Formation of Upper Resist Layer

The components shown in Table 3 below were dissolved in a solvent to prepare a solution having solids concentration of 11 mass %. The solution was precisely filtered through a membrane filter having a pore diameter of 0.1 μm to thereby prepare an upper layer resist composition.

The upper layer resist composition was coated on the lower resist layer in the same manner as the lower layer coating, heated at 130° C. for 90 seconds, whereby an upper resist layer having a thickness of 0.20 μm was formed.

Resins (SI-1) to (SI-5) in Table 3 are shown below.

| | Molecular Weight |
|---|---|
| (SI-1) | 15000 |

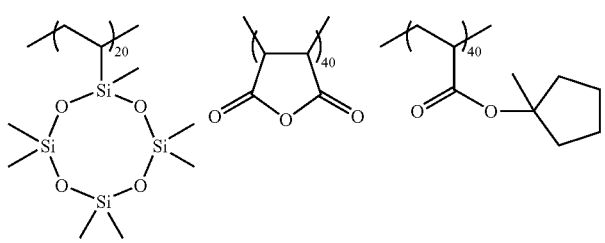

| (SI-2) | 14500 |
|---|---|

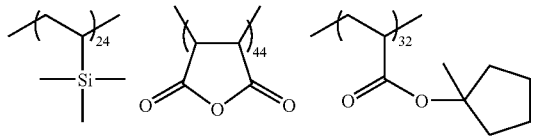

| (SI-3) | 9600 |
|---|---|

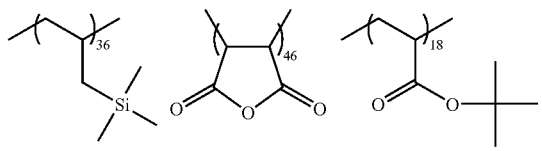

| (SI-4) | 8900 |
|---|---|

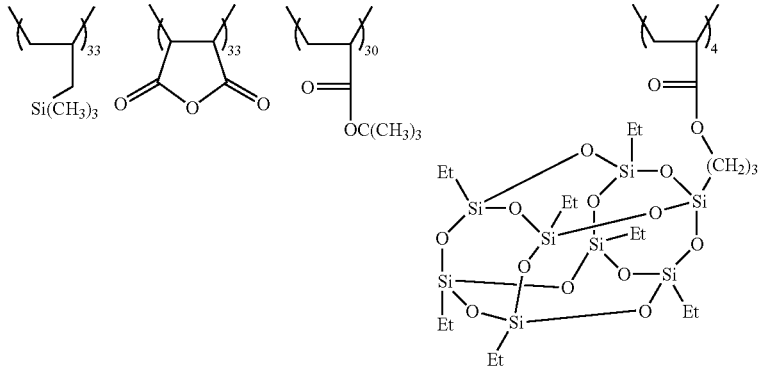

| | Molecular Weight |
|---|---|
| (SI-5) | 10800 |

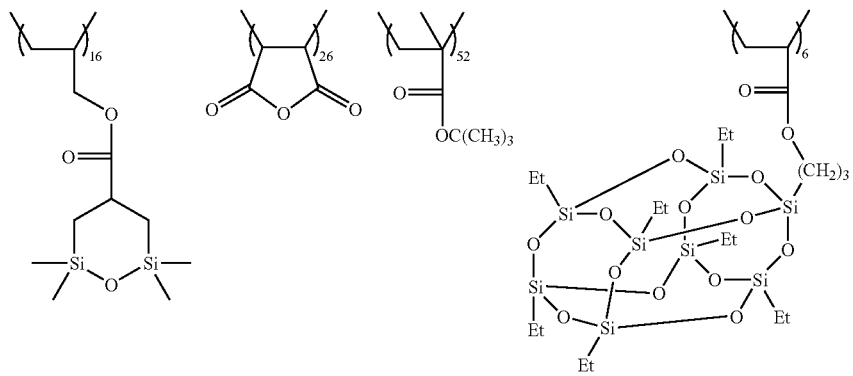

(3) Evaluation of Resist

The thus-obtained wafer was subjected to exposure with ArF Excimer Stepper 9300 (manufactured by ISI Co.) attached with a resolution mask with varying exposure amount.

After heating at 120° C. for 90 seconds, the wafer was developed with a tetrahydroammonium hydroxide developer (2.38 mass %) for 60 seconds, rinsed with distilled water and dried to obtain an upper layer pattern.

Evaluating Method of Pattern Collapse:

With the exposure amount to reproduce a mask pattern of line and space of 1/1 of 100 nm being optimal exposure amount, and when a dense pattern of line and space of 1/1 and a lone pattern of line and space of 1/10 were subjected to exposure with the optimal exposure amount, the line width resolved without causing pattern collapse in a finer mask size was taken as the line width of critical pattern collapse. The smaller the value, the finer pattern is resolved without collapsing, that is, pattern collapse occurs with difficulty. The results obtained are shown in Table 3 below.

Examples F2-1 to F2-10 and Comparative Example f2-1

Preparation of Resist

The components shown in Table 4 below were dissolved in a solvent to prepare a solution having solids concentration of 5 mass %, and the solution was filtered through a polyethylene filter having a pore diameter of 0.1 whereby a resist solution was prepared.

Each resist solution was coated by a spin coater on a silicone wafer treated with hexamethyldisilazane, and dried on a vacuum hot plate at 120° C. for 90 seconds, whereby a resist film having a thickness of 120 nm.

The obtained resist film was subjected to pattern exposure with an $F_2$ excimer laser stepper (157 mm), and the exposed resist film was heated on a hot plate at 120° C. for 90 seconds immediately after exposure. The resist film was developed with a 2.38 mass % tetramethylammonium hydroxide aqueous solution for 60 seconds, rinsed with pure water, whereby a sample wafer was obtained.

Evaluating Method of Pattern Collapse:

With the exposure amount to reproduce a mask pattern of line and space of 1/1 of 80 nm being optimal exposure

TABLE 3

| | Composition | | | | | | | Evaluation Line Width of Critical Pattern collapse (nm) | |
|---|---|---|---|---|---|---|---|---|---|
| | (A) Acid | Acid Generating | | | | | | | |
| Example | Generating Agent (g) | Agent Used in Combination (g) | | (B) Resin (10 g) | Basic Compound (g) | Surfactant (g) | Solvent (by mass) | Dense Pattern | Lone Pattern |
| Si 1 | I-1 (0.6) | — | | SI-1 | DIA (0.03) | W-4 (0.01) | A1 = 100 | 87 | 69 |
| Si 2 | I-2 (0.4) | z14 | (0.2) | SI-2 | TPA (0.03) | W-2 (0.02) | A1/A3 = 40/60 | 89 | 69 |
| Si 3 | I-4 (0.2) | z6 | (0.2) | SI-3 | HAP (0.02) | W-1 (0.01) | A1/B1 = 60/40 | 88 | 68 |
| Si 4 | I-2 (0.6) | z8 | (0.1) | SI-4 | DIA (0.03) | W-4 (0.01) | A1/B1 = 60/40 | 84 | 64 |
| Si 5 | I-1 (0.6) | z12 | (0.05) | SI-5 | PEA (0.01) | W-4 (0.01) | A1/A3 = 60/40 | 83 | 63 |
| Comp. Ex. si 1 | PAG-A (0.6) | — | | SI-1 | DIA (0.03) | W-4 (0.01) | A1 = 100 | 95 | 80 |

From the results shown in Table 3, it can be seen that the photosensitive compositions in the invention are narrow in the line width of critical pattern collapse also when used as two-layer resist.

amount, the exposure amount was gradually increased from the optimal exposure amount, and the line width resolved without causing pattern collapse was taken as the line width of critical pattern collapse when the pattern was made finer.

The smaller the value, the finer pattern is resolved without collapsing, that is, pattern collapse occurs with difficulty. The results obtained are shown in Table 4 below.

The molar ratios and the weight average molecular weights of Resins (R-2) to (R-27) in Table 5 are shown in Table 6 below.

TABLE 4

| Example | (A) Acid Generating Agent (g) | Acid Generating Agent Used in Combination (g) | (B) Resin (10 g) | Basic Compound (g) | Surfactant (g) | Solvent (by mass) | Line Width of Critical Pattern collapse (nm) |
|---|---|---|---|---|---|---|---|
| F2-1 | I-1 (0.5) | — | FII-1 | DIA (0.03) | W-4 (0.01) | A1/B1 = 70/30 | 45 |
| F2-2 | I-1 (0.4) | z31 (0.4) | FII-2 | TPA (0.03) | W-2 (0.02) | A1/A3 = 40/60 | 48 |
| F2-3 | I-2 (0.3) | z6 (0.2) | FII-3 | HAP (0.02) | W-1 (0.01) | A1/B1 = 50/50 | 47 |
| F2-4 | I-6 (0.3) | z5 (0.2) | FII-4 | DIA (0.03) | W-4 (0.01) | A1/B1 = 60/40 | 49 |
| F2-5 | I-1 (0.4) | z12 (0.2) | FII-5 | PEA (0.03) | W-4 (0.01) | A1/B1 = 60/40 | 50 |
| F2-6 | I-2 (0.2) I-24 (0.2) | z34 (0.2) | FII-6 | DIA (0.02) PEA (0.02) | W-4 (0.01) | A1/A3 = 60/40 | 48 |
| F2-7 | I-42 (0.4) | z40 (0.1) | FII-7 | TMEA (0.03) | W-3 (0.03) | A1/B2 = 80/20 | 46 |
| F2-8 | I-40 (0.6) | z31 (0.3) | FII-8 | TBAH (0.04) | W-1 (0.005) | A2/B1 = 80/20 | 47 |
| F2-9 | I-30 (0.5) | z31 (0.3) | FII-9 | HEP (0.03) | W-3 (0.02) | A3/B1 = 70/30 | 48 |
| F2-10 | I-1 (0.4) | z14 (0.1) | FII-10 | TPSA (0.05) | W-3 (0.01) | A1/A3 = 60/40 | 45 |
| Comp. Ex. f2-1 | PAG-A (0.5) | — | FII-1 | DIA (0.03) | W-4 (0.01) | A1/B1 = 70/30 | 63 |

From the results shown in Table 4, it can be seen that the photosensitive compositions in the invention are also narrow in the line width of critical pattern collapse in $F_2$ excimer laser exposure.

Examples KrP-1 to KrP-10 and Comparative Example krp-1

Preparation of Resist

The components shown in Table 5 below were dissolved in a solvent and filtered through a polytetrafluoroethylene filter having a pore diameter of 0.1 μm to prepare a positive resist solution having solids concentration of 14 mass %.

TABLE 6

| Resin | Molar Ratio of Repeating Unit (corresponding from the left side in sequence) | Weight Average Molecular Weight |
|---|---|---|
| R-2 | 60/40 | 12,000 |
| R-7 | 60/30/10 | 18,000 |
| R-8 | 60/20/20 | 12,000 |
| R-9 | 10/50/40 | 13,000 |
| R-14 | 75/25 | 12,000 |
| R-17 | 10/70/20 | 15,000 |
| R-19 | 10/70/20 | 11,000 |
| R-22 | 70/30 | 12,000 |
| R-23 | 10/60/30 | 8,000 |
| R-24 | 50/20/30 | 16,000 |

TABLE 5

| Example | (A) Acid Generating Agent (g) | Acid Generating Agent Used in Combination (g) | (B) Resin (10 g) | Basic Compound (g) | Surfactant (g) | Solvent (by mass) | Dense Pattern | Lone Pattern |
|---|---|---|---|---|---|---|---|---|
| KrP-1 | I-1 (0.5) | — | R-7 | TPI (0.03) | W-4 (0.01) | A1/B1 = 70/30 | 131 | 117 |
| KrP-2 | I-1 (0.4) | z43 (0.4) | R-8 | TPA (0.03) | W-2 (0.02) | A1/A3 = 40/60 | 132 | 116 |
| KrP-3 | I-2 (0.3) | z6 (0.2) | R-9 | HAP (0.02) | W-1 (0.01) | A1/B1 = 50/50 | 134 | 114 |
| KrP-4 | I-6 (0.3) | z8 (0.1) | R-14 | DCMA (0.03) | W-4 (0.01) | A1/B1 = 60/40 | 130 | 116 |
| KrP-5 | I-1 (0.4) | z12 (0.05) | R-17 | PEA (0.01) | W-4 (0.01) | A1/B1 = 60/40 | 132 | 117 |
| KrP-6 | I-2 (0.2) I-24 (0.2) | z36 (0.1) | R-19 (5 g) R-27 (5 g) | DIA (0.02) PEA (0.02) | W-4 (0.01) | A1/A3 = 60/40 | 132 | 115 |
| KrP-7 | I-42 (0.4) | z40 (0.1) | R-23 | TMEA (0.03) | W-3 (0.03) | A1/B2 = 80/20 | 132 | 117 |
| KrP-8 | I-40 (0.6) | z41 (0.3) | R-24 | TBAH (0.04) | W-1 (0.005) | A2/B1 = 80/20 | 130 | 119 |
| KrP-9 | I-30 (0.5) | z42 (0.3) | R-25 (5 g) R-2 (5 g) | HEP (0.03) | W-3 (0.02) | A3/B1 = 70/30 | 127 | 109 |
| KrP-10 | I-1 (0.4) | z14 (0.1) | R-27 (5 g) R-22 (5 g) | TPSA (0.05) | W-3 (0.01) | A1/A3 = 60/40 | 128 | 109 |
| Comp. Ex. krp-1 | PAG-A (0.5) | — | — | TPI (0.03) | W-4 (0.01) | A1/B1 = 70/30 | 142 | 128 |

TABLE 6-continued

| Resin | Molar Ratio of Repeating Unit (corresponding from the left side in sequence) | Weight Average Molecular Weight |
|---|---|---|
| R-25 | 10/70/20 | 13,000 |
| R-27 | 70/10/20 | 12,000 |

Evaluation of Resist:

Each positive resist solution prepared was coated by a spin coater on a silicone substrate treated with hexamethyl-disilazane, dried on a hot plate by heating at 120° C. for 90 seconds, whereby a resist film having a thickness of 0.4 µm.

The resist film was subjected to pattern exposure through a line and space mask with a KrF excimer laser stepper (NA=0.63), and the exposed resist film was heated on a hot plate at 110° C. for 90 seconds immediately after exposure. Further, the resist film was developed with a 2.38 mass % tetramethyl-ammonium hydroxide aqueous solution at 23° C. for 60 seconds, rinsed with pure water for 30 seconds, and then dried, whereby a line pattern was obtained.

Evaluating Method of Pattern Collapse:

With the exposure amount to reproduce a mask pattern of line and space of 1/1 of 150 nm being optimal exposure amount, the exposure amount was gradually increased from the optimal exposure amount, and the line width resolved without causing pattern collapse was taken as the line width of critical pattern collapse when the pattern was made finer. The smaller the value, the finer pattern is resolved without collapsing, that is, pattern collapse occurs with difficulty. The results obtained are shown in Table 5 below.

From the results shown in Table 5, it can be seen that the photosensitive compositions in the invention are also narrow in the line width of critical pattern collapse as positive resist compositions in KrF excimer laser exposure.

Examples KrN-1 to KrN-10 and Comparative Example krn-1

Preparation of Resist

The components shown in Table 7 below were dissolved in a solvent and filtered through a polytetrafluoroethylene filter having a pore diameter of 0.1 µm to prepare a negative resist solution having solids concentration of 14 mass %.

Each prepared negative resist solution was evaluated in the same manner as in Examples KrP-1 to KrP-10. The results obtained are shown in Table 7 below.

TABLE 7

| Ex. | Composition | | | | | | | Evaluation Line Width of Critical Pattern collapse (nm) | |
|---|---|---|---|---|---|---|---|---|---|
| | (A) Acid Generating Agent (g) | Acid Generating Agent Used in Combination (g) | (B) Resin (10 g) | Crosslinking Agent (g) | Basic Compound (g) | Surfactant (g) | Solvent (by mass) | Dense Pattern | Lone Pattern |
| KrN-1 | I-1 (0.5) | — | P-1 | CL-1 (2) | TPI (0.03) | W-4 (0.01) | A1/B1 = 70/30 | 132 | 115 |
| KrN-2 | I-1 (0.4) | z43 (0.4) | P-2 | CL-2 (3) | TPA (0.03) | W-2 (0.02) | A1/A3 = 40/60 | 130 | 117 |
| KrN-3 | I-2 (0.3) | z6 (0.2) | P-3 | CL-3 (2.5) | HAP (0.02) | W-1 (0.01) | A1/B1 = 50/50 | 131 | 115 |
| KrN-4 | I-6 (0.3) | z8 (0.1) | P-4 | CL-4 (3) | DCMA (0.03) | W-4 (0.01) | A1/B1 = 60/40 | 129 | 117 |
| KrN-5 | I-1 (0.4) | z12 (0.05) | P-5 | CL-5 (1.5) | PEA (0.01) | W-4 (0.01) | A1/B1 = 60/40 | 130 | 116 |
| KrN-6 | I-2 (0.2) I-24 (0.2) | z36 (0.1) | P-2 (5 g) P-6 (5 g) | CL-1 (2) CL-5 (2) | DIA (0.02) PEA (0.02) | W-4 (0.01) | A1/A3 = 60/40 | 130 | 117 |
| KrN-7 | I-42 (0.4) | z40 (0.1) | P-1 | CL-6 (3) | TMEA (0.03) | W-3 (0.03) | A1/B2 = 80/20 | 131 | 117 |
| KrN-8 | I-40 (0.6) | z41 (0.3) | P-6 | CL-1 (3) | TBAH (0.04) | W-1 (0.005) | A2/B1 = 80/20 | 132 | 117 |
| KrN-9 | I-30 (0.5) | z42 (0.3) | P-3 | CL-2 (3) | HEP (0.03) | W-3 (0.02) | A3/B1 = 70/30 | 126 | 110 |
| KrN-10 | I-1 (0.4) | z14 (0.1) | P-4 | CL-4 (2.5) | TPSA (0.05) | W-3 (0.01) | A1/A3 = 60/40 | 127 | 111 |
| Comp. Ex. krn-1 | PAG-A (0.5) | — | P-1 | CL-1 (2) | TPI (0.03) | W-4 (0.01) | A1/B1 = 70/30 | 140 | 129 |

The structures, molecular weights, molecular weight distributions and crosslinking agents of alkali-soluble resins shown in Table 7 are shown below.

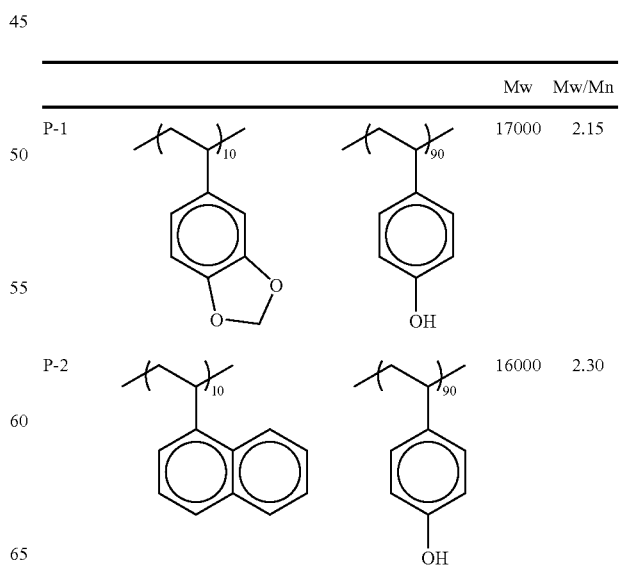

-continued
|  | Mw | Mw/Mn |
|---|---|---|
| P-3 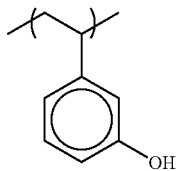 | 19000 | 2.2 |
| P-4 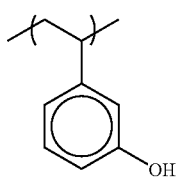 | 12000 | 1.2 |
| P-5 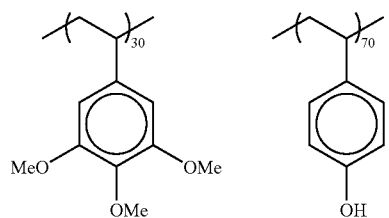 | 21000 | 2.1 |
| P-6 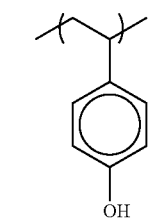  VP-5000, manufactured by Nippon Soda Co., Ltd. | 6000 | 1.2 |
CL-1
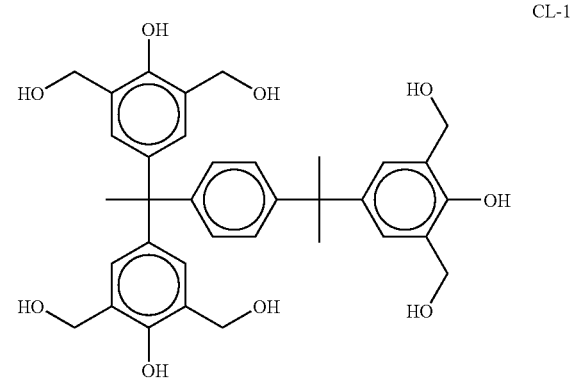
-continued
CL-2
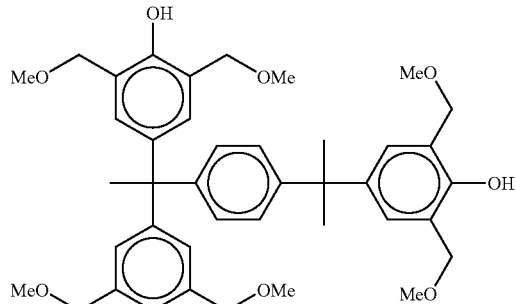
CL-3
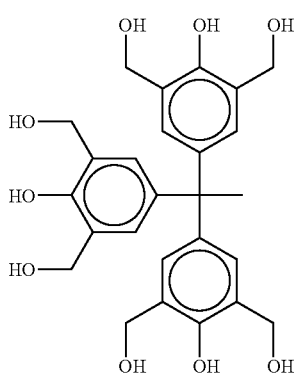
CL-4
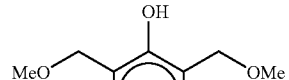
CL-5
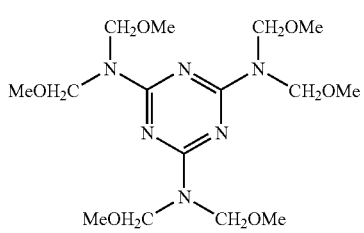
CL-6
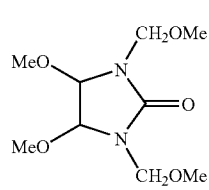

From the results shown in Table 7, it can be seen that the photosensitive compositions in the invention are also narrow in the line width of critical pattern collapse as negative resist compositions in KrF excimer laser exposure.

Examples EBP-1 to EBP-10 and Comparative Example ebp-1

Preparation of Resist

The components shown in Table 5 above were dissolved in a solvent and filtered through a polytetrafluoroethylene filter having a pore diameter of 0.1 μm to prepare a positive resist solution having solids concentration of 12 mass %.

Evaluation of Resist:

Each positive resist solution prepared was coated by a spin coater on a silicone substrate treated with hexamethyl-disilazane, dried on a hot plate by heating at 120° C. for 60 seconds, whereby a resist film having a thickness of 0.3 μm.

The resist film was irradiated with an electron beam projection lithography apparatus (accelerating voltage: 100 KeV, manufactured by Nikon Corporation), and the exposed resist film was heated on a hot plate at 110° C. for 90 seconds immediately after irradiation. Further, the resist film was developed with a 2.38 mass % tetramethylammonium hydroxide aqueous solution at 23° C. for 60 seconds, rinsed with pure water for 30 seconds, and then dried, whereby a line and space pattern was obtained.

Evaluating Method of Pattern Collapse:

With the exposure amount to reproduce a mask pattern of line and space of 1/1 of 100 nm being optimal exposure amount, the exposure amount was gradually increased from the optimal exposure amount, and the line width resolved without causing pattern collapse was taken as the line width of critical pattern collapse when the pattern was made finer. The smaller the value, the finer pattern is resolved without collapsing, that is, pattern collapse occurs with difficulty. The results of evaluation are shown in Table 8 below.

TABLE 8

| Example | Line Width of Critical Pattern Collapse (nm) | |
|---|---|---|
| | Dense Pattern | Lone Pattern |
| EBP-1 | 80 | 58 |
| EBP-2 | 81 | 59 |
| EBP-3 | 82 | 61 |
| EBP-4 | 80 | 59 |
| EBP-5 | 79 | 57 |
| EBP-6 | 81 | 60 |
| EBP-7 | 80 | 57 |
| EBP-8 | 74 | 55 |
| EBP-9 | 72 | 53 |
| EBP-10 | 71 | 51 |
| Comparative Example ebp-1 | 88 | 72 |

From the results shown in Table 8, it can be seen that the photosensitive compositions in the invention are also narrow in the line width of critical pattern collapse as positive resist compositions in electron beam irradiation.

Examples EBN-1 to EBN-10 and Comparative Example ebn-1

Preparation of Resist

The components shown in Table 7 above were dissolved in a solvent and filtered through a polytetrafluoroethylene filter having a pore diameter of 0.1 μm to prepare a negative resist solution having solids concentration of 12 mass %.

Evaluation of Resist:

Each negative resist solution prepared was coated by a spin coater on a silicone substrate treated with hexamethyl-disilazane, dried on a hot plate by heating at 120° C. for 60 seconds, whereby a resist film having a thickness of 0.3 μm.

The resist film was irradiated with an electron beam projection lithography apparatus (accelerating voltage: 100 KeV, manufactured by Nikon Corporation), and the exposed resist film was heated on a hot plate at 110° C. for 90 seconds immediately after irradiation. Further, the resist film was developed with a 2.38 mass % tetramethylammonium hydroxide aqueous solution at 23° C. for 60 seconds, rinsed with pure water for 30 seconds, and then dried, whereby a line and space pattern was obtained.

Evaluating Method of Pattern Collapse:

With the exposure amount to reproduce a mask pattern of line and space of 1/1 of 100 nm being optimal exposure amount, the exposure amount was gradually increased from the optimal exposure amount, and the line width resolved without causing pattern collapse was taken as the line width of critical pattern collapse when the pattern was made finer. The smaller the value, the finer pattern is resolved without collapsing, that is, pattern collapse occurs with difficulty. The results of evaluation are shown in Table 9 below.

TABLE 9

| Example | Line Width of Critical Pattern Collapse (nm) | |
|---|---|---|
| | Dense Pattern | Lone Pattern |
| EBN-1 | 78 | 55 |
| EBN-2 | 80 | 56 |
| EBN-3 | 81 | 59 |
| EBN-4 | 78 | 57 |
| EBN-5 | 80 | 59 |
| EBN-6 | 79 | 58 |
| EBN-7 | 79 | 59 |
| EBN-8 | 76 | 55 |
| EBN-9 | 77 | 54 |
| EBN-10 | 75 | 55 |
| Comparative Example ebn-1 | 90 | 69 |

From the results shown in Table 9, it can be seen that the photosensitive compositions in the invention are also narrow in the line width of critical pattern collapse as negative resist compositions in electron beam irradiation.

The present invention can provide a photosensitive composition hardly accompanied by the occurrence of pattern collapse, and a pattern-forming method using the photosensitive composition.

The entire disclosure of each and every foreign patent application from which the benefit of foreign priority has been claimed in the present application is incorporated herein by reference, as if fully set forth.

What is claimed is:

1. A photosensitive composition comprising:
(A) a sulfonium salt or an iodonium salt having an anion represented by the following formula (I);
(D) a resin soluble in an alkali developer; and
(E) an acid crosslinking agent that crosslinks with the resin soluble in an alkali developer by an action of an acid, wherein the resin soluble in an alkali developer is at least one of a novolak resin, o-polyhydroxystyrene, m-polyhydroxystyrene, p-polyhydroxystyrene, a copolymer of at least two of o-hydroxystyrene, m-hydroxystyrene and p-hydroxystyrene, alkyl-substituted polyhydroxystyrene, a partially O-alkylated or O-acylated product of polyhydroxystyrene, a styrene-hydroxystyrene copolymer and α-methylstyrene-hydroxystyrene copolymer:

(I)

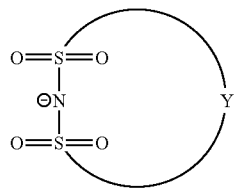

wherein Y represents an alkylene group substituted with at least one fluorine atom.

2. The photosensitive composition according to claim 1, wherein the acid crosslinking agent that crosslinks with the resin soluble in an alkali developer by an action of an acid is at least one of the following (1) to (3):

(1) a hydroxymethyl body, alkoxymethyl body or acyloxymethyl body of phenol derivative;
(2) a compound having an N-hydroxymethyl group, an N-alkoxymethyl group or an N-acyloxymethyl group; and
(3) a compound having an epoxy group.

3. A pattern-forming method comprising the processes of forming a photosensitive film with the photosensitive composition as claimed in claim 2, exposing and developing the photosensitive film.

4. A pattern-forming method comprising the processes of forming a photosensitive film with the photosensitive composition as claimed in claim 1, exposing and developing the photosensitive film.

5. A photosensitive composition comprising:

(A) at least one of the following compounds (I-a1), (I-a2) and (I-a3); and
(B) a resin capable of decomposing by an action of an acid to increase a solubility in an alkali developer, wherein the compound (I-a1) is a compound in which, in the following formula (I-a), all of $R_{201}$, $R_{202}$ and $R_{203}$ represent a phenyl group and at least one of the phenyl groups represented by $R_{201}$, $R_{202}$ and $R_{203}$ is substituted with at least one of an alkyl group and a cycloalkyl group, the compound (I-a2) is a compound in which, in the following formula (I-a), $R_{201}$, $R_{202}$ and $R_{203}$ each independently represent an organic group not having an aromatic ring, and the compound (I-a3) is a compound represented by the following formula (I-a3):

(I-a)

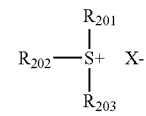

(I-a3)

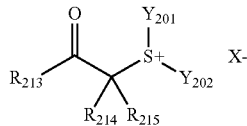

wherein, in the formula (I-a3), $R_{213}$ represents an aryl group,
$R_{214}$ and $R_{215}$ each represent a hydrogen atom, an alkyl group or a cycloalkyl group,
$Y_{201}$ and $Y_{202}$ each independently represent an alkyl group, a cycloalkyl group, an aryl group or a vinyl group,
$R_{213}$ and $R_{214}$, $R_{214}$ and $R_{215}$, and $Y_{201}$ and $Y_{202}$ may be bonded to each other to form a cyclic structure and these cyclic structures may contain an oxygen atom, a sulfur atom, an ester bond or an amido bond, and
$X^-$ in each of the compounds represents an anion represented by the following formula (I):

(I)

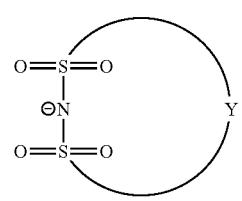

wherein Y represents an alkylene group substituted with at least one fluorine atom.

6. The photosensitive composition according to claim 5, wherein the compound (A) is the compound (I-a1), and
at least one of $R_{201}$, $R_{202}$ and $R_{203}$ in the formula (I-a) represents a phenyl group substituted with at least one of a methyl group, a t-butyl group and a cyclohexyl group.

7. A pattern-forming method comprising the processes of forming a photosensitive film with the photosensitive composition as claimed in claim 6, exposing and developing the photosensitive film.

8. A pattern-forming method comprising the processes of forming a photosensitive film with the photosensitive composition as claimed in claim 5, exposing and developing the photosensitive film.

* * * * *